(12) United States Patent
Montgelas et al.

(10) Patent No.: US 9,632,271 B2
(45) Date of Patent: Apr. 25, 2017

(54) MODULARLY MOUNTABLE CABLE MANAGEMENT SYSTEMS AND ASSOCIATED METHODS

(71) Applicant: Ortronics, Inc., New London, CT (US)

(72) Inventors: Rudolph A. Montgelas, West Hartford, CT (US); Ryan J. Grandidge, Westerly, RI (US); Michael J. Wood, Hamden, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 14/683,723

(22) Filed: Apr. 10, 2015

(65) Prior Publication Data
US 2015/0362691 A1 Dec. 17, 2015

Related U.S. Application Data

(60) Provisional application No. 62/013,079, filed on Jun. 17, 2014.

(51) Int. Cl.
| | | |
|---|---|---|
| *G02B 6/00* | (2006.01) | |
| *G02B 6/44* | (2006.01) | |
| *G02B 6/38* | (2006.01) | |
| *H04Q 1/06* | (2006.01) | |

(52) U.S. Cl.
CPC ......... *G02B 6/4452* (2013.01); *G02B 6/4455* (2013.01); *G02B 6/3897* (2013.01); *G02B 6/4457* (2013.01); *H04Q 1/06* (2013.01)

(58) Field of Classification Search
CPC .................................................. G02B 6/4452
See application file for complete search history.

(56) References Cited

U.S. PATENT DOCUMENTS

| | | | | |
|---|---|---|---|---|
| 4,995,688 A | * | 2/1991 | Anton ................ | G02B 6/3825 385/53 |
| 5,129,030 A | * | 7/1992 | Petrunia .............. | G02B 6/4454 385/135 |
| 5,530,954 A | * | 6/1996 | Larson ................ | G02B 6/4452 385/135 |
| 5,791,917 A | * | 8/1998 | Eberhardt ........... | G02B 6/4452 439/377 |
| 5,945,633 A | * | 8/1999 | Ott ...................... | G02B 6/4452 174/59 |

(Continued)

FOREIGN PATENT DOCUMENTS

WO   WO2010135501 A1  *  11/2010  .......... G02B 6/4452

OTHER PUBLICATIONS

U.S. Appl. No. 62/013,079, filed Jun. 17, 2014.
(Continued)

*Primary Examiner* — Rhonda Peace
(74) *Attorney, Agent, or Firm* — McCarter & English, LLP

(57) ABSTRACT

Exemplary embodiments are directed to modular cable management systems for a rack, the rack including frame members. The systems can include a first support plate and a second support plate. The first and second support plates can be mountable in a horizontal orientation relative to the frame members of the rack. The systems can include a media patching assembly mountable in a vertical orientation relative to the rack. Embodiments are also directed to methods of mounting cable management systems to a support structure or a rack.

10 Claims, 60 Drawing Sheets

(56) References Cited

U.S. PATENT DOCUMENTS

| | | | | |
|---|---|---|---|---|
| 6,160,946 A * | 12/2000 | Thompson | G02B 6/4452 | 385/134 |
| 6,236,795 B1 * | 5/2001 | Rodgers | G02B 6/4452 | 385/134 |
| 6,345,986 B1 * | 2/2002 | Follingstad | H01R 13/518 | 361/752 |
| 6,362,422 B1 * | 3/2002 | Vavrik | G02B 6/4452 | 174/496 |
| 6,545,611 B2 * | 4/2003 | Hayashi | H05K 7/1425 | 340/686.2 |
| 6,719,149 B2 * | 4/2004 | Tomino | G02B 6/4453 | 211/26 |
| 6,824,312 B2 * | 11/2004 | McClellan | H05K 7/1448 | 385/53 |
| 6,866,541 B2 * | 3/2005 | Barker | G02B 6/4452 | 439/540.1 |
| 6,918,786 B2 * | 7/2005 | Barker | G02B 6/4452 | 439/540.1 |
| 6,968,647 B2 | 11/2005 | Levesque et al. | | |
| 7,054,163 B2 * | 5/2006 | Coffey | H04Q 1/14 | 361/730 |
| 7,094,095 B1 * | 8/2006 | Caveney | G02B 6/3897 | 385/134 |
| 7,207,835 B2 * | 4/2007 | Levesque | H04Q 1/066 | 439/540.1 |
| 7,225,586 B2 | 6/2007 | Levesque et al. | | |
| 7,300,308 B2 * | 11/2007 | Laursen | G02B 6/3897 | 439/540.1 |
| 7,439,453 B2 * | 10/2008 | Murano | G02B 6/4455 | 174/50 |
| 7,509,015 B2 * | 3/2009 | Murano | G02B 6/4453 | 135/134 |
| 7,637,773 B2 * | 12/2009 | Shifris | H01R 9/2416 | 439/540.1 |
| 7,697,811 B2 | 4/2010 | Murano et al. | | |
| 7,729,586 B2 * | 6/2010 | Keith | G02B 6/4452 | 385/135 |
| 7,983,038 B2 | 7/2011 | Levesque et al. | | |
| 8,106,311 B2 | 1/2012 | Larsen et al. | | |
| 8,130,494 B2 | 3/2012 | Larsen et al. | | |
| 8,184,938 B2 | 5/2012 | Cooke et al. | | |
| 8,369,321 B2 * | 2/2013 | Aybay | H04L 49/00 | 370/254 |
| 8,398,039 B2 | 3/2013 | Murano et al. | | |
| 8,439,702 B2 | 5/2013 | Dietz et al. | | |
| 8,526,181 B2 | 9/2013 | Levesque et al. | | |
| 8,672,709 B2 | 3/2014 | Dietz et al. | | |
| 8,731,364 B2 | 5/2014 | Murano et al. | | |
| 8,758,047 B2 | 6/2014 | Dietz et al. | | |
| 8,861,918 B2 * | 10/2014 | Vazquez | G02B 6/4455 | 385/135 |
| 9,285,558 B2 * | 3/2016 | Gross | G02B 6/4455 | |
| 2002/0181896 A1 * | 12/2002 | McClellan | H05K 7/1448 | 385/88 |
| 2003/0007767 A1 * | 1/2003 | Douglas | G02B 6/4452 | 385/135 |
| 2003/0022552 A1 * | 1/2003 | Barker | G02B 6/4452 | 439/540.1 |
| 2003/0042215 A1 * | 3/2003 | Tomino | G02B 6/4453 | 211/26 |
| 2003/0185535 A1 * | 10/2003 | Tinucci | G02B 6/4455 | 385/134 |
| 2005/0041947 A1 * | 2/2005 | Barker | G02B 6/4452 | 385/135 |
| 2005/0233635 A1 * | 10/2005 | Denovich | G02B 6/4452 | 439/540.1 |
| 2007/0196071 A1 * | 8/2007 | Laursen | G02B 6/3897 | 385/135 |
| 2008/0175551 A1 * | 7/2008 | Smrha | G02B 6/4452 | 385/135 |
| 2009/0067800 A1 * | 3/2009 | Vazquez | G02B 6/4455 | 385/135 |
| 2009/0129014 A1 | 5/2009 | Larsen et al. | | |
| 2009/0163043 A1 * | 6/2009 | Demers | G02B 6/4452 | 439/43 |
| 2009/0305554 A1 * | 12/2009 | Siano | G02B 6/4452 | 439/540.1 |
| 2010/0054682 A1 * | 3/2010 | Cooke | G02B 6/4455 | 385/135 |
| 2010/0202744 A1 * | 8/2010 | Douglas | G02B 6/4452 | 385/135 |
| 2011/0249950 A1 * | 10/2011 | Chapa Ramirez | G02B 6/4452 | 385/135 |
| 2012/0288249 A1 * | 11/2012 | Ruiz | H04Q 1/02 | 385/135 |
| 2013/0251326 A1 * | 9/2013 | Cooke | G02B 6/4455 | 385/135 |
| 2014/0206273 A1 | 7/2014 | Larsen et al. | | |
| 2015/0098683 A1 * | 4/2015 | Gross | G02B 6/4455 | 385/135 |
| 2015/0362092 A1 * | 12/2015 | Grandidge | G02B 6/4457 | 248/49 |
| 2015/0362689 A1 * | 12/2015 | Grandidge | H04Q 1/06 | 385/135 |
| 2015/0366092 A1 * | 12/2015 | Grandidge | G02B 6/4452 | 312/223.6 |

OTHER PUBLICATIONS

U.S. Appl. No. 14/683,433, filed Apr. 10, 2015.
U.S. Appl. No. 14/683,503, filed Apr. 10, 2015.
U.S. Appl. No. 14/683,569, filed Apr. 10, 2015.
U.S. Appl. No. 14/683,723, filed Apr. 10, 2015.
U.S. Appl. No. 14/683,786, filed Apr. 10, 2015.
U.S. Appl. No. 14/304,079, filed Jun. 13, 2014.

* cited by examiner

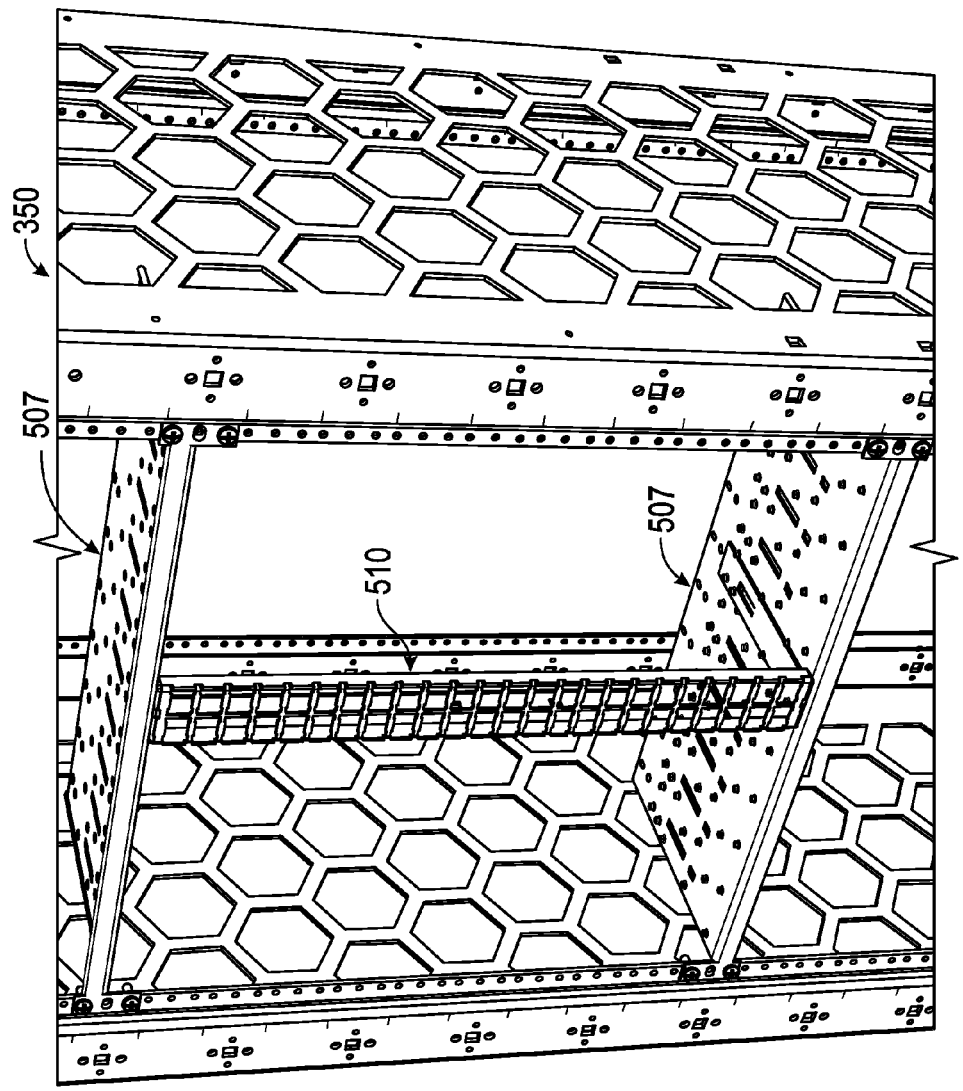

MODULARLY MOUNTABLE CABLE MANAGEMENT SYSTEMS AND ASSOCIATED METHODS

CROSS-REFERENCE TO RELATED APPLICATIONS

The present application claims the benefit of a provisional patent application entitled "Hybrid Patch Panel Assembly For Multiple Media Connections," which was filed on Jun. 17, 2014, and assigned Ser. No. 62/013,079. The entire content of the foregoing provisional application is incorporated herein by reference.

TECHNICAL FIELD

The present disclosure relates to patch panel assemblies/patching systems configured to support multiple media connections and, more particularly, to modularly mountable cable management systems which support high density, multiple mixed media connections.

BACKGROUND

In general, devices for interfacing with high frequency data transfer media are known. See, e.g., U.S. Pat. Nos. 8,439,702 and 8,672,709, the entire contents of each being hereby incorporated by reference in their entireties.

For example, connectors or jack assemblies having a plurality of contacts (e.g., modular communication jacks) have been developed that facilitate communication with contacts in connecting assemblies (e.g., plug connectors) that, in turn, interact with various media (e.g., copper-based media such as unshielded twisted pair (UTP) media, fiber optic cables, etc.). The jack assembly contacts are typically positioned for communication with data signal transmission media plug elements/contacts introduced to a receiving space of the jack assembly.

In general, many data transfer media include multiple pairs of lines bundled together. Communications systems typically incorporate such media (e.g., UTP media, fiber optic cables, etc.) and connectors (e.g., jack/plug combinations) for data transfer. For example, a plurality of jack assemblies/housings may be positioned adjacent one another in a multi-gang jack panel or the like, with each jack assembly/housing releasably secured and/or attached to the jack panel or the like.

In general, commercial buildings require an effective and efficient telecommunications infrastructure to support the wide variety of services that rely on the transport of information. Typically, wiring systems within buildings are terminated at a location where they may be interconnected with one another and/or to other cabling systems or telecommunications equipment. Cables are often terminated on wire panels or patch panels or the like, which can be mounted to racks or to some other location/structure.

Patch panels are known in the field of data communication systems. See, e.g., U.S. Pat. No. 8,106,311, the entire contents of which is hereby incorporated by reference in its entirety. Some other exemplary assemblies/systems in this general field are described and disclosed in U.S. Pat. Nos. 7,697,811; 7,983,038; 8,184,938; 8,398,039; and U.S. Patent Pub. Nos. 2012/0064760 and 2013/0129296, the entire contents of each being hereby incorporated by reference in their entireties.

A patch panel generally provides a plurality of network ports incorporated into a structural element that connect incoming and outgoing lines of a communication/electrical system (e.g., a local area network (LAN) or the like). Typical patch panels are mounted hardware units that include a plurality of port locations and utilize cables for interconnections. A patch panel can use patch cords to create the interconnections. Patch panel systems are generally intended to facilitate organization and management in implementing telecommunications wiring systems (e.g., for high speed data networks).

In general, many rows of cabinets or racks typically fill a data center or telecommunications room. Patch panels affixed to a rack and/or a wall of a telecommunications room provide convenient access to telecommunication devices (e.g., servers) within the rack or room. As the demand for the use of telecommunication devices rapidly grows, space for such devices becomes limited and/or expensive. A constant need exists among manufacturers to develop patch panel assemblies/patching systems or the like that include improved features and structures.

For example, patch panels generally define an enclosure for a plurality of cables, including a front portion with a plurality of network ports and a rear portion from which a plurality of cables extend for connecting to parts of a communication network. The patch panels are generally mountable horizontally relative to a rack. Although the patch panel can be mounted along the height of the rack in a horizontal orientation, instances can occur where a different orientation of the patch panel and associated cables would be preferable for cable management.

Thus, a need exists for patch panels which can be modularly mounted in multiple configurations. These and other needs are addressed by the modularly mountable cable management systems and associated methods of the present disclosure.

SUMMARY

The present disclosure provides advantageous patch panel assemblies/patching systems, and improved methods for using the same. In accordance with embodiments of the present disclosure, exemplary modular cable management systems for a support structure are provided. The systems include first and second frame members. The systems include a cable management plate secured to and extending between the first and second frame members. The cable management system can be adapted for mounting with the first and second frame members to the support structure in a horizontal orientation and a vertical orientation.

The support structure can be at least one of a rack with frame members or a wall. An area between the first and second frame members and the cable management plate can define an enclosure for media patching components. The first and second frame members can define a substantially Z-shaped configuration. Each of the first and second frame members can include a first horizontal run, a second horizontal run, and a first vertical run. In particular, the first and second horizontal runs can define first and second sections that are offset, but parallel relative to each other, and the first vertical run can define a third section that is perpendicular to the first and second sections and joins the first and second sections.

The first vertical run of the first and second frame members can be configured and dimensioned to be secured to frame members of the support structure, e.g., a rack, for mounting the cable management system to the support structure in the horizontal orientation. In some embodiments, the systems include first and second support plates configured to be mounted in a horizontal orientation to frame members of the support structure, e.g., a rack. The first vertical run of the first and second frame members can be configured and dimensioned to be secured to respective first and second support plates for mounting the cable management system to the support structure, e.g., a rack, in the vertical orientation. In some embodiments, a mounting bracket can be secured to the first vertical run of each of the first and second frame members. The mounting bracket can be configured and dimensioned to be secured to a support structure, e.g., a wall, for mounting the cable management system to the wall in the vertical orientation.

In accordance with embodiments of the present disclosure, exemplary methods of modularly mounting a cable management system to a support structure are provided. The methods include providing the cable management systems described herein and mounting the cable management system with the first and second frame members to the support structure in the horizontal orientation or the vertical orientation.

In some embodiments, the support structure can be a rack including frame members. Mounting the cable management system to the support structure can include securing the first and second support plates in a horizontal orientation to the frame members of the rack. The methods further include securing the first and second frame members to the respective first and second support plates for mounting the cable management system to the rack in the vertical orientation.

In some embodiments, the methods include securing a mounting bracket to each of the first and second frame members. The methods include securing the mounting brackets to the support structure for mounting the cable management system to the support structure in the vertical orientation.

In accordance with embodiments of the present disclosure, exemplary cable management systems for a rack are provided. The rack can include vertical frame members. The system includes first and second support plates mountable in a horizontal orientation relative to the frame members of the rack. The system includes a media patching assembly mountable in a vertical orientation relative to the rack. The vertical orientation can be substantially parallel to the frame members of the rack and substantially perpendicular to the first and second support plates.

The cable management systems include a multi-connector panel assembly including first and second flanges. Each of the first and second flanges can include a fastening mechanism formed thereon. In some embodiments, the fastening mechanism can include a cantilevered extension including a protrusion at a distal end. Each of the first and second support plates can include a slot configured and dimensioned to at least partially receive therein the protrusion of the respective cantilevered extension to detachably secure the multi-connector panel assembly to the first and second support plates in a vertical orientation.

The cable management systems include a support frame including two vertical side beams and a plurality of cross-beams. The vertical side beams and the cross-beams can define a substantially grid-like configuration. The cable management systems include two support frame brackets configured to be secured to respective first and second support plates. Each of the two support frame brackets can be configured to receive (e.g., via a snap fit) opposing cross-beams of the support frame to detachably secure the support frame to the first and second support plates in a vertical orientation. In some embodiments, each of the two support frame brackets can include two substantially T-shaped slots formed in a central body section.

The cable management systems include a cable management plate defining a front side and a rear side. In some embodiments, the front side of the cable management plate can include a plurality of slots formed therethrough. The slots can be configured and dimensioned to receive complementary flanges of a spool for detachably securing the spool to the cable management plate. In some embodiments, the rear side of the cable management plate can include a pair of hooks and a pair of fixation extensions. The pair of hooks and the pair of fixation extensions can be configured to receive and secure respective vertical side beams of the support frame to secure the cable management plate to the support frame.

In accordance with embodiments of the present disclosure, exemplary methods of mounting a cable management system to a rack are provided. The methods include providing a cable management system as described herein. The methods include mounting the first and second support plates to the frame members of the rack in a horizontal orientation. The methods include mounting the media patching assembly of the cable management system in a vertical orientation relative to the rack.

The methods include securing a multi-connector panel assembly to the first and second support plates by engaging a fastening mechanism on first and second flanges of the multi-connector panel assembly with respective slots formed in the first and second support plates. The methods include securing a support frame in a vertical orientation to the first and second support plates with mounting brackets. The methods include securing a cable management plate to side vertical beams of the support frame.

In accordance with embodiments of the present disclosure, exemplary cable management systems for a rack are provided. The rack includes frame members. The cable management systems include a first support plate and a second support plate. The first and second support plates can be mountable in a horizontal orientation relative to frame members of the rack. The cable management systems can include a media patching assembly mountable in a vertical orientation relative to the rack.

The media patching assembly can include a multi-connector panel assembly including first and second flanges. Each of the first and second flanges can include a fastening mechanism formed thereon. The fastening mechanism can include a cantilevered extension including a protrusion at a distal end. Each of the first and second support plates can include a slot configured and dimensioned to at least partially receive the protrusion of the respective cantilevered extension to detachably secure the multi-connector panel assembly to the first and second support plates in a vertical orientation.

The cable management system can include a support frame mounted to the first and second support plates. The support plates can include two vertical side beams and a plurality of cross-beams. The cable management system can further include two support frame brackets configured to secure the support frame to respective first and second support plates. Each of the two support frame brackets can be configured to receive via a snap fit opposing cross-beams of the support frame to detachably secure the support frame to the first and second support plates in a vertical orientation. Each of the two support frame brackets can include a central body section with two T-shaped slots formed therein. Each of the two support frame brackets can be secured to one of the first and second support plates via a snap fit connection between protrusions in the first and second support plates and a portion of each T-shaped slot.

In some embodiments, the cable management systems can include a cable management plate defining a front side and a rear side. The front side of the cable management plate can include a plurality of slots formed therethrough configured and dimensioned to receive flanges of a spool therein for detachably securing the spool to the cable management plate. The rear side of the cable management plate can include a pair of hooks and a pair of fixation extensions. The pair of hooks and the pair of fixation extensions can be configured to receive and secure respective vertical side beams of a support frame to secure the cable management plate to the support frame.

In some embodiments, the media patching assembly can include a first frame member and a second frame member (e.g., Z-shaped frame members). The media patching assembly can include a multi-connector panel assembly mounted to the first frame member and the second frame member. The media patching assembly can vertically mount to the rack by mounting the first frame member to the first support plate and by mounting the second frame member to the second support plate. Each of the first and second frame members can include first and second sections that are offset from each other but parallel to each other (e.g., first and second horizontal runs), and a third section that is perpendicular to the first and second sections and joins the first and second sections (e.g., first vertical run). The third section can include an aperture. The first support plate and the second support plate can each include an aperture. The media patching assembly can vertically mount to the rack via a first fastener that passes through the aperture in the first support plate and the aperture in the third section of the first frame member, and a second fastener that passes through the aperture in the second support plate and the aperture in the third section of the second frame member.

In accordance with embodiments of the present disclosure, exemplary methods of mounting a cable management system to a rack are provided. The rack includes frame members. The methods include mounting first and second support plates of the cable management system to the frame members of the rack in a horizontal orientation. The methods include mounting a media patching assembly of the cable management system to the first and second support plates such that the media patching assembly is vertically oriented relative to the rack. The methods can include securing a support frame in a vertical orientation to the first and second support plates with mounting brackets.

In some embodiments, the media patching assembly can include a multi-connector panel assembly and first and second flange extending from the multi-connector panel assembly. The step of mounting the media patching assembly to the first and second support plates can include engaging a fastening mechanism on the first and second flanges of the multi-connector panel assembly with respective slots formed in the first and second support plates.

In some embodiments, the media patching assembly can include two Z-shaped frame members and a multi-connector panel assembly connected to the two Z-shaped frame members. The step of mounting the media patching assembly to the first and second support plates can include mounting each of the Z-shaped frame members to one of the first and second support plates via an aperture in each of the Z-shaped frame members and an aperture in the first and second support plates.

In accordance with embodiments of the present disclosure, exemplary cable management systems for a support structure (e.g., a wall) are provided. The cable management systems can include first and second frame members (e.g., Z-shaped frame members), a media patching assembly, and first and second mounting brackets. The media patching assembly can be secured to and extends between the first and second frame members. The first mounting bracket can be secured to the first frame member. The second mounting bracket can be secured to the second frame member. The cable management system can be mountable to the support structure in a vertical orientation with the first and second mounting brackets.

In exemplary embodiments, the present disclosure provides advantageous patch panel assemblies configured to support multiple media connections, and related methods of use. More particularly, the present disclosure provides improved systems/methods for the design and use of hybrid patch panel assemblies configured to support high density, multiple mixed media connections.

In exemplary embodiments, disclosed herein is a high density patching assembly/system configured to support multiple mixed media connections. In certain embodiments, the improved systems/assemblies of the present disclosure provide users with the ability to install multiple mixed media connections (e.g., both copper-based and fiber optic connections) in the same patching system/enclosure. In some embodiments, high density jack patch panels are utilized in the systems/assemblies of the present disclosure to support multiple media connections (e.g., high density, multiple mixed media connections, such as both copper and fiber optic connections). Exemplary patch panel assemblies disclosed herein advantageously increase the patching density of the systems/assemblies of the present disclosure, and provide improved access to the mixed media connectors and cabling elements.

The present disclosure provides for a media patching system including a multi-connector panel assembly having a multi-connector panel surface, the multi-connector panel surface including a plurality of apertures; a fiber optic connector assembly mounted with respect to a first aperture of the plurality of apertures of the multi-connector panel surface; and a copper-based connector assembly mounted with respect to a second aperture of the plurality of apertures of the multi-connector panel surface.

The present disclosure also provides for a media patching system wherein the multi-connector panel surface is angled. The present disclosure also provides for a media patching system wherein the multi-connector panel surface is substantially flat or planar.

The present disclosure also provides for a media patching system wherein the fiber optic connector assembly is mounted with respect to a first plurality of apertures of the plurality of apertures of the multi-connector panel surface; and wherein a plurality of copper-based connector assemblies are mounted with respect to a second plurality of apertures of the plurality of apertures of the multi-connector panel surface.

The present disclosure also provides for a media patching system wherein the copper-based connector assembly includes a jack housing that is adapted to receive signals from a mating connecting assembly or plug connector. The present disclosure also provides for a media patching system wherein the fiber optic connector assembly includes one or more ports/adapters to facilitate communication with a mating fiber optic connector.

The present disclosure also provides for a media patching system wherein the fiber optic connector assembly is a fiber optic cassette. The present disclosure also provides for a media patching system wherein the fiber optic cassette includes six port housings, with each port housing including two fiber optic ports/adapters. The present disclosure also provides for a media patching system wherein each port housing is configured to be mounted with respect to an aperture of the multi-connector panel surface.

The present disclosure also provides for a media patching system wherein the multi-connector panel assembly is mounted with respect to a first frame member and a second frame member; and wherein the first and second frame members are mounted with respect to a tray member and to a door assembly. The present disclosure also provides for a media patching system wherein a top cover and a bottom cover are mounted with respect to the first and second frame members.

The present disclosure also provides for a media patching system wherein the first aperture of the multi-connector panel surface is associated with two mounting holes of the multi-connector panel surface; wherein the multi-connector panel assembly includes a bezel member having: (i) a plurality of apertures, and (ii) a rear face having two mounting members; wherein the bezel member is configured to be mounted with respect to the first aperture of the multi-connector panel surface with the two mounting members securing to the two mounting holes; and wherein the fiber optic connector assembly is mounted with respect to at least one aperture of the bezel member.

The present disclosure also provides for a media patching system wherein the fiber optic connector assembly is mounted with respect to a plurality of apertures of the bezel member. The present disclosure also provides for a media patching system wherein the fiber optic connector assembly is a fiber optic cassette.

The present disclosure also provides for a media patching system wherein the second aperture of the multi-connector panel surface is associated with two mounting holes of the multi-connector panel surface; wherein the multi-connector panel assembly includes a bezel member having: (i) a plurality of apertures, and (ii) a rear face having two mounting members; wherein the bezel member is configured to be mounted with respect to the second aperture of the multi-connector panel surface with the two mounting members securing to the two mounting holes; and wherein the copper-based connector assembly is mounted with respect to one aperture of the bezel member.

The present disclosure also provides for a media patching system wherein the first aperture of the multi-connector panel surface is associated with two mounting holes of the multi-connector panel surface; wherein the multi-connector panel assembly includes a bezel member having: (i) a slot, and (ii) a rear face having two mounting members; wherein the bezel member is configured to be mounted with respect to the first aperture of the multi-connector panel surface with the two mounting members securing to the two mounting holes; and wherein the fiber optic connector assembly is mounted with respect to the slot of the bezel member.

The present disclosure also provides for a media patching system wherein the fiber optic connector assembly is a fiber optic cassette having a plurality of fiber optic ports for mating with fiber optic connectors.

The present disclosure also provides for a media patching system including a multi-connector panel assembly having a multi-connector panel surface, the multi-connector panel surface including a plurality of apertures; a fiber optic connector assembly mounted with respect to a first aperture of the plurality of apertures of the multi-connector panel surface; and a copper-based connector assembly mounted with respect to a second aperture of the plurality of apertures of the multi-connector panel surface; wherein the copper-based connector assembly includes a jack housing that is adapted to receive signals from a mating connecting assembly or plug connector; wherein the fiber optic connector assembly includes one or more ports/adapters to facilitate communication with a mating fiber optic connector; wherein the multi-connector panel assembly is mounted with respect to a first frame member and a second frame member; and wherein the first and second frame members are mounted with respect to a tray member and to a door assembly.

The present disclosure also provides for a media patching system wherein the fiber optic connector assembly is mounted with respect to a first plurality of apertures of the plurality of apertures of the multi-connector panel surface; wherein a plurality of copper-based connector assemblies are mounted with respect to a second plurality of apertures of the plurality of apertures of the multi-connector panel surface; and wherein a top cover and a bottom cover are mounted with respect to the first and second frame members.

The present disclosure also provides for a method for fabricating a media patching system including providing a multi-connector panel assembly having a multi-connector panel surface, the multi-connector panel surface including a plurality of apertures; mounting a fiber optic connector assembly with respect to a first aperture of the plurality of apertures of the multi-connector panel surface; and mounting a copper-based connector assembly with respect to a second aperture of the plurality of apertures of the multi-connector panel surface.

Any combination or permutation of embodiments is envisioned. Additional advantageous features, functions and applications of the disclosed systems, methods and assemblies of the present disclosure will be apparent from the description which follows, particularly when read in conjunction with the appended drawings. It is to be understood, however, that the drawings are designed as an illustration only and not as a definition of the limits of the invention. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various steps, features and combinations of steps/features described below and illustrated in the figures can be arranged and organized differently to result in embodiments which are still within the scope of the present disclosure. To assist those of ordinary skill in the art in making and using the disclosed modularly mountable cable management systems and associated methods, reference is made to the appended figures, wherein:

FIG. 56 is a front, perspective view of an exemplary support structure with a multi-connector panel assembly mounted in a vertical orientation to support plates;

DESCRIPTION OF EXEMPLARY EMBODIMENTS

Figure 1:
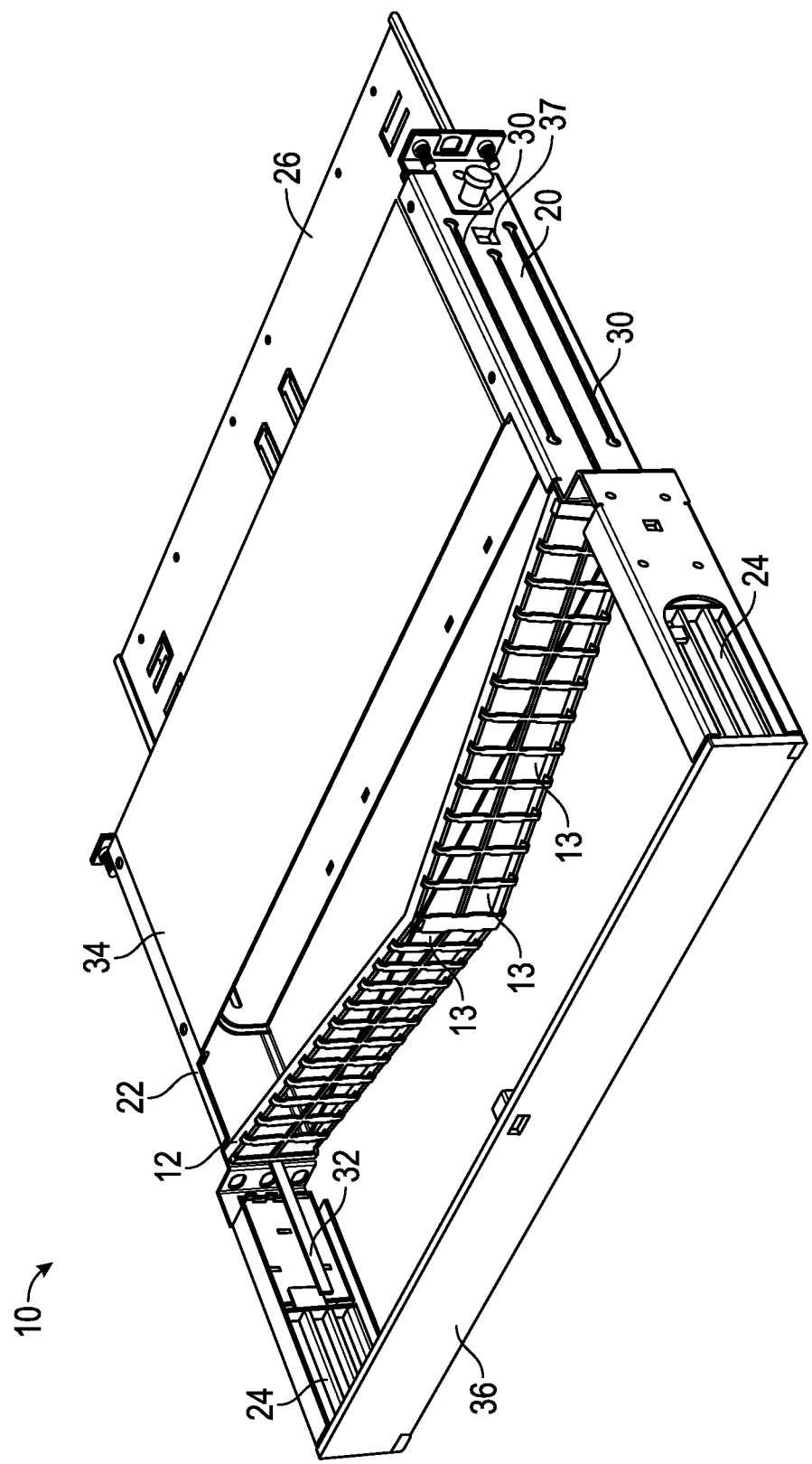
FIG. 1 is a top, perspective view of a media patching system according to an exemplary embodiment of the present disclosure, prior to connector assemblies mounted to the media patching system.
Figure 2:
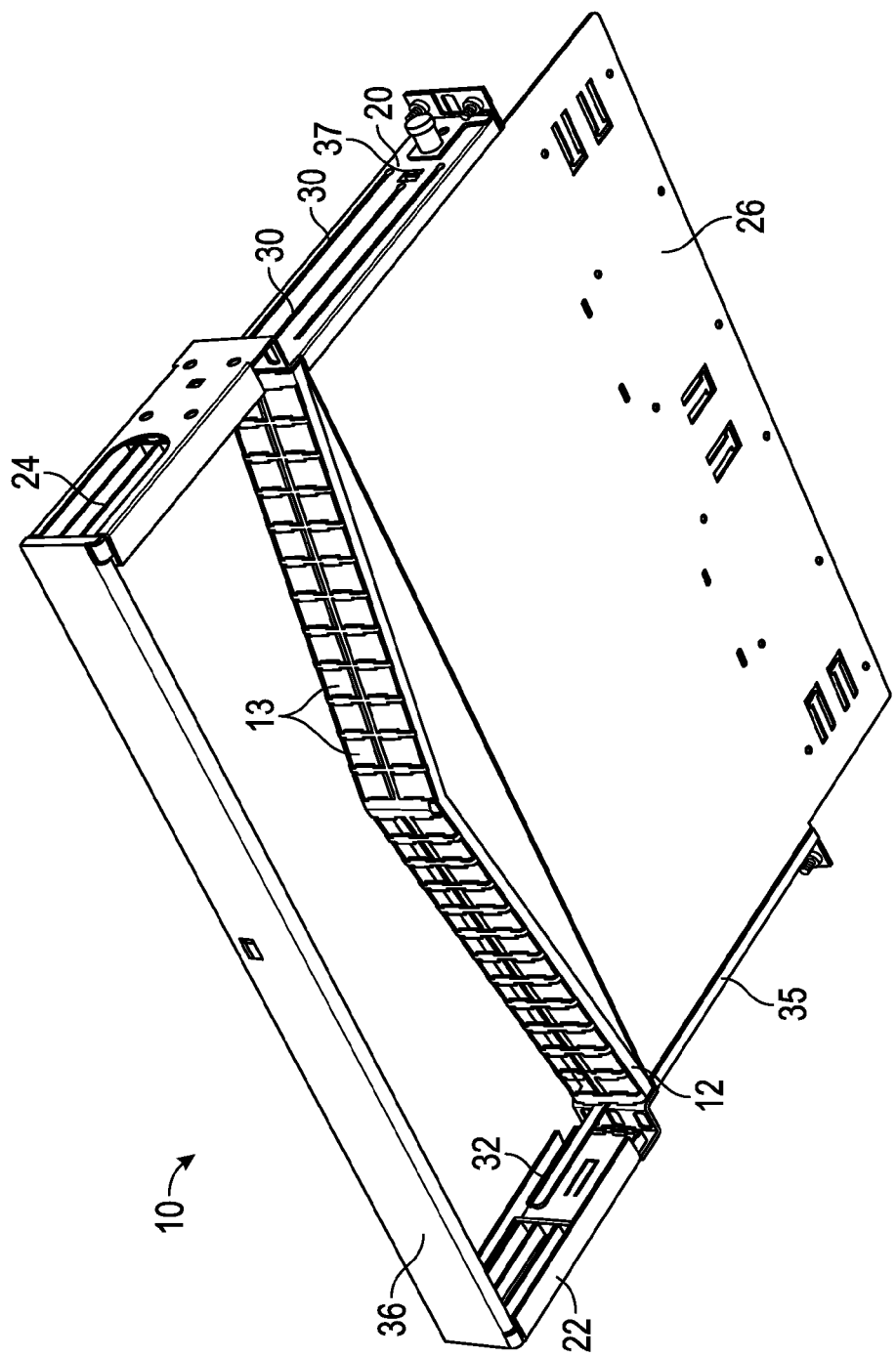
FIG. 2 is a bottom, perspective view of the media patching system of FIG. 1.
Figure 3:
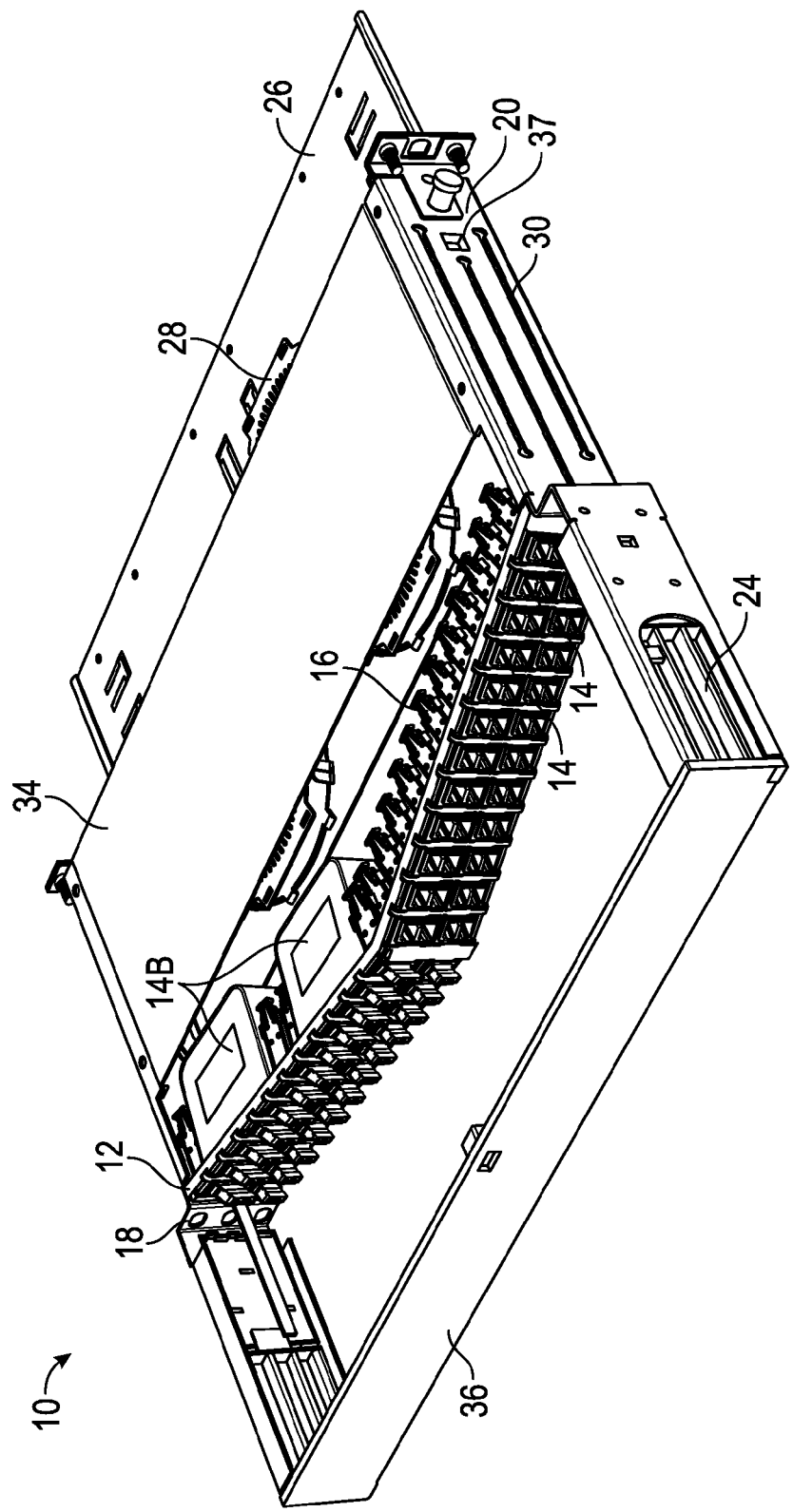
FIG. 3 is a top, perspective view of the media patching system of FIG. 1, after exemplary connector assemblies are mounted to the media patching system.
Figure 4:
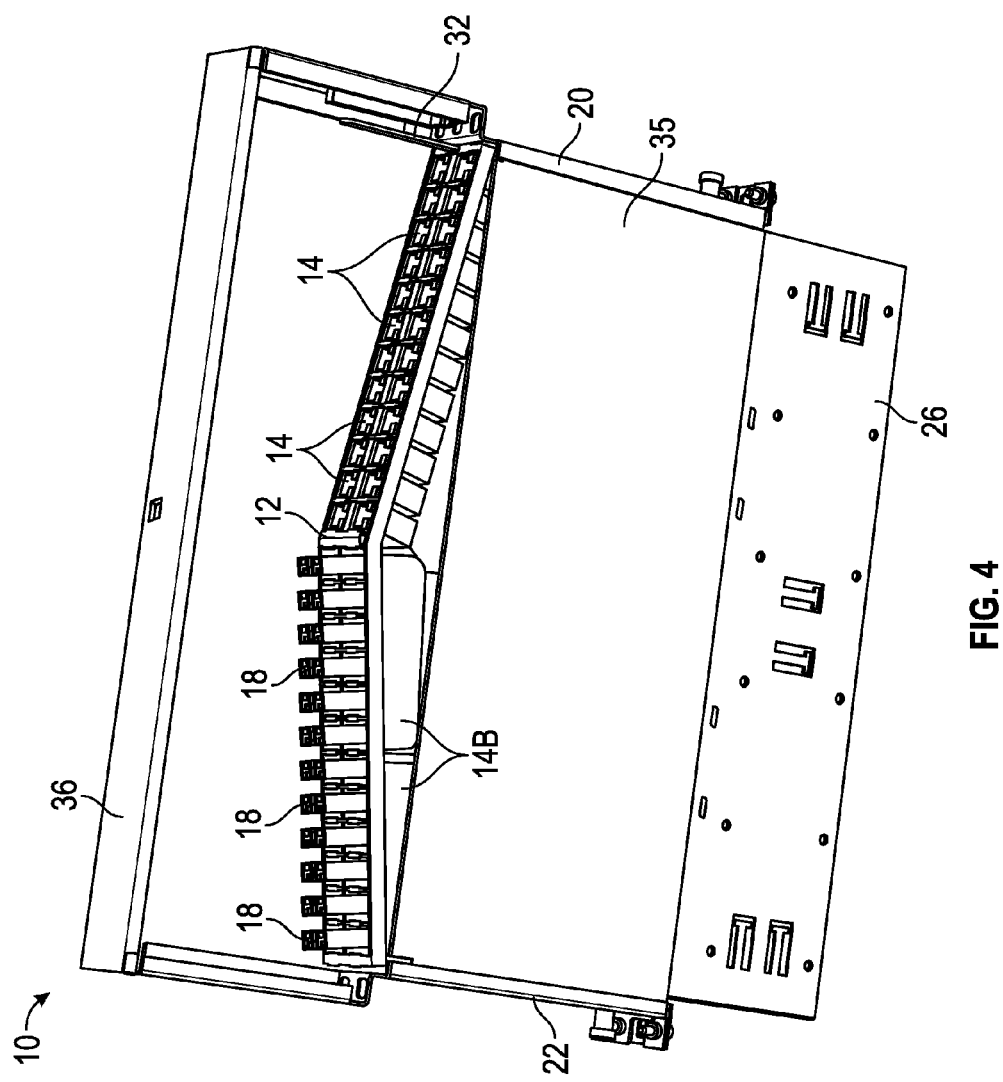
FIG. 4 is a bottom, perspective view of the media patching system of FIG. 3.
Figure 5:
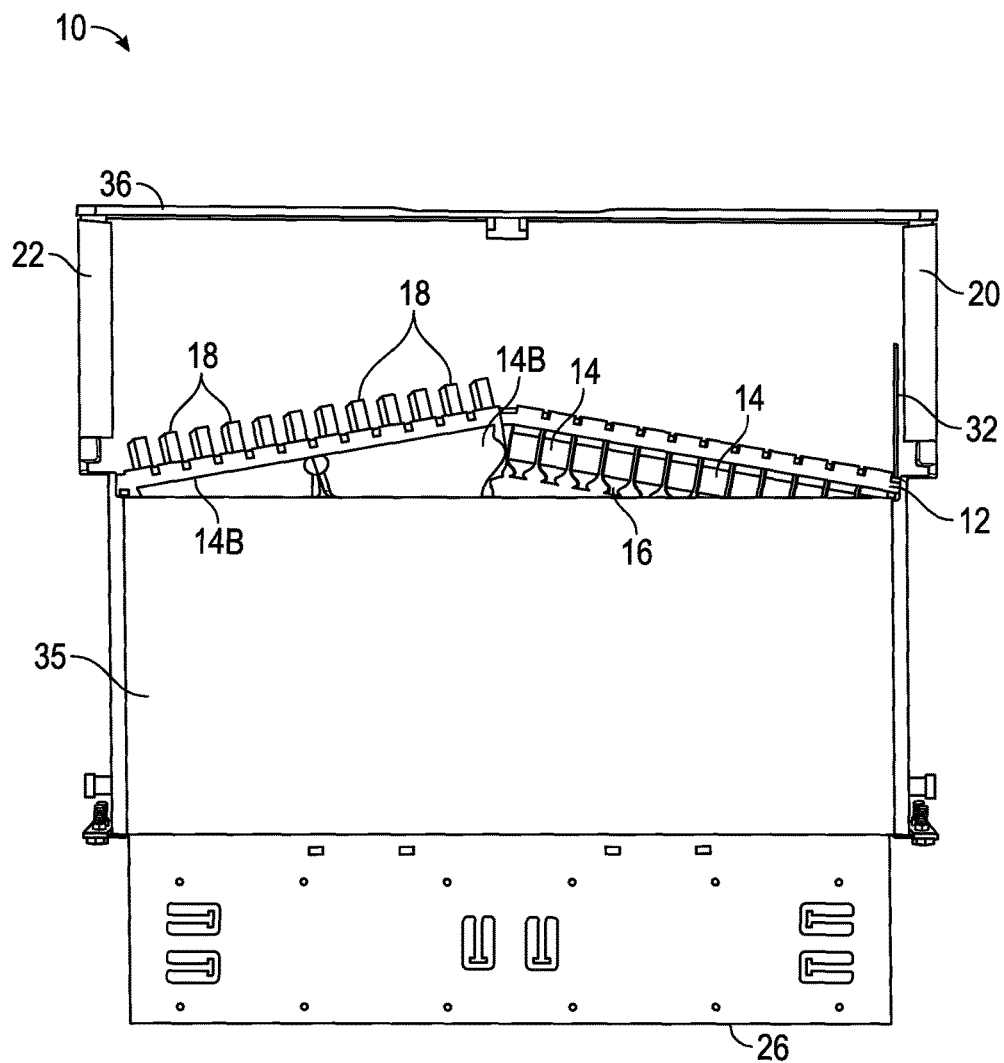
FIG. 5 is a bottom view of the media patching system of FIG. 3.
Figure 6:
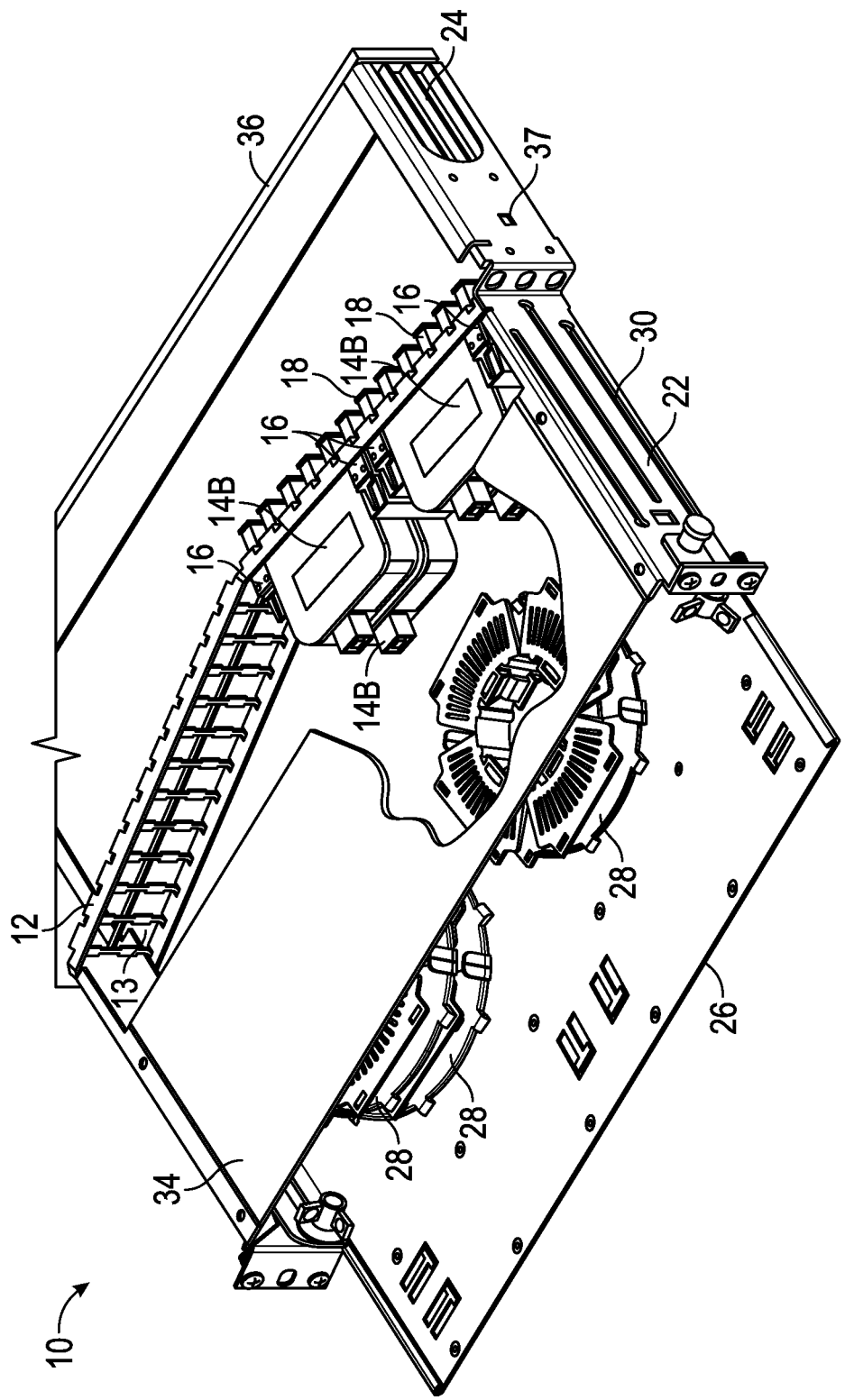
FIG. 6 is a partial top, perspective view of the media patching system of FIG. 1, after exemplary connector assemblies are mounted to the media patching system.

The exemplary embodiments disclosed herein are illustrative of advantageous patch panel assemblies, and patching systems of the present disclosure and methods/techniques thereof. It should be understood, however, that the disclosed embodiments are merely exemplary of the present disclosure, which may be embodied in various forms. Therefore, details disclosed herein with reference to exemplary patch panel assemblies/fabrication methods and associated processes/techniques of assembly and use are not to be interpreted as limiting, but merely as the basis for teaching one skilled in the art how to make and use the advantageous patch panel assemblies/systems and/or alternative assemblies of the present disclosure.

In general, the present disclosure provides improved patch panel assemblies/patching systems, and related methods of use. The present disclosure provides improved systems/methods for the design and use of patch panel assemblies configured to support multiple media connections. More particularly, the present disclosure provides advantageous cable management plates for the design and use of patch panel assemblies configured to organize and support high density connections, and provide convenient access to the supported cables.

In exemplary embodiments, disclosed herein is a high density patching assembly/system configured to support multiple mixed media connections. In some embodiments, the improved systems/assemblies of the present disclosure provide users with the ability to install multiple mixed media connections (e.g., both copper-based and fiber optic connections) in the same patching system/enclosure. For example, in certain embodiments, high density jack patch panels are utilized in the systems/assemblies of the present disclosure to support multiple mixed media connections (e.g., high density, multiple mixed media connections). However, it should be understood that the exemplary cable management plates and patching systems can be used to support one or more types of cables used in a communication network. Moreover, exemplary patch panel assemblies disclosed herein can advantageously increase patching density of the media patching system while maintaining port accessibility.

In exemplary embodiments, the present disclosure provides for improved cable management plates for the organization, support and access of cables used in a patching system which can be secured to a rack and/or a patch panel, thereby providing a significant operational, commercial and/or manufacturing advantage as a result.

Referring now to the drawings, like parts are marked throughout the specification and drawings with the same reference numerals, respectively. Drawing figures are not necessarily to scale and in certain views, parts may have been exaggerated for purposes of clarity.

With reference to FIGS. 1-6, an exemplary media patching system 10 according to the present disclosure is shown. In general, media patching system 10 is configured and dimensioned to be used as a patching system for media connections. More particularly, media patching system 10 can be configured to support high density, multiple media connections, as discussed further below. It is noted that media patching system 10 can take a variety of forms, shapes and/or designs.

In certain embodiments, media patching system 10 provides users with the ability to install multiple media connections (e.g., copper-based connections, fiber optic connections, combinations thereof, or the like) in the same enclosure provided by the media patching system 10. In some embodiments and as discussed further below, high density jack patch panel assemblies 12 (multi-connector panel assemblies 12) can be utilized with media patching system 10 to support multiple media connections (e.g., high density, multiple media connections, such as copper connections, fiber optic connections, combinations thereof, or the like). Exemplary patch panel assemblies/multi-connector panel assemblies 12 disclosed herein advantageously increase the patching density of system 10.

Figure 11:
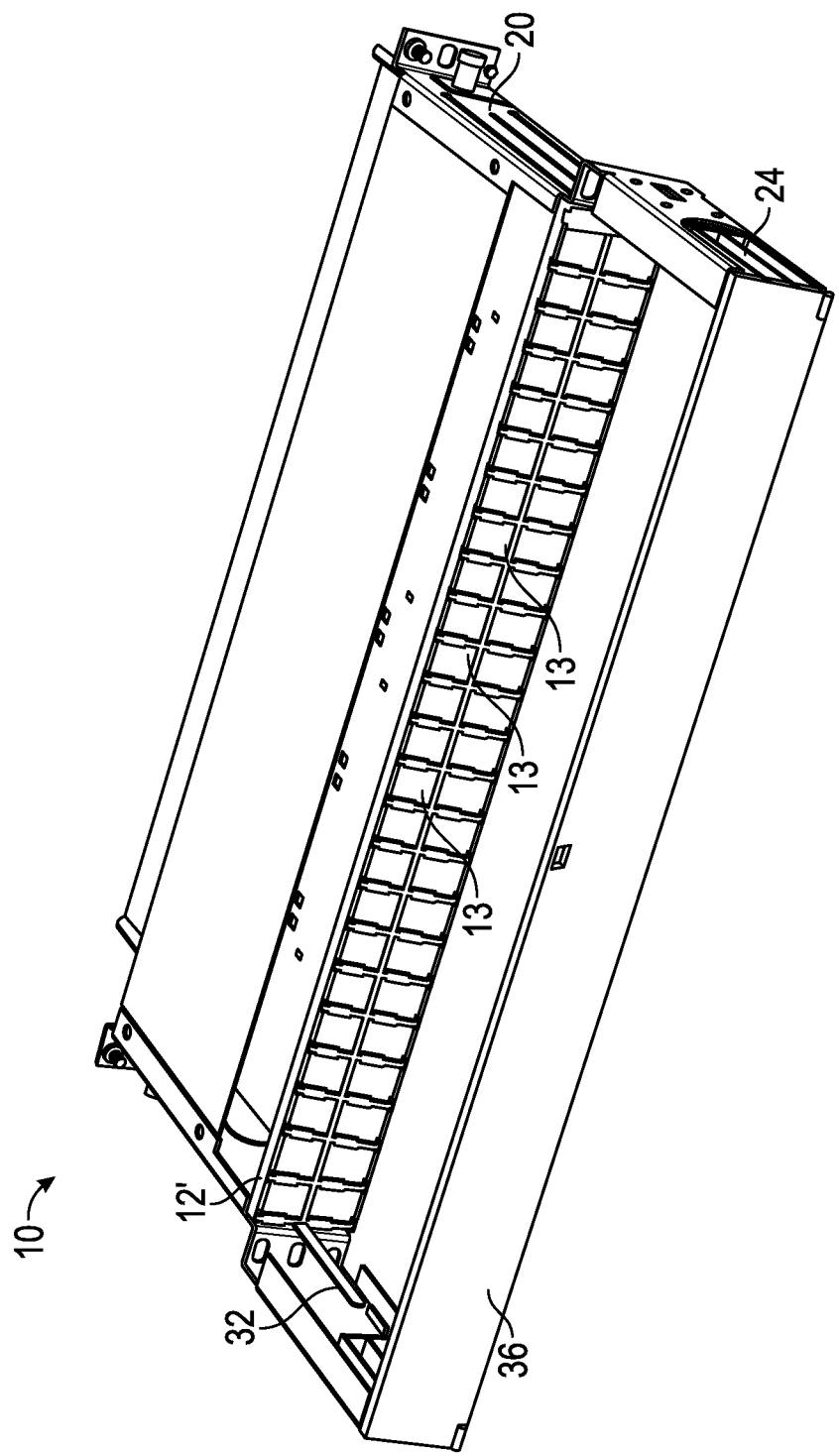
FIG. 11 is a top, perspective view of another exemplary media patching system of the present disclosure, prior to connector assemblies mounted to the media patching system.
Figure 12:
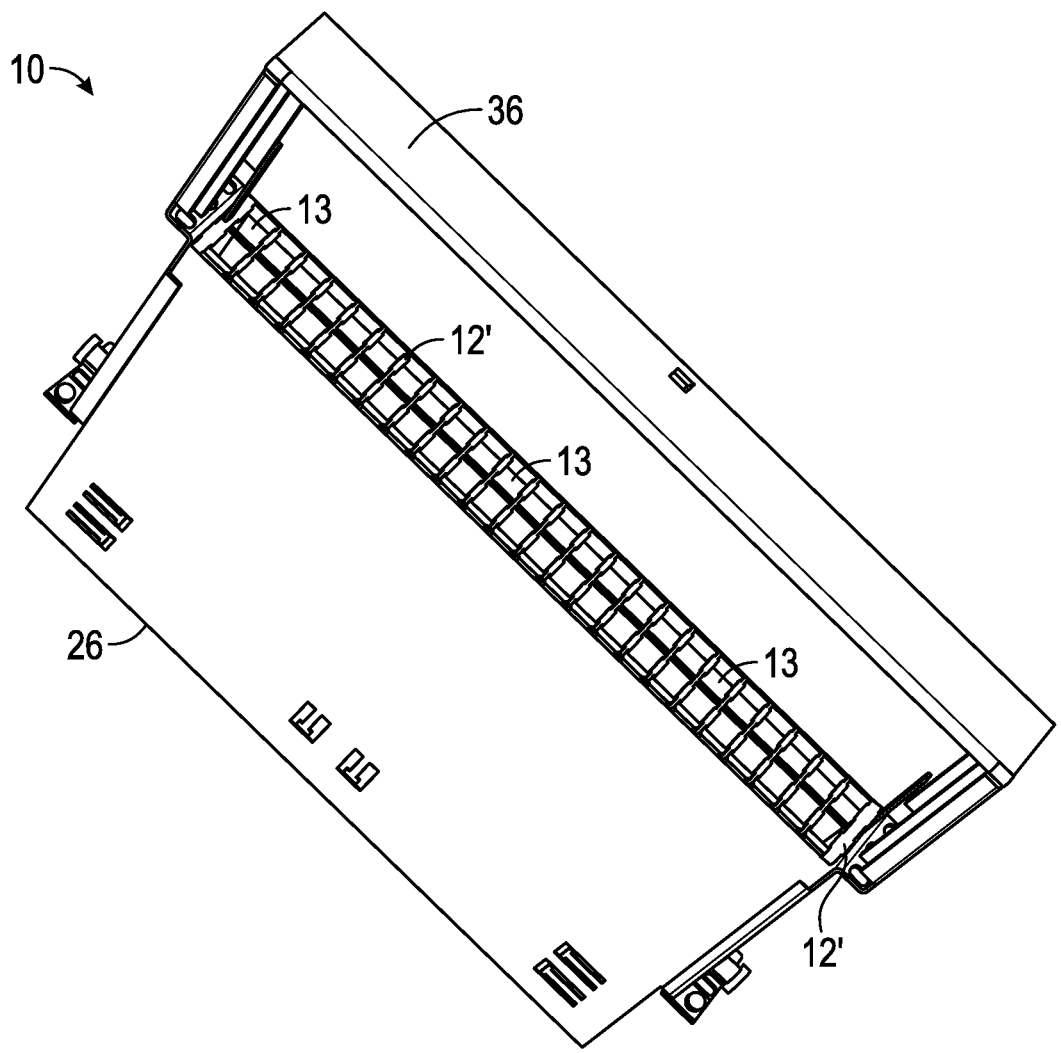
FIG. 12 is a bottom, perspective view of the media patching system of FIG. 11.

In general, media patching system 10 includes a patch panel assembly/multi-connector panel assembly 12. Exemplary multi-connector panel assembly 12 has a panel surface that includes a plurality of apertures 13. As discussed in further detail below, each aperture 13 is typically configured and dimensioned to have a connector assembly/connective device 14, 14A or 14B mounted with respect thereto (FIGS. 3-6, 13, 16, 21 and 26). It is noted that the panel surface of multi-connector panel assembly 12 can be angled (FIGS. 1-6), or it can be substantially flat or planar (assembly 12' of FIGS. 11-13). Additionally, it is further noted that assembly 12, 12' can take a variety of shapes, forms and/or geometries.

As shown in FIGS. 1 and 3-5, one or more connector assemblies 14 can be mounted with respect to panel assembly 12 (e.g., with one aperture 13 configured to house/mount to one assembly 14), as described and disclosed in U.S. Pat. Nos. 8,439,702 and 8,672,709 noted above. More particularly, each connector assembly 14 typically includes a movable locking member 16 (FIGS. 3, 6 and 21) that is configured to releasably secure the connector assembly 14 to panel assembly 12 as described and disclosed in U.S. Pat. Nos. 8,439,702 and 8,672,709. Panel assembly 12 can include any number of connector assemblies 14 mounted thereon (e.g., one, two, three, four, a plurality, etc.).

Each exemplary connector assembly 14 takes the form of a copper-based electrical connector assembly 14. More particularly, it is noted that each connector assembly 14 includes a jack housing (e.g., high density modular communication jack housing) that is adapted to receive signals from a mating connecting assembly (e.g., a plug connector, such as an RJ-45 plug or an IEC 60603-7-7 compliant plug) inserted or introduced to a receiving space of the jack housing. As such, associated contacts (e.g., eight contacts) or the like of the jack housing are positioned for electrical communication with data signal transmission media plug elements/contacts introduced to the receiving space of the jack housing. In general, the jack housing of electrical connector assembly 14 is suitable for use in various applications, e.g., for interfacing with high frequency data transfer media, connection to data transfer devices or the like, etc. For example, the jack housing of connector assembly 14 may be mounted to a printed circuit board (PCB) and signals may transfer from a plug connector introduced to the receiving space of connector assembly 14 to the PCB and then to insulation displacement contacts (IDCs), thus completing the data interface and transfer through connector assembly 14.

Figure 13:
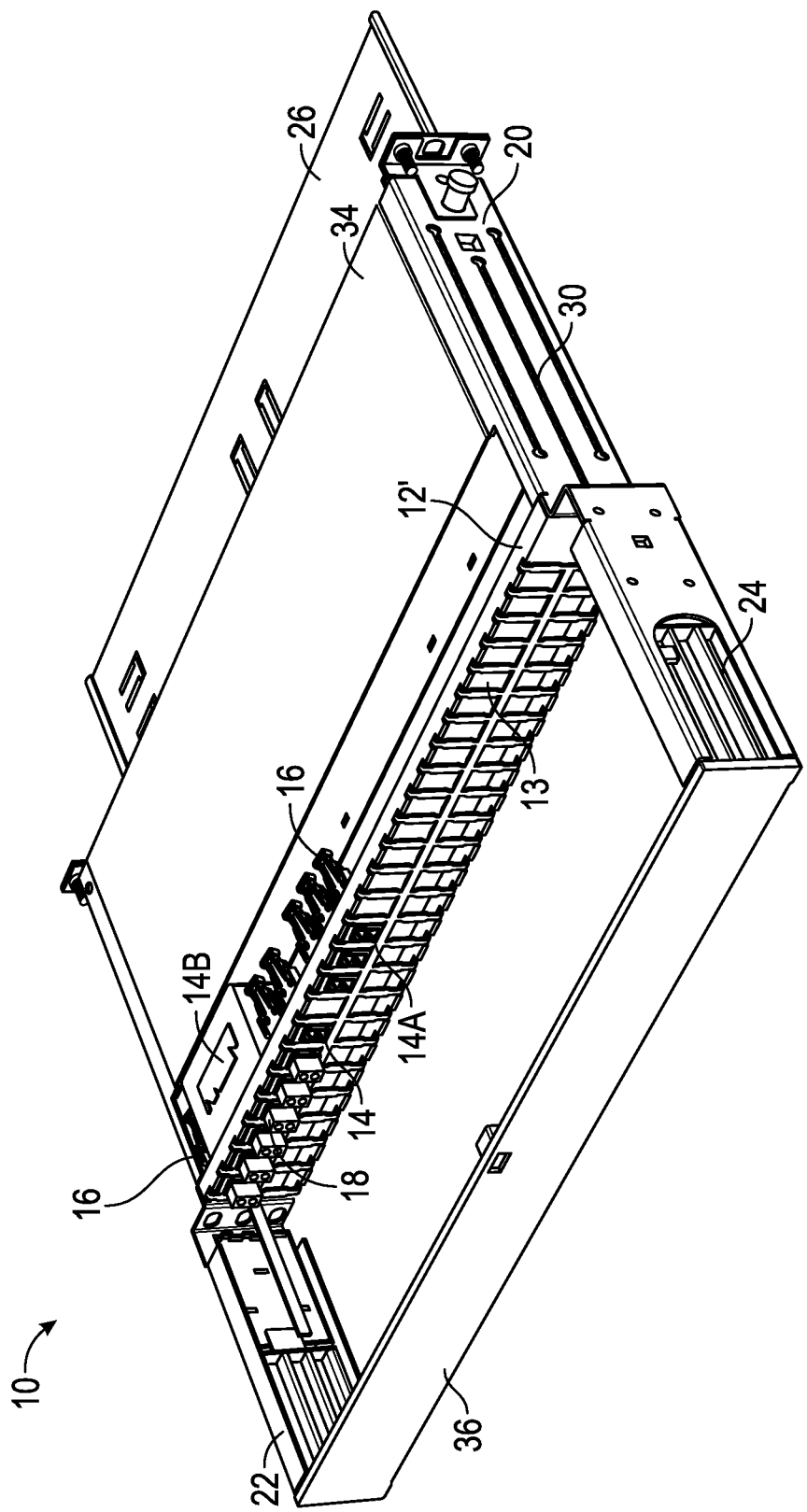
FIG. 13 is a top, perspective view of the medial patching system of FIG. 11, after exemplary connector assemblies are mounted to the media patching system.
Figure 21:
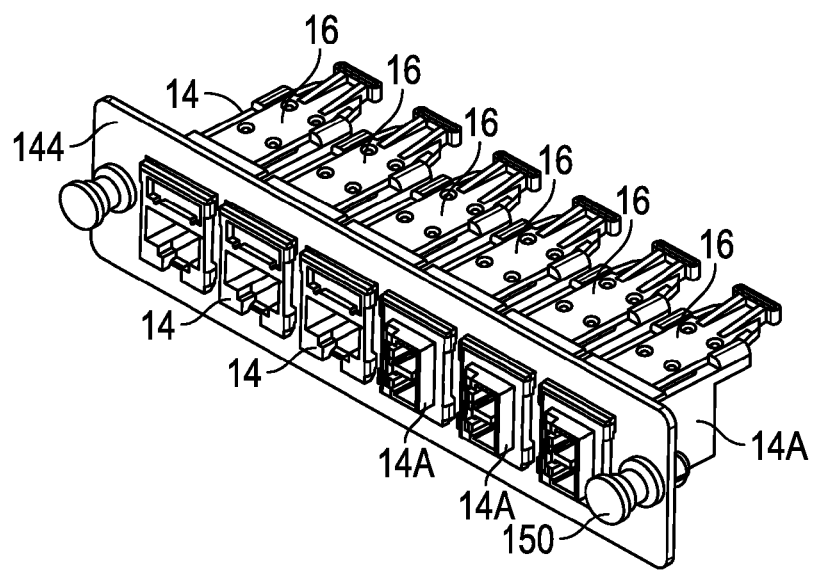
FIG. 21 is a front, perspective view of the bezel member of FIG. 17, after exemplary connector assemblies are mounted to the bezel member.

In some embodiments and as discussed below in connection with FIGS. 13 and 21, panel assembly 12 can have one or more connector assemblies 14A mounted thereon (via apertures 13). Each connector assembly 14A takes the form of a fiber optic connector assembly 14A. Panel assembly 12 can include any number of connector assemblies 14A mounted thereon (e.g., one, two, three, four, a plurality, etc.).

More particularly, each connector assembly 14A includes one or more ports/adapters to facilitate communication with a mating assembly (e.g., fiber optic connector), that in turn can interact with various fiber optic media (fiber optic cables, etc.). The ports/adapters of assembly 14A are typically positioned for communication with fiber optic connectors introduced to a receiving space of the assembly 14A. Similar to connector assembly 14, each connector assembly 14A typically includes a movable locking member 16 (FIGS. 13 and 21) that is configured to releasably secure the connector assembly 14A to panel assembly 12, as described above.

As shown in FIGS. 3-6, one or more connector assemblies 14B can be mounted with respect to panel assembly 12. Panel assembly 12 can include any number of connector assemblies 14B mounted thereon. Exemplary connector assembly 14B takes the form of a fiber optic cassette 14B having a plurality of fiber optic ports/adapters (e.g., 12 ports) for mating with fiber optic connectors. In certain embodiments, connector assembly 14B includes six port housings 18, with each port housing 18 including two or more fiber optic ports/adapters (e.g., LC, SC, MPO adapters).

Figure 22:
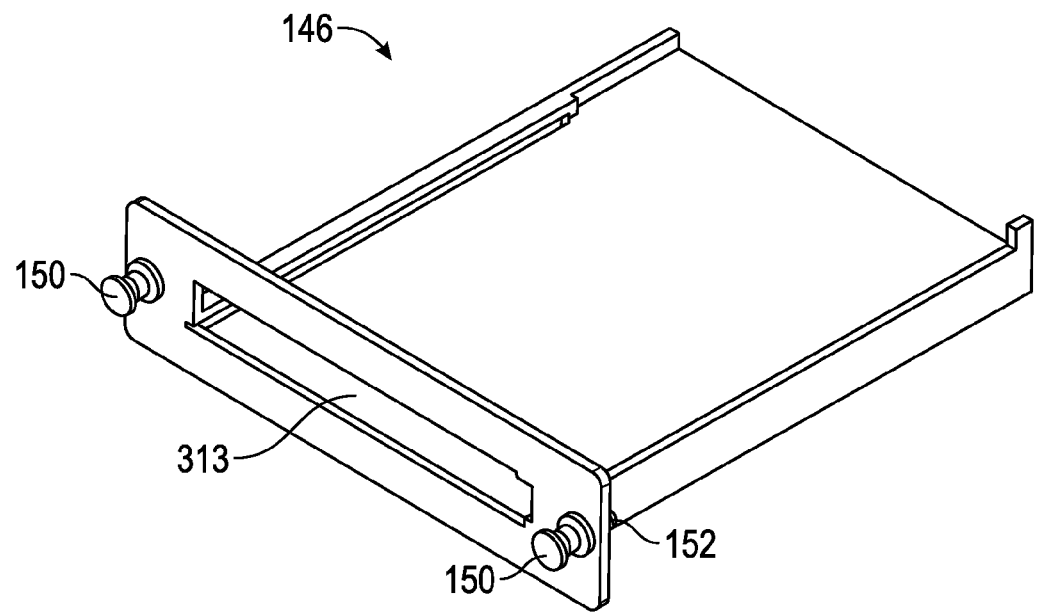
FIG. 22 is a front perspective view of another exemplary bezel member for use with the media patching system of FIG. 14.

Each port housing 18 is configured to be inserted through and mounted with respect to six respective apertures 13 of panel assembly 12 via locking members 16 disposed on each top end of connector assembly 14B (FIGS. 3 and 22), as similarly discussed above for locking members 16 of assemblies 14 and 14A. It is noted that connector assembly 14B can include any suitable number of port housings 18 and/or fiber optic ports and/or locking members 16 for mounting to panel assembly 12, and/or for fiber optic communication purposes.

Figure 26:
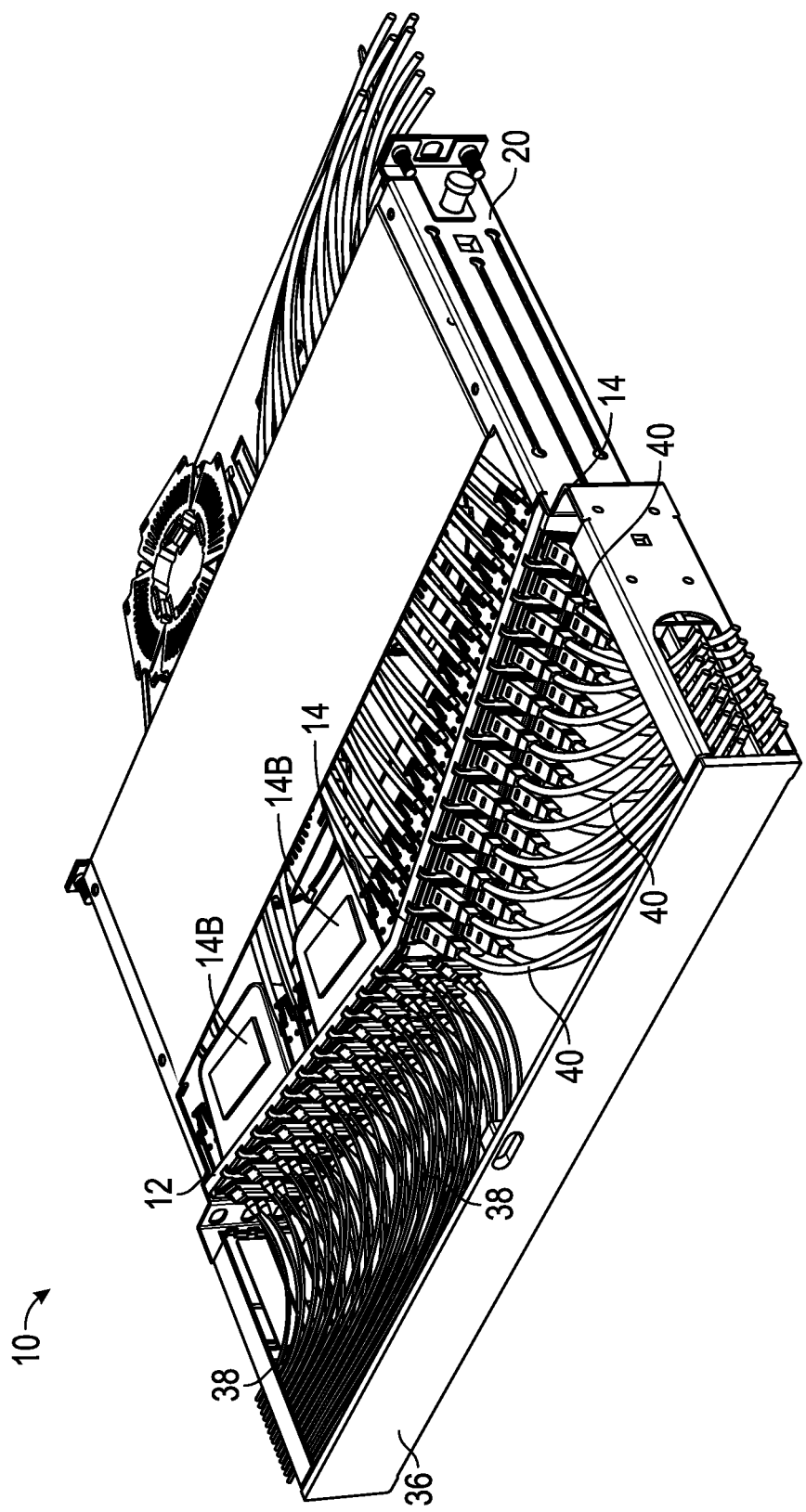
FIG. 26 is a top, perspective view of the media patching system of FIG. 3, after exemplary cables/wires are mounted to the media patching system.

It is noted that panel assembly 12 of media patching system 10 can include any number, combination and/or permutation of connector assemblies/connector devices 14, 14A and/or 14B. As such, panel assembly 12 can include connector assemblies 14, 14A or 14B, or mixtures thereof. Thus, panel assembly 12 of media patching system 10 advantageously provides users with the ability to install multiple mixed media connections (e.g., both copper-based 14, and fiber optic connections 14A, 14B) in the same media patching system 10. Moreover, panel assembly 12 can advantageously increase patching density of the media patching system 10 while maintaining port accessibility. FIG. 26 shows a plurality of cables 38 mounted with respect to the ports of connector assemblies 14B, and a plurality of cables 40 mounted with respect to the jack housings of connector assemblies 14.

Figure 27:
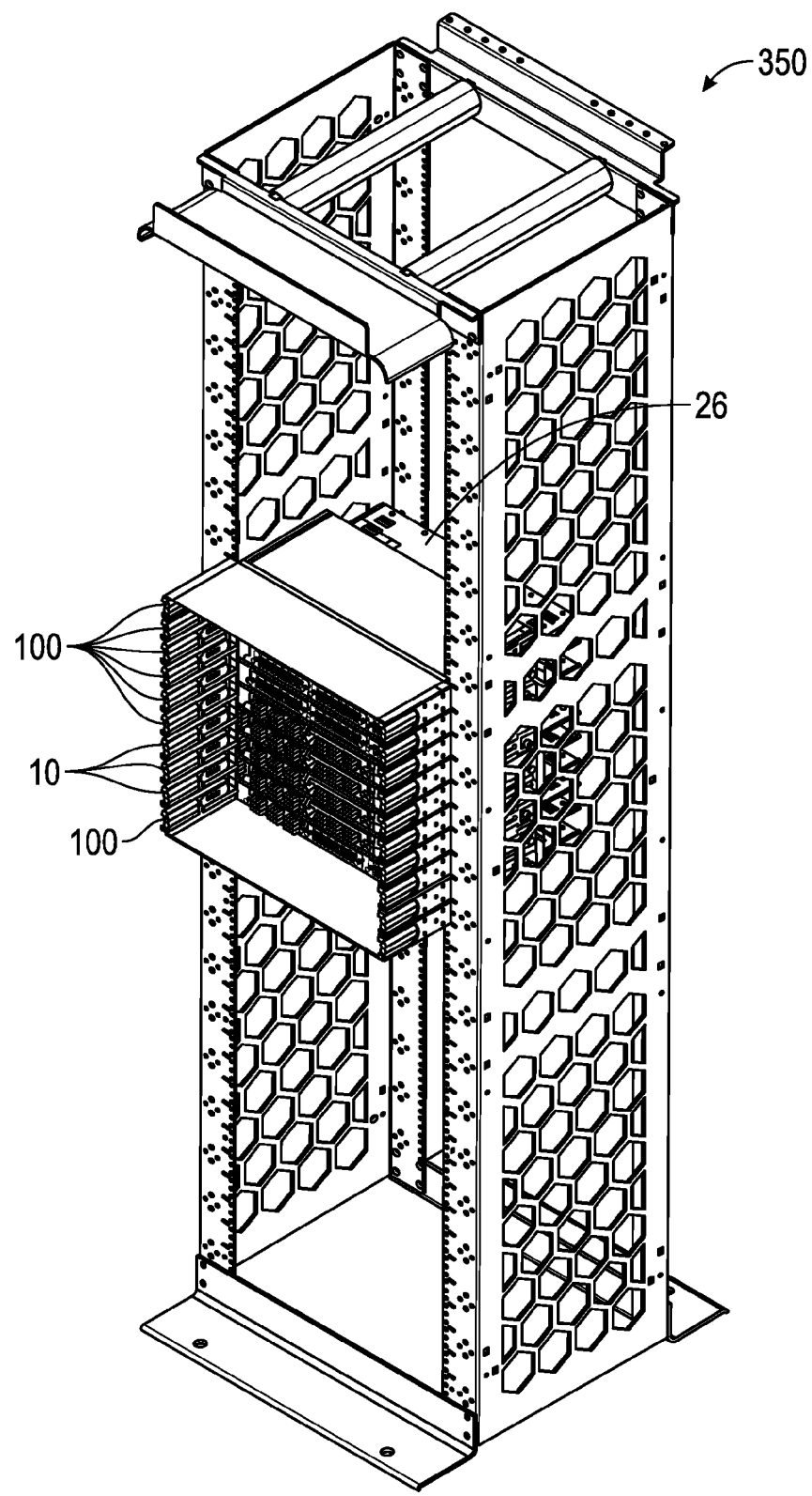
FIG. 27 is a side, perspective view of exemplary media patching systems mounted with respect to a supporting structure.

In some embodiments, media patching system 10 can be configured and dimensioned to be mounted with respect to a support structure (e.g., rack 350—FIG. 27) or the like. As shown in FIG. 27, it is noted that exemplary media patching systems 10 (and 100) are adapted for use in conjunction with a rack 350 (e.g., network or server rack) or the like, although the present disclosure is not limited thereto. Rather, the disclosed media patching systems 10 and/or 100 are adapted for use in conjunction with other structures, such as, for example, frames, walls, cabinets, supporting structures, or other structures that stand to benefit from proximate cable management functionality. For ease of disclosure, the potential structures to which the disclosed systems 10/100 may be mounted are collective referred to as "rack(s)." However, it is to be understood that the present disclosure is not limited by or to implementations wherein the disclosed systems 10/100 are mounted with respect to, or used in conjunction with, a rack, but may be mounted with respect to, or used in conjunction with other structures/units (e.g., structures/units associated with cable routing).

As shown in FIG. 27, one or more media patching systems 10 and/or 100 can be mounted in a horizontal orientation with respect to rack 350 or the like, and stacked relative to each other to define various heights (e.g., 1 U, 2 U, 3 U, 4 U, and the like). Any suitable number of systems 10/100 can be mounted with respect to rack 350, and the systems 10/100 may or may not include cover members 33, 34 and/or lower cable management plate 35. For example and as shown in FIG. 27, ten media patching systems 10/100 are mounted with respect to rack 350, with the ten systems mounted proximal to one another within rack 350. In one embodiment, the top system 100 in rack 350 includes top cover members 33 and 34, and the bottom system 100 includes lower cable management plate 35.

In some embodiments, the top cover member 33, the top cover member 34, the lower cable management plate 35, or combinations thereof, can be attached to the top and bottom media patching systems 10/100 of the group of media patching systems 10/100 (e.g., as shown in FIG. 27) to create a secure open concept enclosure through which cables can be passed. In some embodiments, the top cover member 33, the top cover member 34, the lower cable management plate 35, or combinations thereof, can be attached in-between certain media patching systems 10/100 to create multiple open concept enclosures along the height of the rack 350. Thus, the cover members 33, 34, and/or the lower cable management plate 35 can be used to customize the separation between the media patching systems 10/100 such that the desired cables can be grouped together.

As will be discussed in greater detail below, in some embodiments, media patching systems 10/100 can include door assemblies mounted with respect to the frame members and configured to open, close, lock and unlock as desired by a user. The door assemblies can securely enclose the cables within the media patching systems 10/100 and allow different levels of access to particular media patching systems 10/100. Although illustrated as defining a height of approximately 1 U to cover a single media patching system 10/100, it should be understood that door assemblies defining various heights can be used. For example, a door assembly defining a height of approximately 10 U can be used to securely cover the stacked group of ten media patching systems 10/100 shown in FIG. 27. Thus, access to the entire group of media patching systems 10/100 shown in FIG. 27 can be achieved by unlocking a single door.

Exemplary rack 350 is depicted in FIG. 27, and such rack 350 and other exemplary mounting structures suitable for use with systems 10/100 are described and disclosed in U.S. Pat. No. 7,983,038, the entire contents of which is hereby incorporated by reference in its entirety. However and as noted above, systems 10/100 may be mounted with respect to or used in conjunction with other structures/units.

Figure 9:
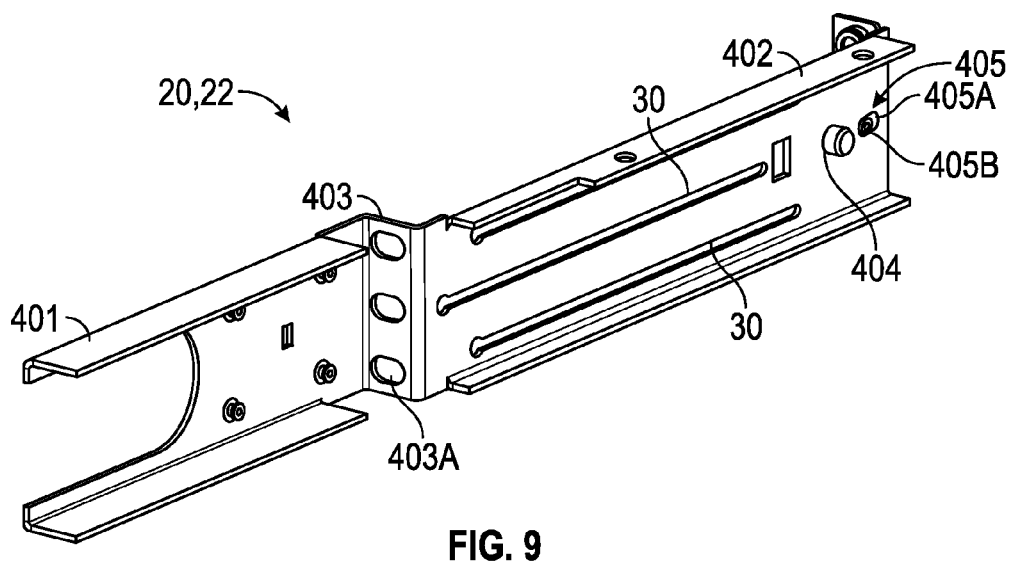
FIG. 9 is a side, perspective view of an exemplary frame member of the media patching system of FIG. 1.
Figure 10:
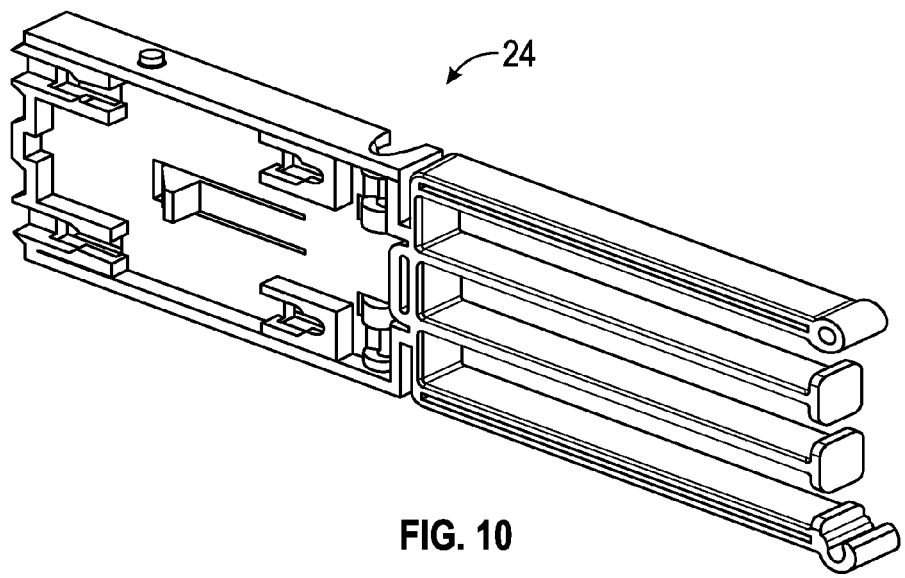
FIG. 10 is a side, perspective view of an exemplary cable management member of the media patching system of FIG. 1.

Multi-connector panel assembly 12 of media patching system 10 can be mounted with respect to a first frame member 20 and a second frame member 22 (FIGS. 1 and 9). A cable management member 24 can be mounted with respect to each frame member 20, 22 for cable/wire management purposes of media patching system 10. Each frame member 20, 22 can be mounted with respect to an upper cable management plate 26, which will be discussed in greater detail below. Upper cable management plate 26 can include one or more cable management spools 28 or the like removably mounted thereon for cable/wire management purposes of system 10. System 10 may or may not include top covers 33, 34 and/or lower cable management plate 35 (e.g., mounted with respect to frame members 20, 22). System 10 may also include a door assembly 36 (e.g., mounted with respect to frame members 20, 22) that is configured to open, close, lock and unlock as desired by a user.

Figure 7:
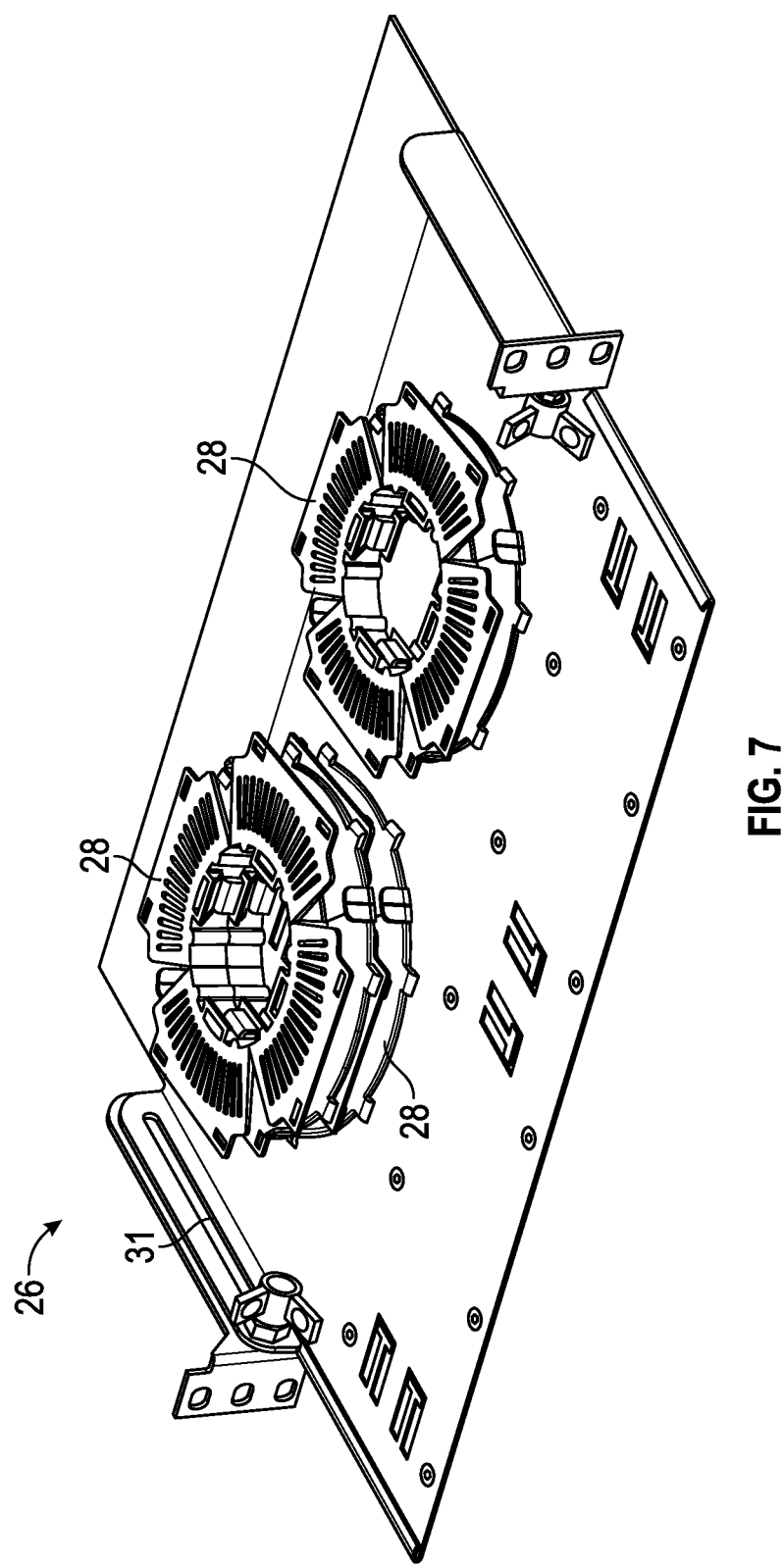
FIG. 7 is a top, perspective view of an exemplary cable management plate assembly including upper cable management plate and lower cable management plate of the media patching system of FIG. 1.
Figure 8:
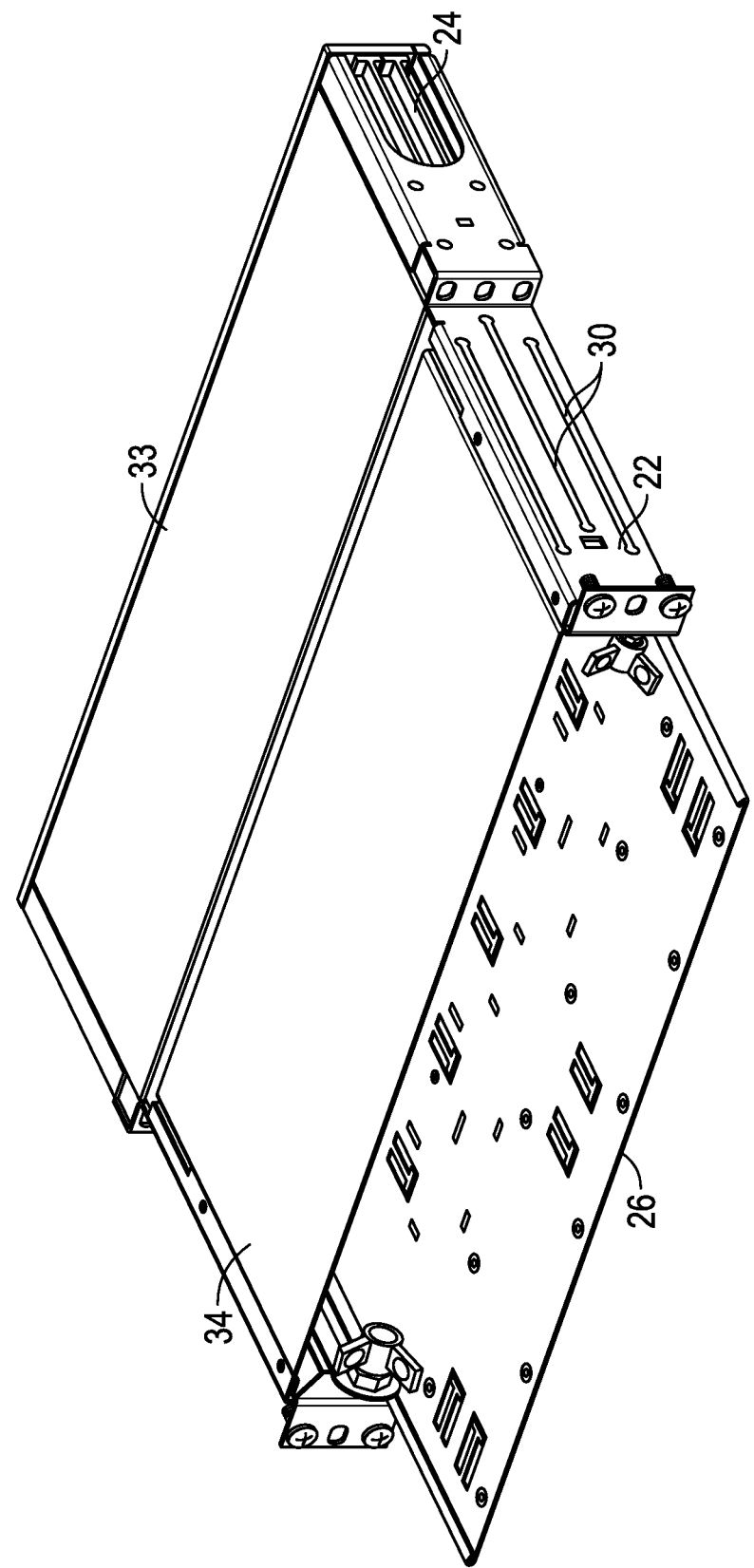
FIG. 8 is a top, perspective view of the media patching system of FIG. 1, with an exemplary front cover member attached.

In some embodiments, panel assembly 12 can be movably mounted relative to frame members 20, 22 via one or more slots 30 of frame members 20, 22. Pull tab members 32 of panel assembly 12 can facilitate movement of panel assembly 12 relative to frame members 20, 22. Upper cable management plate 26 can move relative to frame members 20, 22 via slots 31 of upper cable management plate 26 (FIG. 7). In some embodiments, movement or sliding of the upper cable management plate 26 relative to frame members 20, 22 can be independent from movement of panel assembly 12. Upper cable management plate 26 can therefore be extended from the media patching system 10 without affecting the position of panel assembly 12.

As noted above and as shown in FIGS. 11-13, media patching system 10 can include a panel assembly 12' having a panel surface that is substantially flat or planar. Similar to panel assembly 12, the flat/planar panel assembly 12' can include any number, combination and/or permutation of connector assemblies/connector devices 14, 14A and/or 14B. As such, panel assembly 12' can include connector assemblies 14, 14A or 14B, or mixtures thereof. Thus, panel assembly 12' of system 10 advantageously provides users with the ability to install multiple media connections (e.g., copper-based connections 14, fiber optic connections 14A, 14B, combinations thereof, or the like) in the same media patching system 10. Moreover, panel assembly 12' can advantageously increase patching density of the media patching system 10 while maintaining port accessibility.

Figure 14:
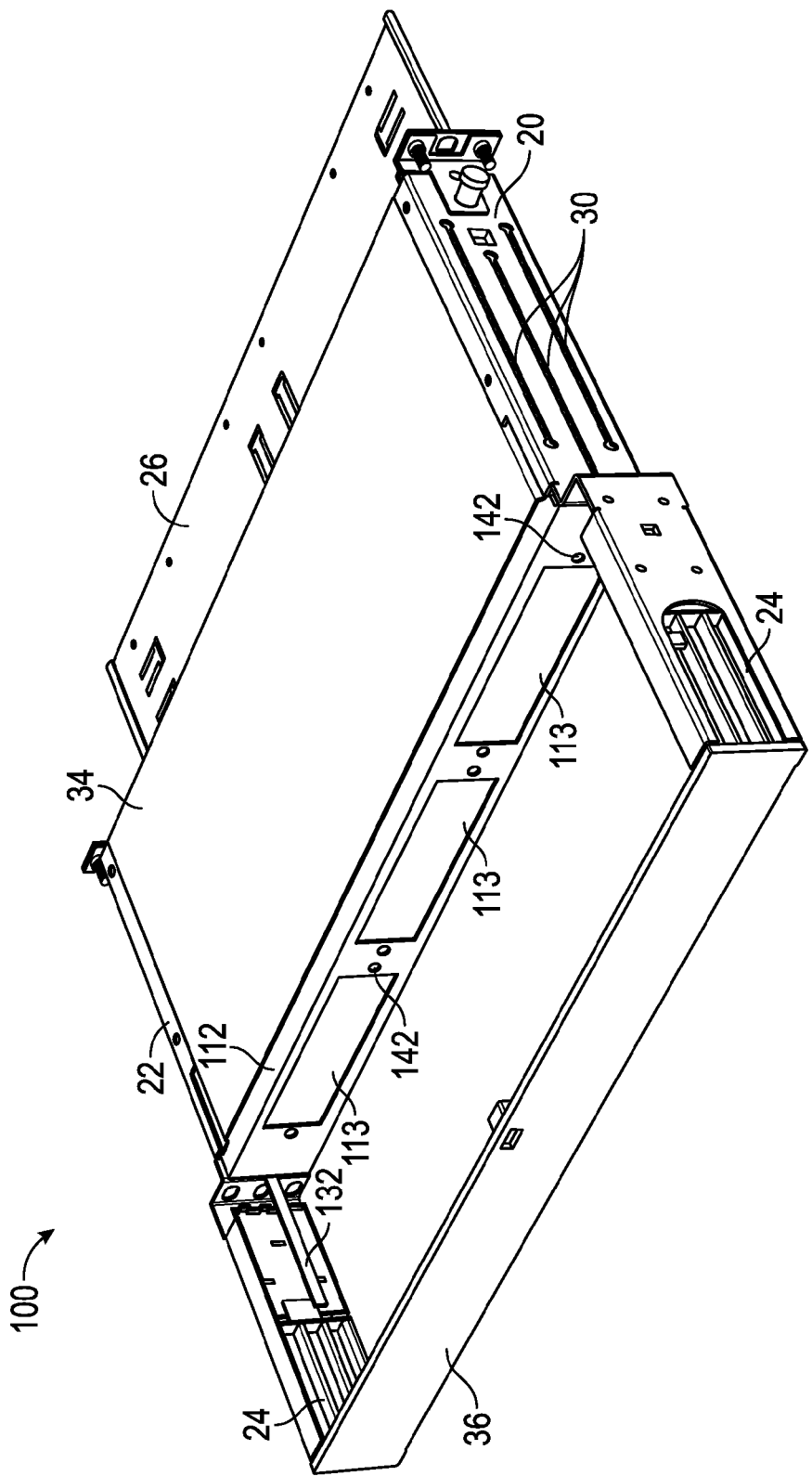
FIG. 14 is a top, perspective view of another exemplary media patching system of the present disclosure, prior to connector assemblies mounted to the medial patching system.
Figure 15:
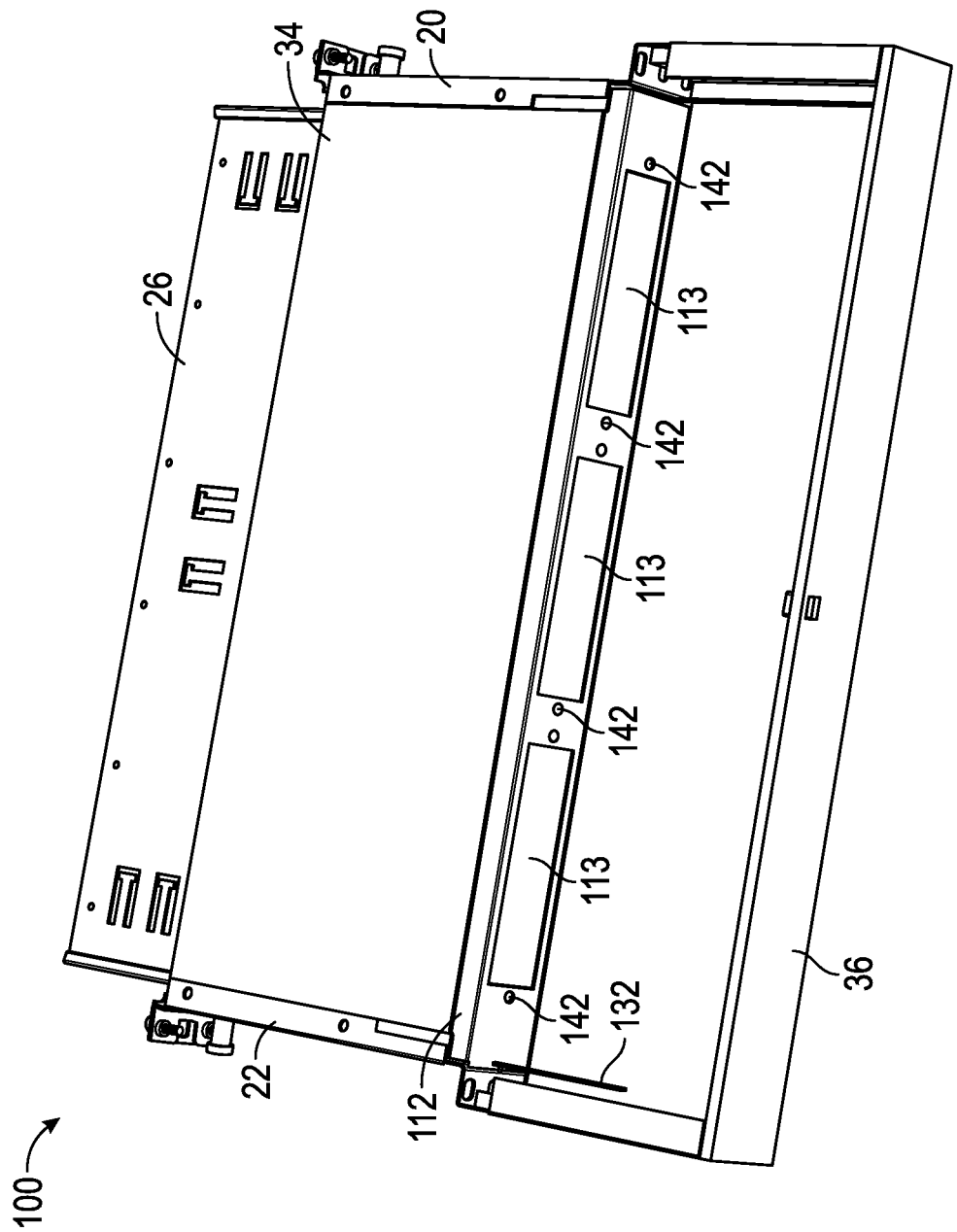
FIG. 15 is a top, perspective view of the media patching system of FIG. 14.
Figure 16:
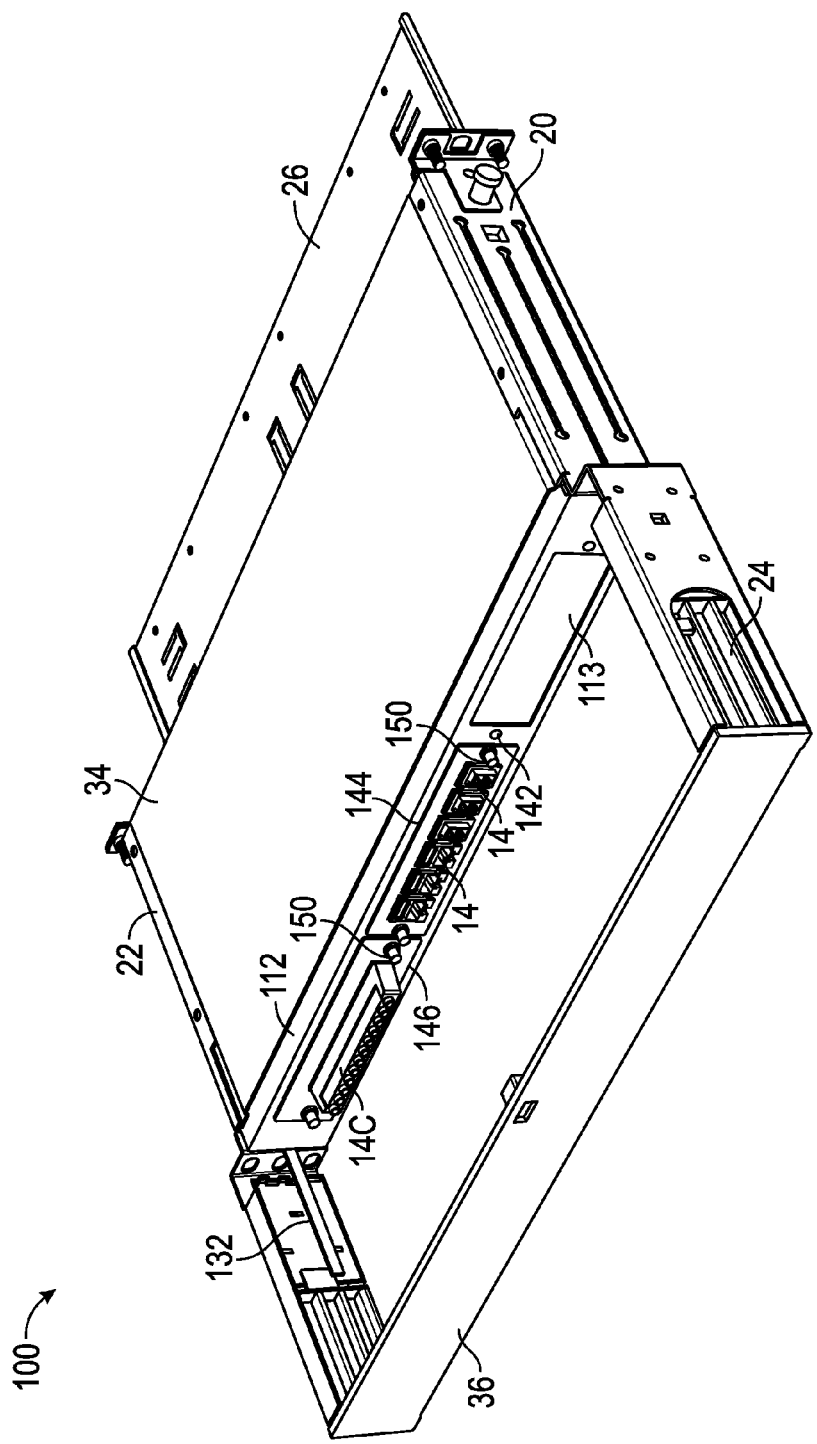
FIG. 16 is a top, perspective view of the media patching system of FIG. 14, after exemplary connector assemblies are mounted to the media patching system.
Figure 17:
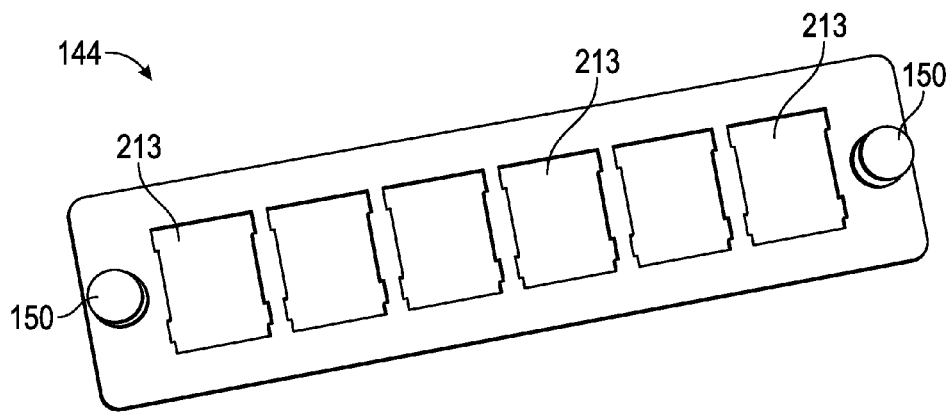
FIG. 17 is a front view of an exemplary bezel member for use with the media patching system of FIG. 14.
Figure 18:
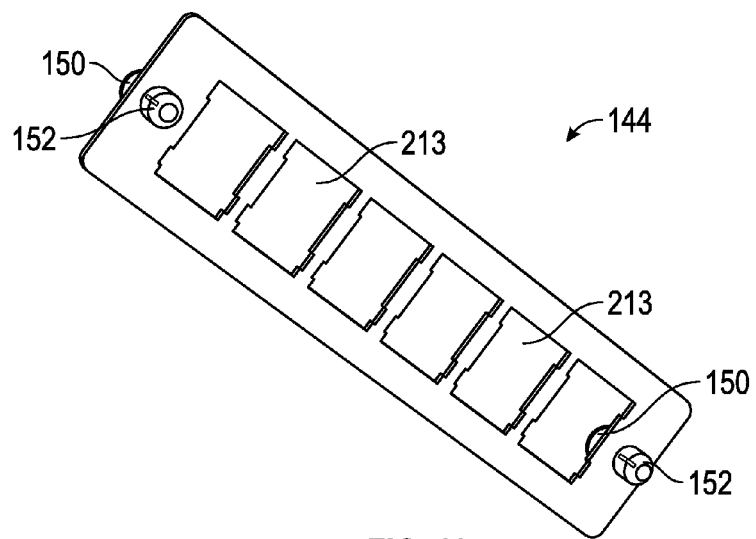
FIG. 18 is a rear, perspective view of the bezel member of FIG. 17.
Figure 19:
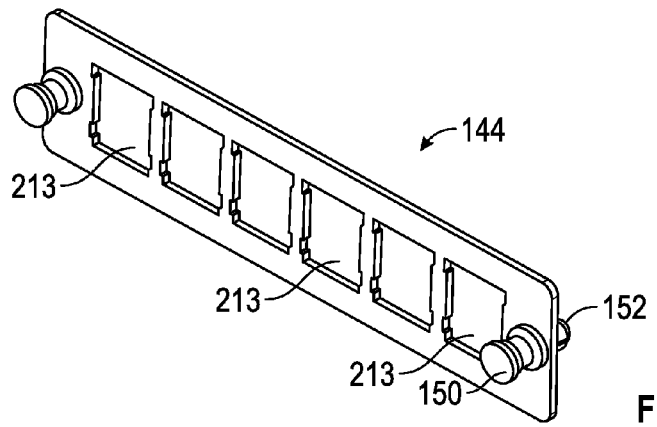
FIG. 19 is a front, perspective view of the bezel member of FIG. 17.
Figure 20:
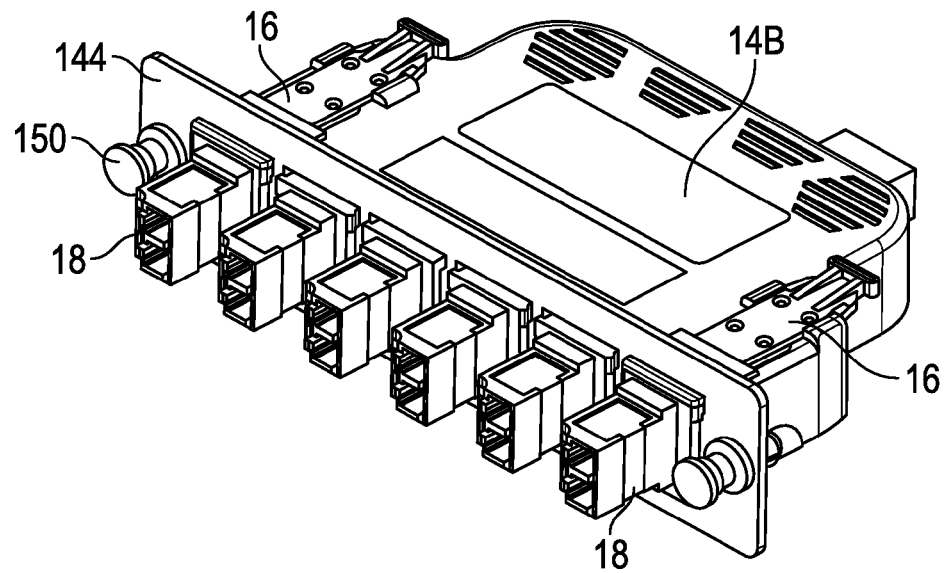
FIG. 20 is a front, perspective view of the bezel member of FIG. 17, after an exemplary connector assembly is mounted to the bezel member.

In some embodiments and as shown in FIGS. 14-16, exemplary media patching system 100 is similar to system 10 discussed above, except for the distinctions noted herein. Similar to system 10 discussed above, media patching system 100 is configured and dimensioned to be used as a patching system for multiple media connections. More particularly, media patching system 100 can be configured to support high density, multiple media connections. It is noted that media patching system 100 can take a variety of forms, shapes and/or designs.

In exemplary embodiments, system 100 is a high density patching system configured to support multiple mixed media connections. In certain embodiments, system 100 provides users with the ability to install multiple media connections (e.g., copper-based connections, fiber optic connections, combinations thereof, or the like) in the same media patching system 100.

Similar to system 10 above, media patching system 100 includes a patch panel assembly or multi-connector panel assembly 112. In certain embodiments, media patching system 100 is configured and dimensioned to be mounted with respect to a supporting structure (e.g., rack 350—FIG. 27) or the like. As shown in FIG. 27, it is noted that exemplary media patching systems 100 (and 10) are adapted for use in conjunction with a rack 350 (e.g., network or server rack) or the like. As shown in FIG. 27, one or more media patching systems 100 (and/or 10) can be removably mounted with respect to rack 350 or the like.

Multi-connector panel assembly 112 of media patching system 100 can be mounted with respect to a first frame member 20 and a second frame member 22 (FIGS. 9 and 14-16). A cable management member 24 can be mounted with respect to each frame member 20, 22 for cable/wire management purposes of system 100. Each frame member 20, 22 can be mounted with respect to an upper cable management plate 26, which will be discussed in greater detail below. Upper cable management plate 26 can include one or more cable management spools 28 or the like removably mounted thereon for cable/wire management purposes. System 100 may or may not include top covers 33, 34 and/or bottom cover 35 (e.g., mounted with respect to frame members 20, 22). System 100 may also include a door assembly 36 (e.g., mounted with respect to frame members 20, 22) that is configured to open, close, lock and unlock as desired by a user.

In some embodiments, panel assembly 112 can be movably mounted relative to frame members 20, 22 via one or more slots 30 of frame members 20, 22. Pull tab members 132 of panel assembly 112 can facilitate movement of panel assembly 112 relative to frame members 20, 22. Upper cable management plate 26 can move relative to frame members 20, 22 via slots 31 of upper cable management plate 26 (FIG. 7).

Exemplary multi-connector panel assembly 112 has a panel surface that includes a plurality of apertures 113. As shown in FIGS. 14-25 and as discussed in further detail below, each aperture 113 is typically configured and dimensioned to have a connector assembly/connective device 14, 14A, 14B, 14C or 14D mounted with respect thereto (e.g., via bezel member 144, 146 or 148). As discussed further below, each aperture 113 of panel assembly 112 is typically associated with one or more mounting holes 142 of panel assembly 12.

It is noted that the panel surface of multi-connector panel assembly 112 can be substantially flat or planar (FIGS. 14-16), or it can be can be angled. Additionally, it is further noted that assembly 112 can take a variety of shapes, forms and/or geometries.

In exemplary embodiments and as shown in FIGS. 16-25, panel assembly 112 can include one or more bezel members 144, 146 and/or 148. Bezel member 144 can include one or more apertures 213, with each aperture 213 configured and dimensioned to have a connector assembly/connective device 14, 14A, 14B mounted with respect thereto, as similarly discussed above in connection with apertures 13 of panel assembly 12 (e.g., via moving locking members 16 of connector assembly/connective device 14, 14A, 14B).

Figure 23:
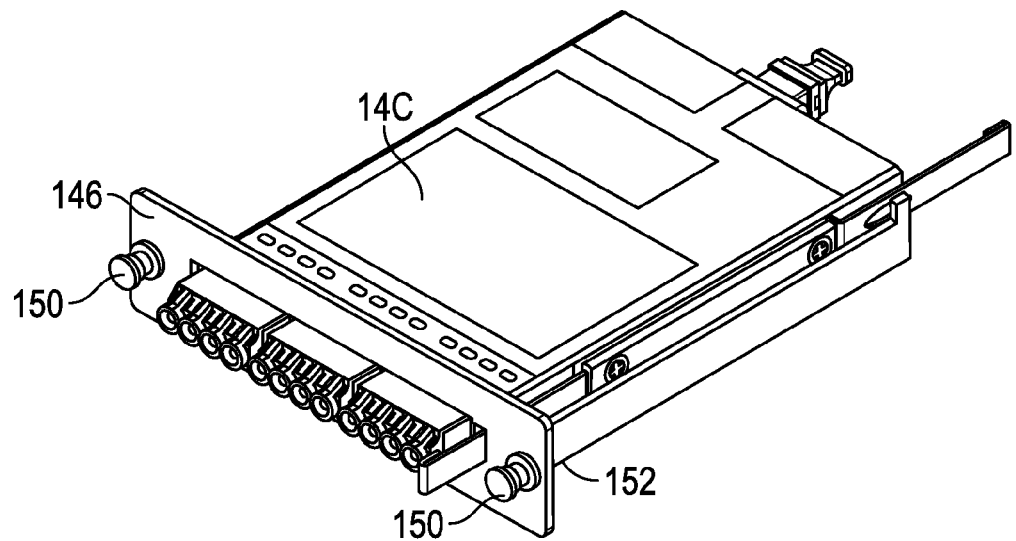
FIG. 23 is a front, perspective view of the bezel member of FIG. 22, after an exemplary connector assembly is mounted to the bezel member.
Figure 24:
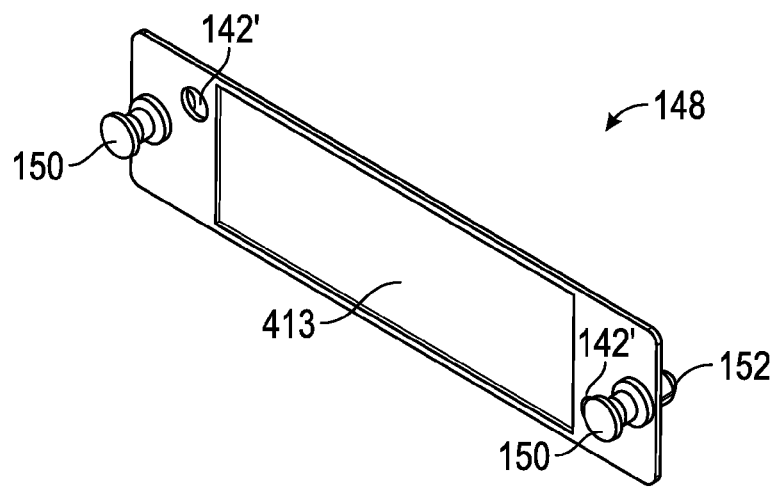
FIG. 24 is a front, perspective view of another exemplary bezel member for use with the media patching system of FIG. 14.

In exemplary embodiments, the front face of bezel member 144 includes one or more handle members 150, and the rear face of bezel member 144 includes one or more mounting members 152 for the releasable attachment to mounting holes 142 of panel assembly 112. Turning to bezel member 146, exemplary bezel member 146 includes an aperture or slot 313, with aperture 313 configured and dimensioned to have a connector assembly/connective device 14C mounted with respect thereto (FIG. 23). Similar to bezel member 144, the front face of bezel member 146 includes one or more handle members 150, and the rear face of bezel member 146 includes one or more mounting members 152 for the releasable attachment to mounting holes 142 of panel assembly 112. Exemplary connector assembly 14C takes the form of a fiber optic cassette 14C having a plurality of fiber optic ports/adapters (e.g., 12 ports) for mating with fiber optic connectors.

Figure 25:
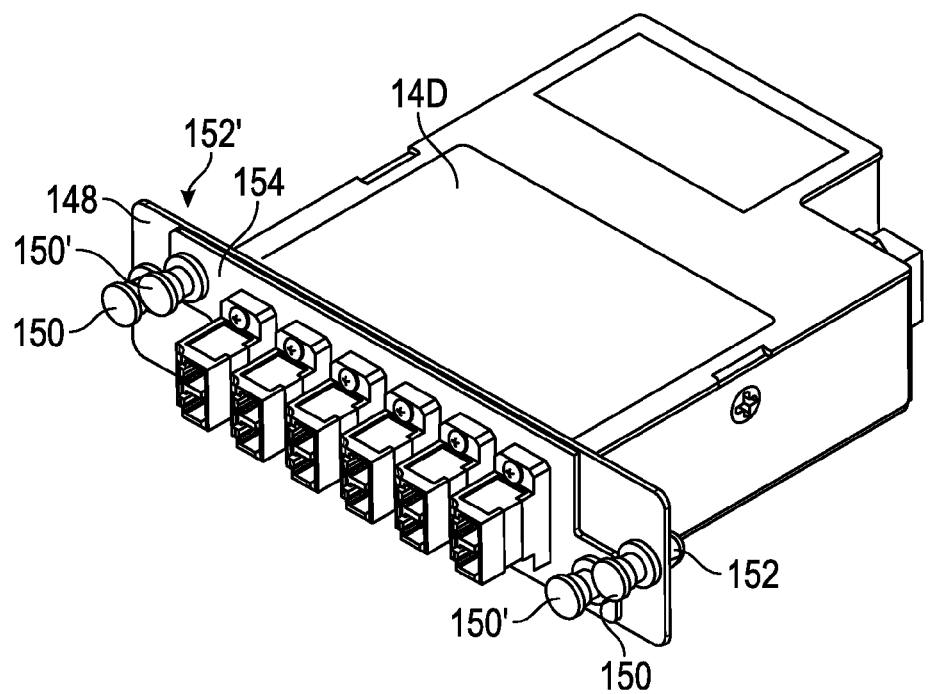
FIG. 25 is a front, perspective view of the bezel member of FIG. 24, after an exemplary connector assembly is mounted to the bezel member.

With reference to bezel member 148, exemplary bezel member 148 includes an aperture or slot 413, with aperture 413 configured and dimensioned to have a connector assembly/connective device 14D mounted with respect thereto (FIG. 25). Similar to bezel member 144, the front face of bezel member 148 includes one or more handle members 150, and the rear face of bezel member 148 includes one or more mounting members 152 for the releasable attachment to mounting holes 142 of panel assembly 112.

In certain embodiments, connector assembly 14D includes a mounting plate 154, with the front face of mounting plate 154 having one or more handle members 150', and the rear face of mounting plate having one or more mounting members 152' for the releasable attachment to mounting holes 142' of bezel member 148. Exemplary connector assembly 14D takes the form of a fiber optic cassette 14D having a plurality of fiber optic ports/adapters (e.g., 12 ports) for mating with fiber optic connectors.

It is noted that panel assembly 112 of media patching system 100 can include any number, combination and/or permutation of bezel members 144, 146 and/or 148, and thus can include any number, combination and/or permutation of connector assemblies/connector devices 14, 14A, 14B, 14C and/or 14D. As such, panel assembly 112 can include connector assemblies 14, 14A, 14B, 14C and/or 14D (alone or in combinations thereof). Thus, panel assembly 112 of media patching system 100 advantageously provides users with the ability to install multiple media connections (e.g., copper-based connections 14, fiber optic connections 14A, 14B, 14C, 14D, combinations thereof, or the like) in the same patching system/enclosure 100. Moreover, panel assembly 112 can advantageously increase patching density of the media patching system 100 while maintaining port accessibility.

Figure 28:
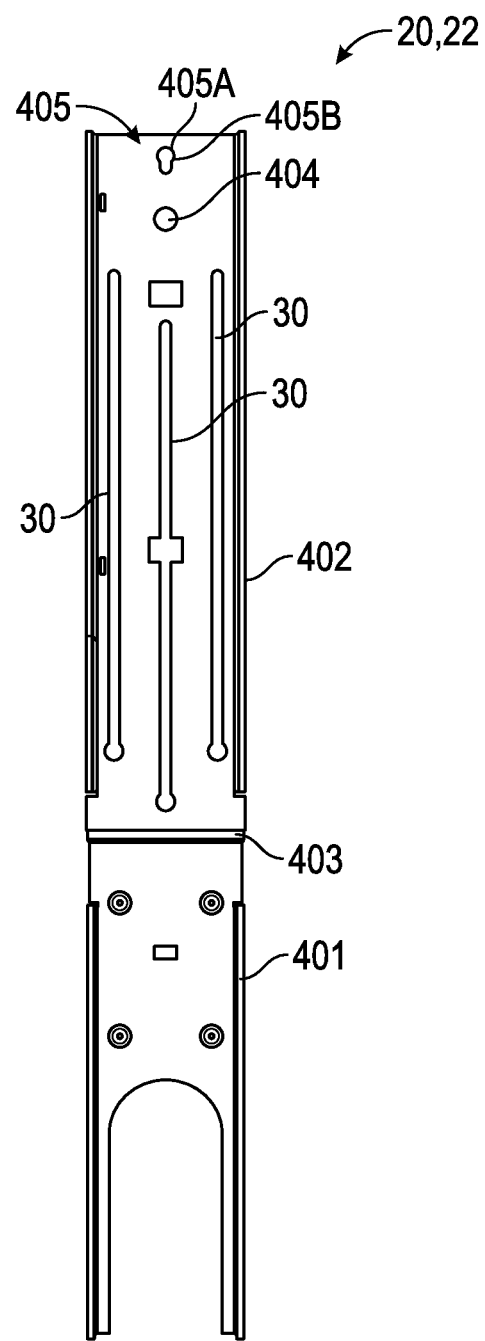
FIG. 28 is a side view of the exemplary frame member of FIG. 9.
Figure 29:
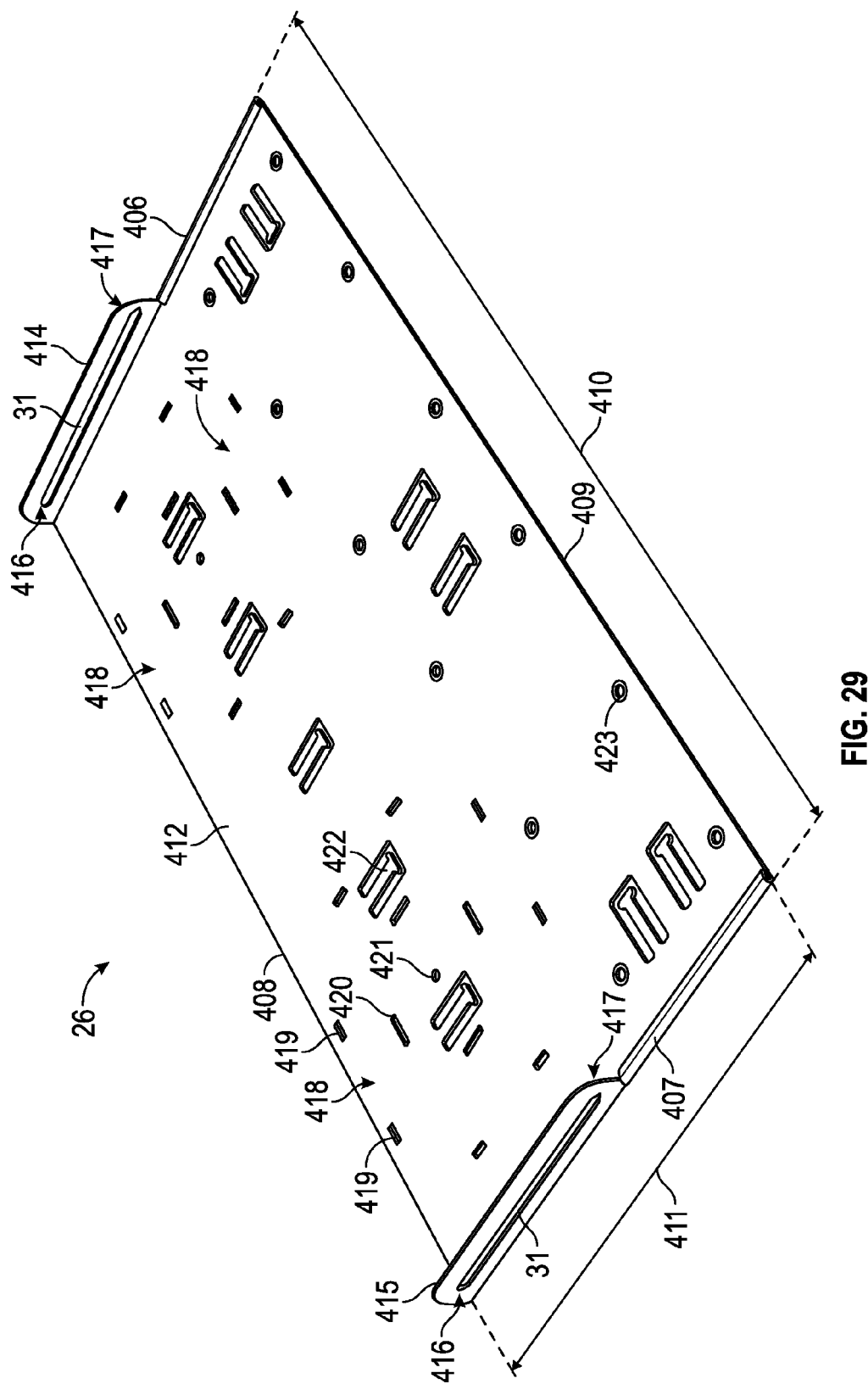
FIG. 29 is a top, perspective view of an exemplary upper cable management plate according to the present disclosure.
Figure 30:
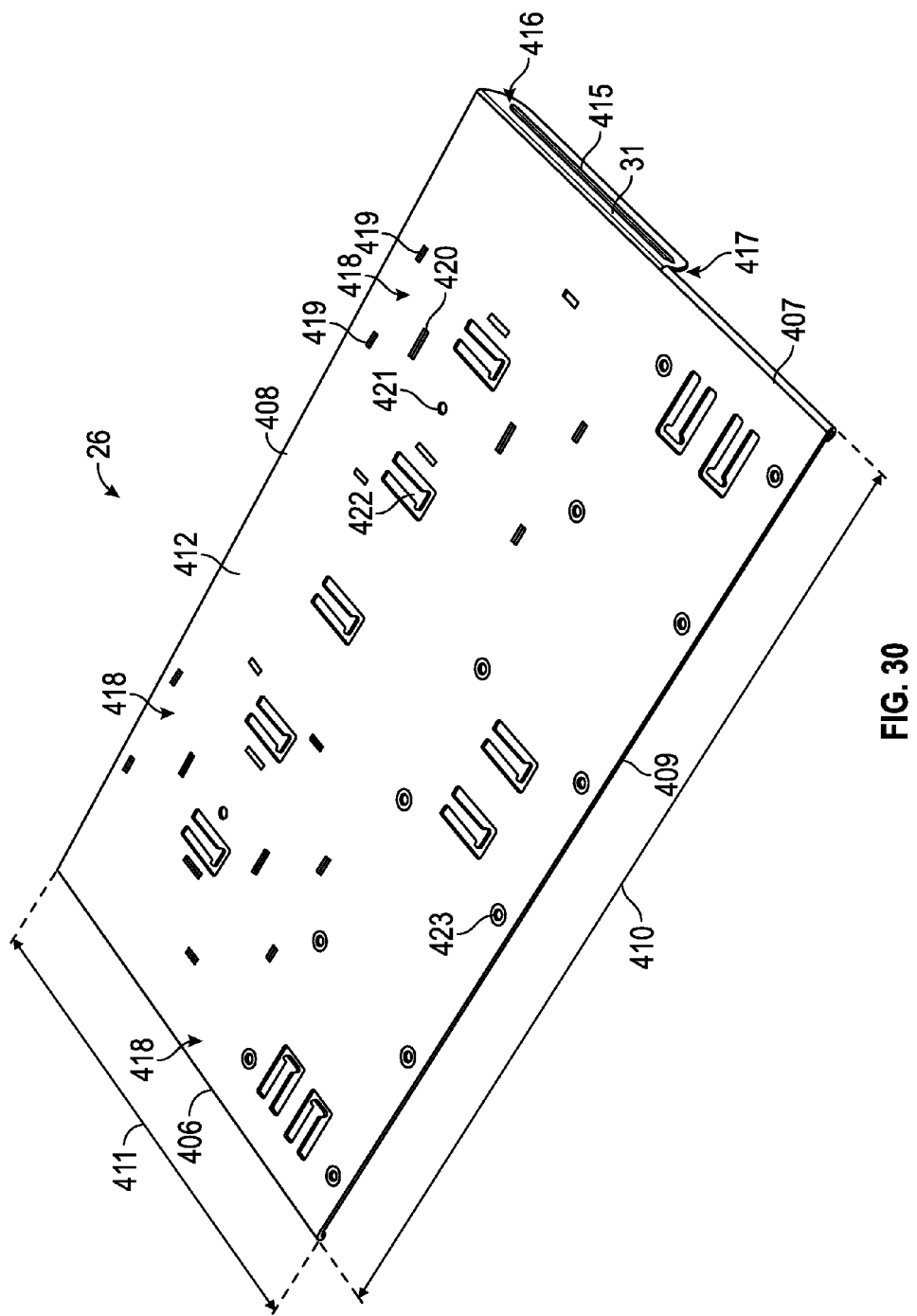
FIG. 30 is a bottom, perspective view of an exemplary upper cable management plate of FIG. 29.
Figure 31:
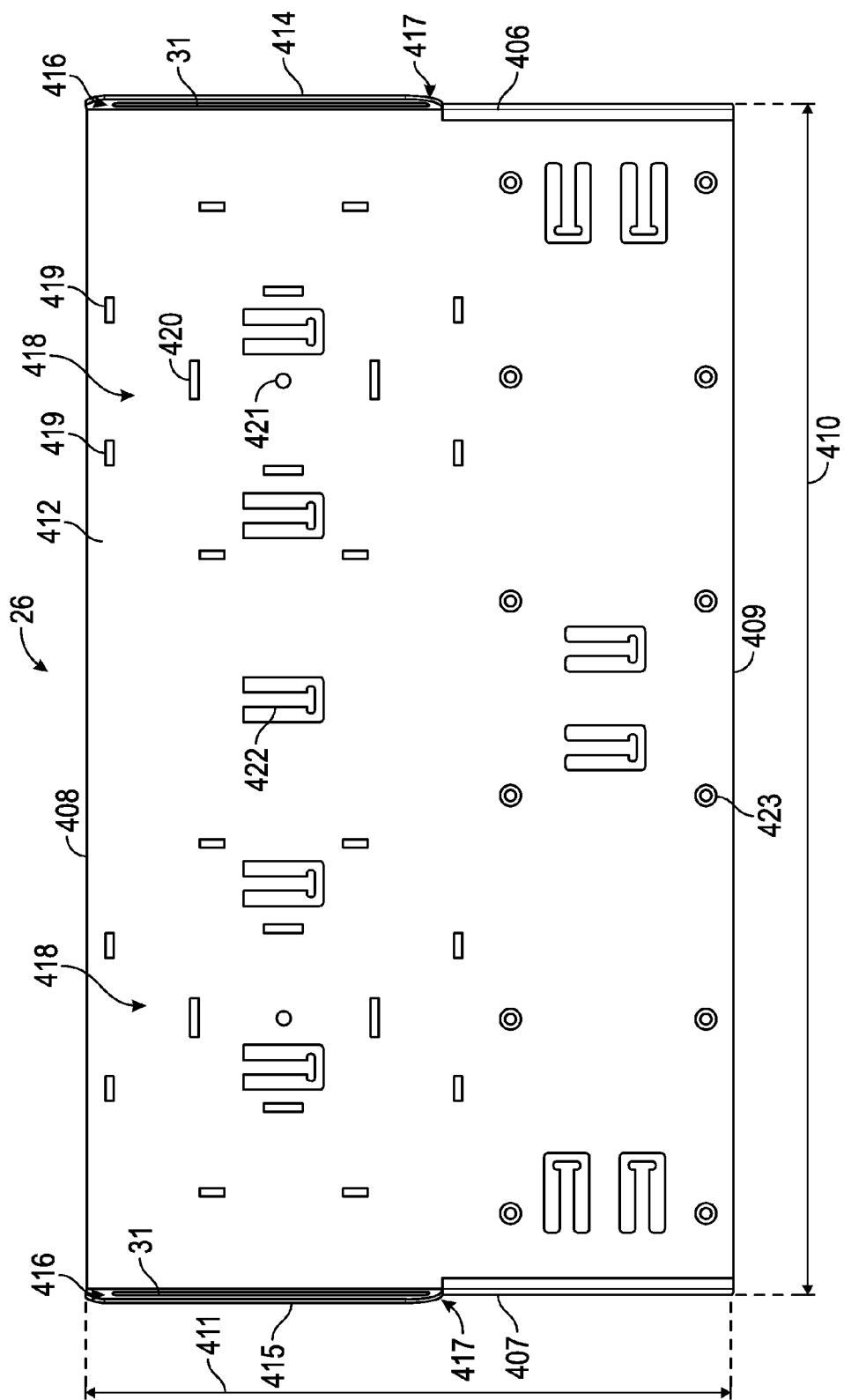
FIG. 31 is a top view of an exemplary upper cable management plate of FIG. 29.
Figure 32:
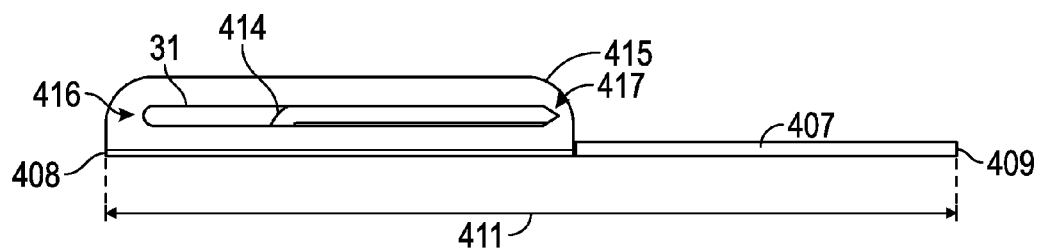
FIG. 32 is a side view of an exemplary upper cable management plate of FIG. 29.

With reference to FIGS. 9 and 28, perspective and side views of exemplary frame member 20, 22 are provided. Frame members 20, 22 can define a substantially z-shaped configuration, including a first longitudinal or horizontal run 401, a second longitudinal or horizontal run 402, and a first lateral or vertical run 403 connecting the first and second horizontal runs 401, 402. In particular, the first and second horizontal runs 401, 402 (e.g., first and second sections) can be offset and parallel relative to each other, and the first vertical run 403 (e.g., a third section) can be perpendicular to and joins the first and second horizontal runs 401, 402. First and second horizontal runs 401, 402 can be substantially parallel relative to each other and define the sides of the media patching system 10. First vertical run 403 can be substantially perpendicular to first and second horizontal runs 401, 402. First vertical run 403 can include two or more apertures 403 formed therein and aligned along the height of the first vertical run 403. As will be discussed in greater detail below, the apertures 403 can be used to fixate the media patching system 10 to a supporting structure, e.g., a rack. Slots 30 can extend along the length defined by second horizontal run 402.

Each of frame members 20, 22 includes a first aperture 404 and a second aperture 405 spaced relative to each other and passing through the second longitudinal run 402. First aperture 404 defines a circular shape. Second aperture 405 includes a large diameter portion 405a and a small diameter portion 405b. As will be discussed in greater detail below, the first and second apertures 404, 405 can be used to detachably secure a bracket 34 (shown in FIG. 34) to the frame members 20, 22.

Turning now to FIGS. 29-32, perspective, top and side views of an exemplary upper cable management plate 26 of a cable management plate assembly are provided. Upper cable management plate 26 can define a substantially rectangular configuration, including first and second side edges 406, 407, a front edge 408, and a rear edge 409. Front and rear edges 408, 409 define a width 410 of upper cable management plate 26 and first and second side edges 406, 406 define a depth 411 of upper cable management plate 26. The width 410 can be dimensioned such that upper cable management plate 26 can be positioned between the first and second frame members 20, 22.

Upper cable management plate 26 includes a substantially planar body portion 412 extending between first and second side edges 406, 407, front edge 408, and rear edge 409. Each of the first and second side edges 406, 407 includes a flange 414, 415 extending therefrom in a direction perpendicular to the plane defined by body portion 412. Body portion 412 can define a cable supporting surface of upper cable management plate 26. Flanges 414, 415 extend a partial distance along depth 411. In particular, flanges 414, 415 extend from front edge 408 to an approximate midpoint of depth 411. In some embodiments, the length of flanges 414, 415 can be varied to change the distance which upper cable management plate 26 can slide and extend from the rear portion of media patching system 10. Although discussed herein with respect to media patching system 10, it should be understood that upper cable management plate 26 can be used in conjunction with a variety of media patching systems or racks.

Each flange 414, 415 includes an elongated slot 31, e.g., a track, formed therein along which upper cable management plate 26 can slide or move relative to first and second frame members 20, 22. Each slot 31 includes a proximal end 416 and a distal end 417. In particular, proximal end 416 can be disposed near front edge 408 and distal end 417 can be disposed near the midpoint of upper cable management plate 26. Proximal end 416 can define a substantially circular or rounded edge of elongated slot 31. Distal end 417 can define an angled, pointed end of elongated slot 31 formed by two converging linear lines.

In some embodiments, body 412 includes one or more groups of slots 418 formed thereon. In particular, groups of slots 418 include two slots 419 which are aligned and parallel to each other, and a slot 420 which is offset from and parallel to slots 419. In some embodiments, four groups of slots 418 can be positioned circumferentially around a central bore 421. As will be discussed in greater detail below, groups of slots 418 can be used to detachably secure one or more spools 28 to body 412.

In some embodiments, body 412 includes one or more tabs 422 formed therein for organizing cables on upper cable management plate 26. Tabs 422 can define T-shaped portions extending parallel to the plane defined by body 412. One or more cables supported by upper cable management plate 26 can be detachably secured to tabs 422 by, e.g., hook loop straps, or the like. Cables can thereby be tightened to and held in place against body 412.

In some embodiments, body 412 includes one or more apertures with a threaded insert 423 positioned therein. Threaded inserts 423 can be used to secure additional cable management or organization components to upper cable management plate 26.

Figure 33:
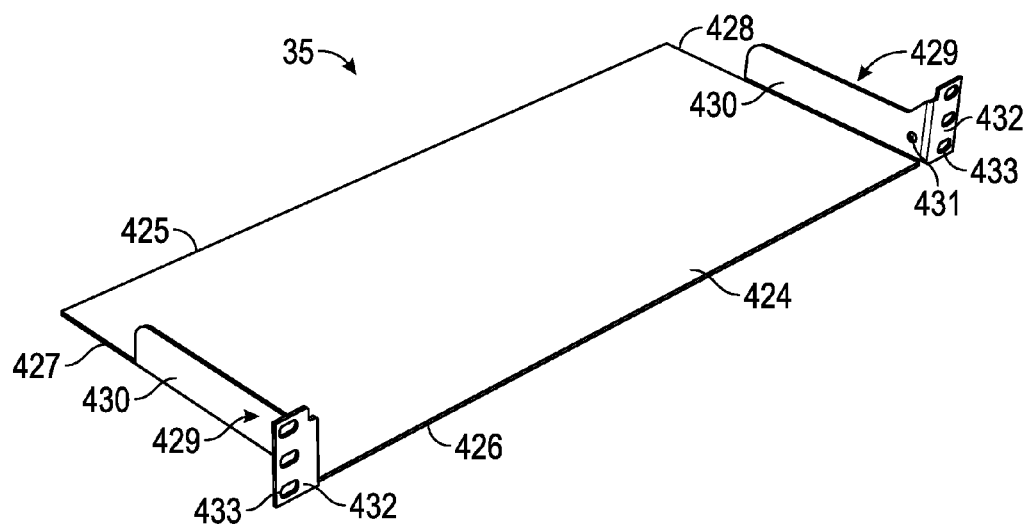
FIG. 33 is a perspective view of an exemplary lower cable management plate according to the present disclosure.

FIG. 33 shows a perspective view of an exemplary lower cable management plate 35 of media patching system 10. Together, upper cable management plate 26 and lower cable management plate 35 interconnect to form a cable management plate assembly. Additionally, components such as spools, can be added to the cable management plate assembly formed by upper cable management plate 26 and lower cable management plate 35. Lower cable management plate 35 includes a planar body 424 with a front edge 425, a rear edge 426, and first and second side edges 427, 428. Each of the first and second side edges 427, 428 includes a flange 429, e.g., an L-shaped flange, extending perpendicularly relative to body 424. Each flange 429 includes a first portion 430 extending parallel to the respective first and/or second side edge 427, 428. In particular, first portion 430 extends a partial distance from rear edge 426 to a point offset from front edge 425. First portion 430 includes an aperture 431 that is involved in the connection of the upper cable management plate 26 to the lower cable management plate 35 in a manner that is explained below. Each flange 429 further includes a second portion 432 extending approximately ninety degrees from first portion 430 and extending parallel to rear edge 426. Second portion 432 extends away from body 424. Second portion 432 can include two or more openings 433 formed therein.

Figure 34:
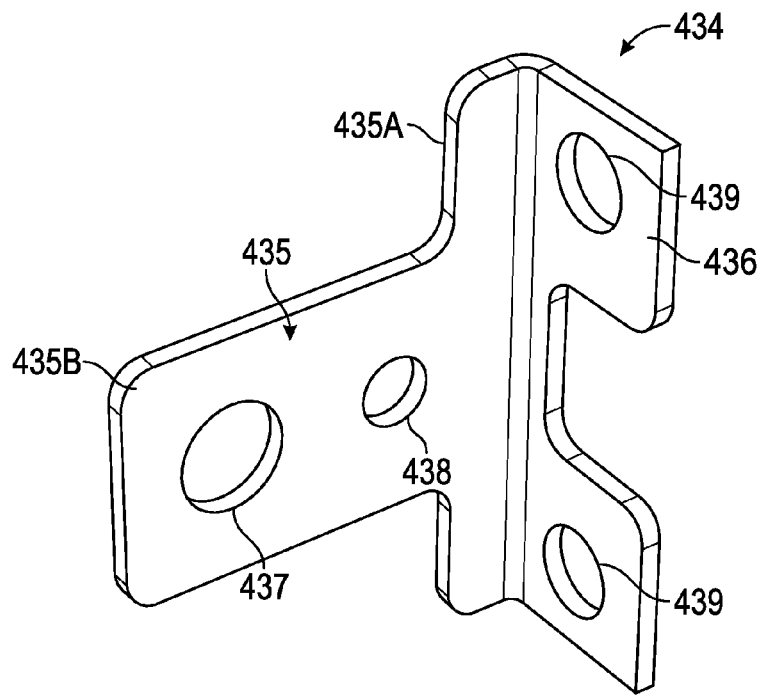
FIG. 34 is a perspective view of an exemplary bracket according to the present disclosure.

FIG. 34 shows a perspective view of an exemplary bracket 434. As discussed below, bracket 434 assists in interlocking lower cable management plate 35 to first and second frame members 20, 22. Bracket 434 can define a substantially L-shaped configuration including a first portion 435 and a second portion 436 extending at approximately ninety degrees relative to each other. First portion 435 includes an inner surface 435a and an outer surface 435b. First portion 435 includes two apertures 437, 438, e.g., circular openings, formed therein which are complementary to respective first and second apertures 404, 405 of first and second frame members 20, 22. Second portion 436 includes two separated extensions, each including an aperture 439 complementary to an opening 433 formed in second portion 432 of lower cable management plate 35.

Figure 35:
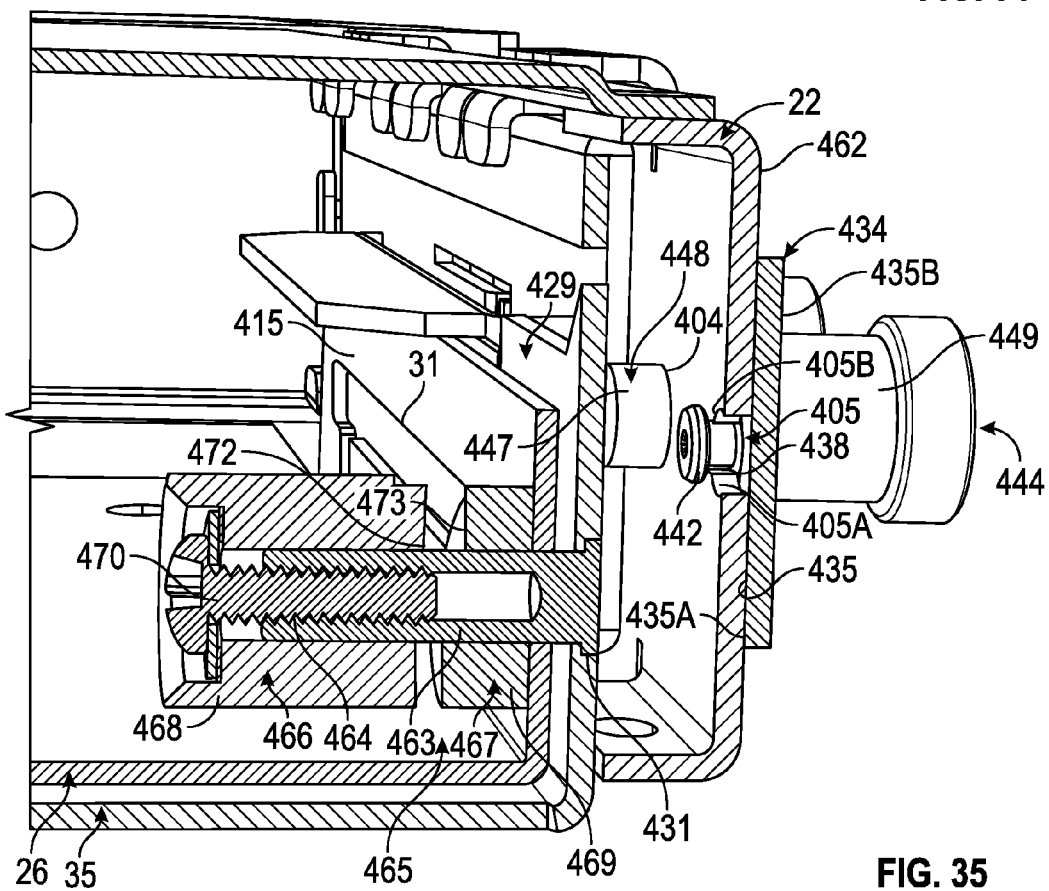
FIG. 35 is a cross-sectional view of a partial assembly of an exemplary media patching system of FIG. 1, including first and second frame members, lower cable management plate, upper cable management plate, and a bracket.

FIG. 35 is a perspective cut away view that shows the bracket 434 connected to a frame member 22. It should be understood that a bracket 434 can be connected to frame member 20 in a substantially similar manner. A pem 442 can be compression fit into opening 438 in bracket 434 such that the pem 442 extends from the inner surface 435a of the first portion 435 of the bracket 434 and passes through opening 405 in the frame member 20. In particular, the pem 442 can pass freely through the large diameter opening 405a and can be configured to prevent passage of the pem 442 through the small diameter opening 405b. A spring-loaded pin assembly 444 can also be mated with the bracket 434. The spring-loaded pin assembly 444 includes a housing 449 that can be compression fit into opening 437 of the bracket 434 such that the spring-loaded pin assembly 444 extends from the outer surface 435b of the first portion 435 of the bracket 434. An end portion 447 of a pin body 448 disposed within the pin housing 449 can extend from the inner surface 435a of the first portion 435 of the bracket 434 and passes through opening 404 in the frame member 20.

Figure 36:
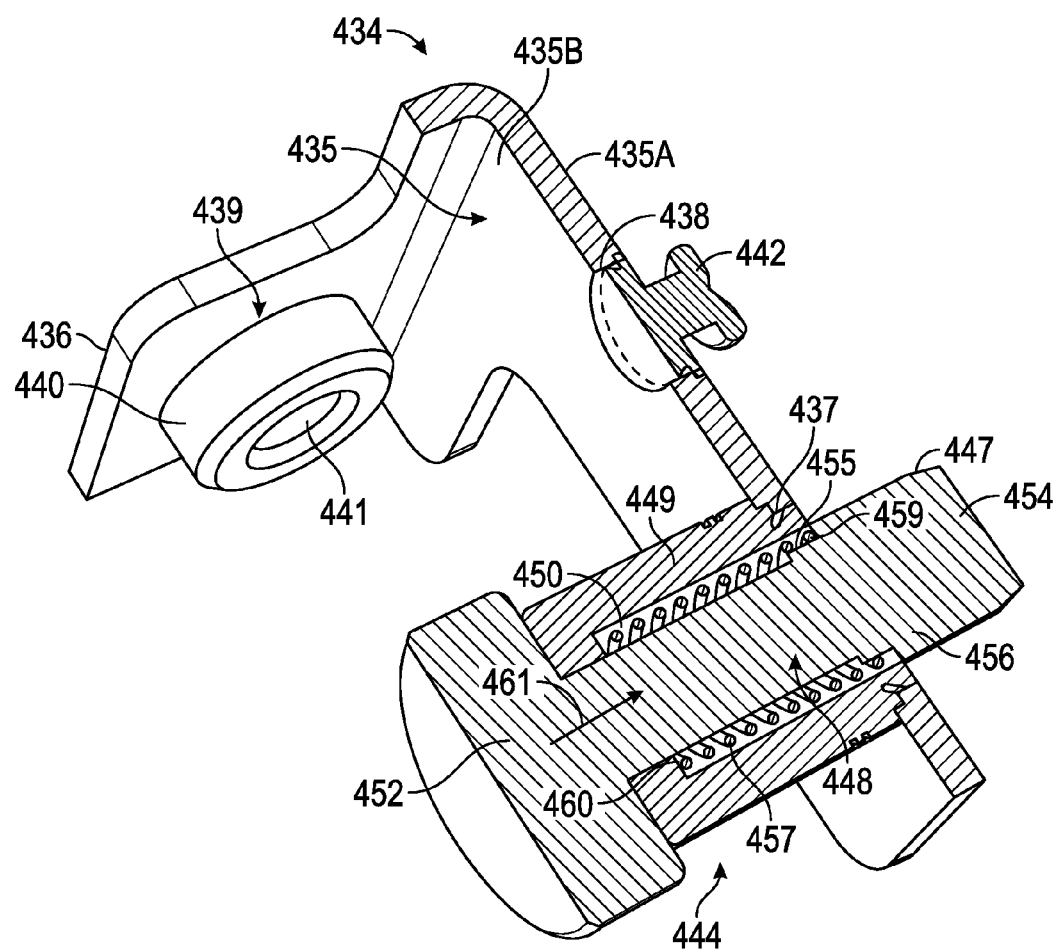
FIG. 36 is a cross-sectional view of a partial assembly of an exemplary media patching system of FIG. 1, including a bracket and a spring-loaded pin assembly.

FIG. 36 is a cross-sectional view of spring-loaded pin assembly 444 mated with bracket 434. The spring-loaded pin assembly 444 includes a pin body 448 that can translate inside a cavity or opening 450 formed in the pin housing 449. The pin body 448 includes a head 452 on one end that is always disposed outside of the housing 449, a small diameter region 456 extending from the head 452 and through the opening 450 in the housing 449, and a large diameter region 454 disposed at an opposing end of the small diameter region 456 relative to the head 452. In some embodiments, the pin body 448 can include an intermediate diameter region 455 disposed between the small diameter region 456 and the large diameter region 454. The transition from the small diameter region 454, the intermediate diameter region 455, and the large diameter region 454 can be formed in a stepped manner. A spring 457 can be disposed within the opening 450 and around the pin body 448. In particular, the spring 457 can be disposed between a face 459 of the large diameter region 454 of the pin body 448 and a face 460 of housing 449, thereby biasing the head 452 of the pin body 448 towards the housing 449 in the direction indicated by arrow 461.

In some embodiments, an internally threaded member 440 can be detachably mated with the bracket 434. In particular, the internally threaded member 440 can be compression fit into the aperture 439 of the bracket 434 such that the member 440 can extend from the second portion 436 adjacent to the outer surface 435b of the first portion 435 of the bracket 434. The threaded internal aperture 441 of the member 440 can be aligned with the aperture 439. Thus, rather than manipulating a nut to ensure alignment of the nut with a fastening member when connecting the bracket 434 to the lower cable management plate 35, the internally threaded member 440 can remain attached to the bracket 434 to continuously provide a fastening portion in the bracket 434 that is aligned and ready to receive a fastening member. The internally threaded member 440 therefore improves efficiency in assembling the bracket 434 and the lower cable management plate 35.

With reference to FIGS. 35-41, the bracket 434 can be connected to frame member 22 as follows. The bracket 434 can be positioned on the outer surface 462 of the frame member 22 such that the pem 442 extending from the inner surface 435a of the first portion 435 of the bracket 434 passes through the large diameter portion 405a of the opening 405 in the frame member 22, e.g., a first position of the bracket 434. In the first position, the pin body 448 of the spring-loaded pin assembly 444 is not aligned with the opening 404 of the frame member 22, and therefore cannot yet pass through the opening 404 of the frame member 22. The bracket 434 can be slid backward such that the pem 442 moves or slides into the small diameter portion 405b of the opening 405 in the frame member 22, e.g., a second position of the bracket 434. When the bracket 434 is in the second position, the pin body 448 is aligned with the opening 404 and passes through the opening 404 due to the force of the spring 457 inside pin assembly 444. In particular, the spring 457 biasing the pin body 448 forces a portion of the large diameter region 454 into the opening 404 to interlock the bracket 434 with the frame member 22. The spring-loaded pin assembly 444 therefore acts as a quick release mechanism for connecting and disconnecting the bracket 434 from the frame members 20, 22.

Figure 38:
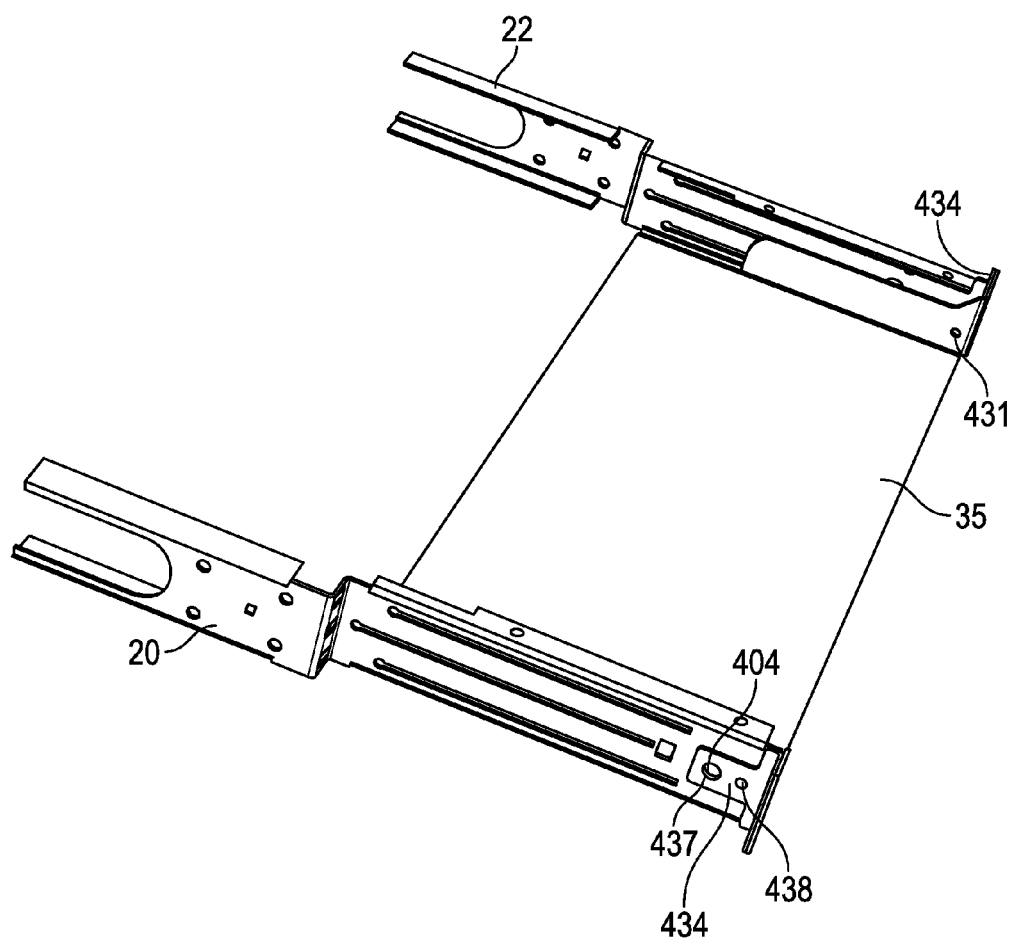
FIG. 38 is a perspective view of a partial assembly of an exemplary medial patching system of FIG. 1, including first and second frame members, lower cable management plate, and brackets.
Figure 39:
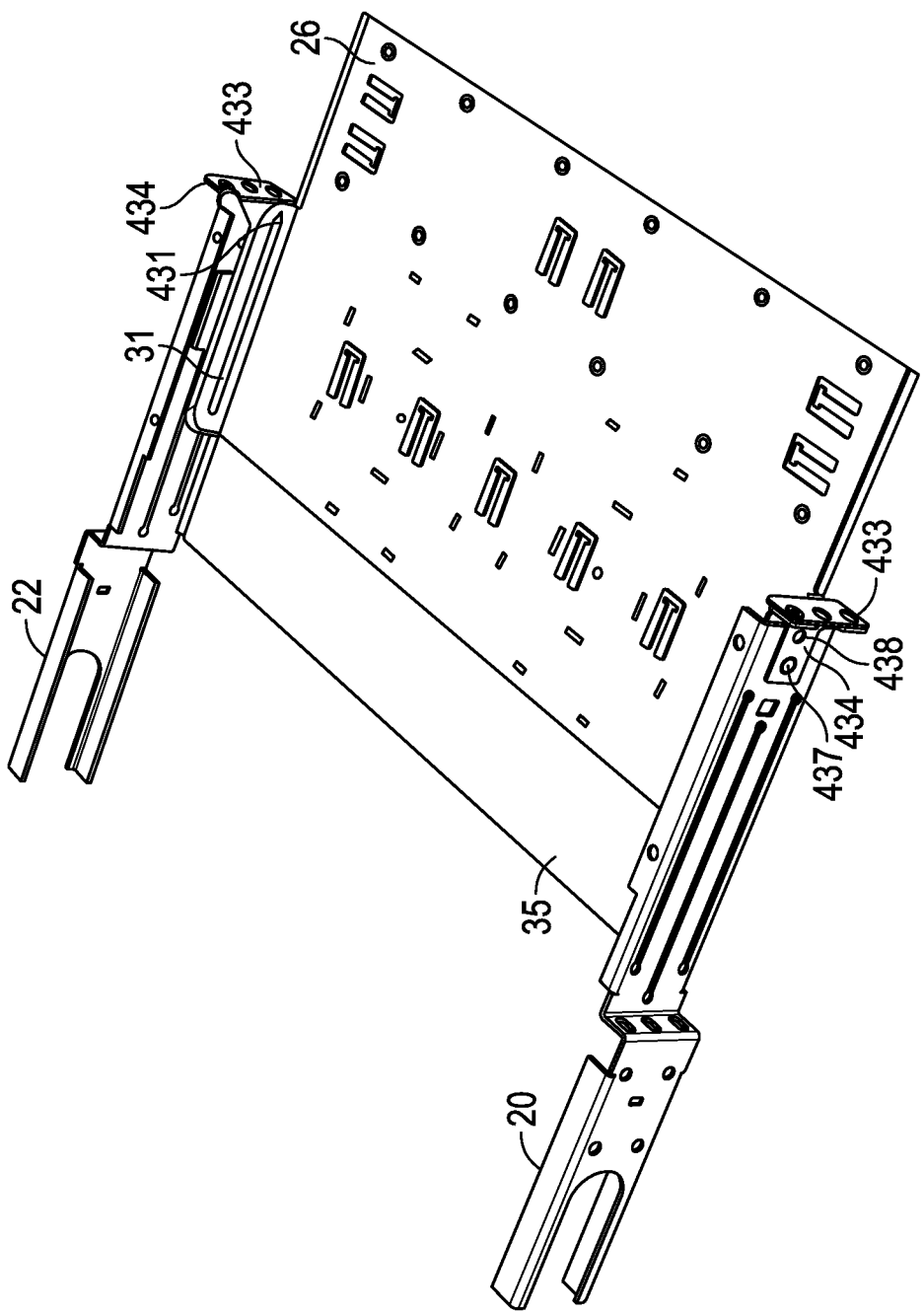
FIG. 39 is a perspective view of a partial assembly of an exemplary medial patching system of FIG. 1, including first and second frame members, lower cable management plate, brackets, and upper cable management plate.
Figure 40:
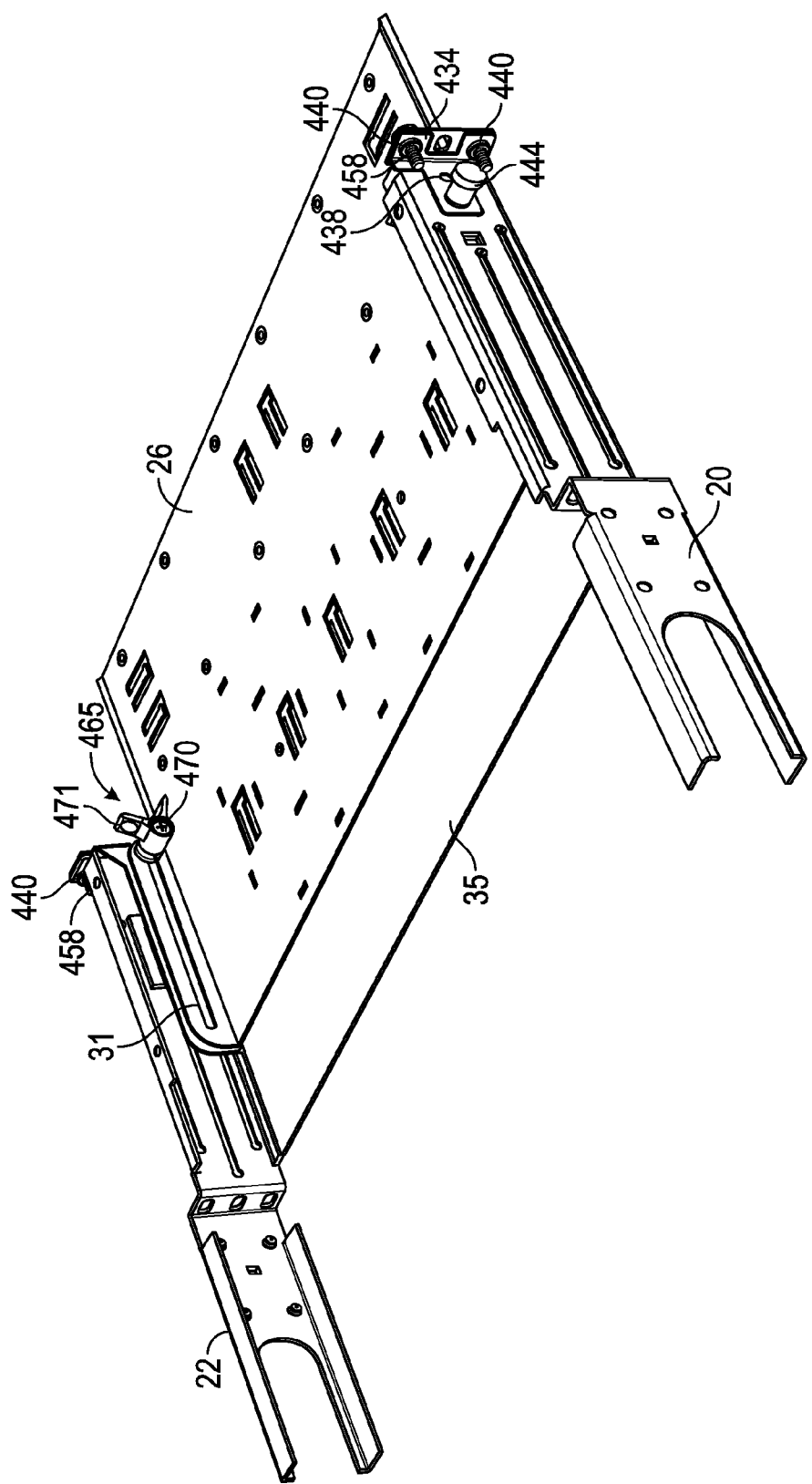
FIG. 40 is a perspective view of a partial assembly of an exemplary media patching system of FIG. 1, including first and second frame members, lower cable management plate, brackets, upper cable management plate, and spring-loaded pin assemblies.
Figure 41:
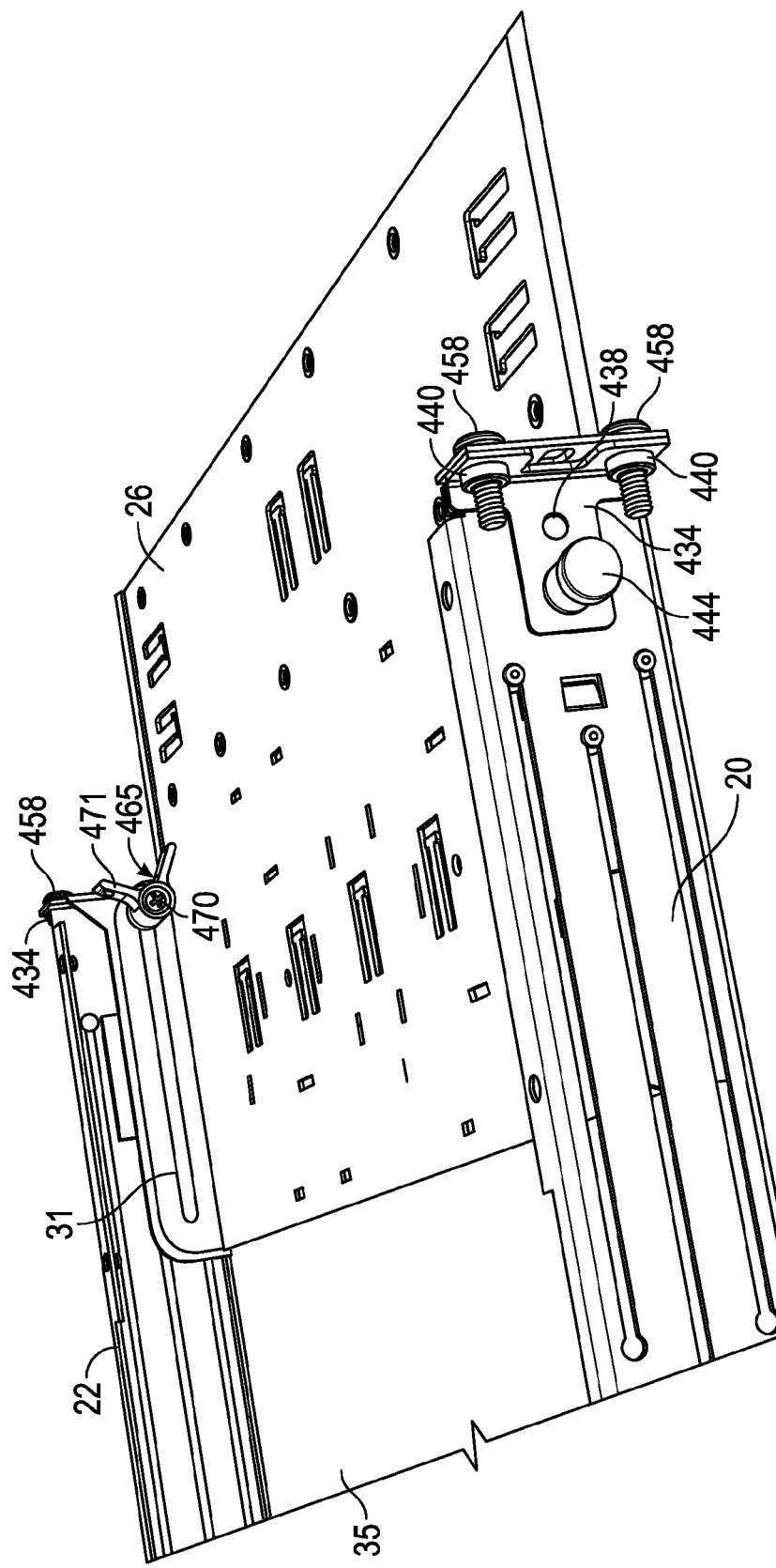
FIG. 41 is a detailed, perspective view of a partial assembly of an exemplary media patching system of FIG. 1, including first and second frame members, lower cable management plate, brackets, upper cable management plate, and spring-loaded pin assemblies.

Once the bracket 434 has been connected to each frame member 20, 22, lower cable management plate 35 can be detachably fixed to the frame members 20, 22 by positioning flanges 429 of lower cable management plate 35 against the bracket 434 such that openings 433 of the lower cable management plate 35 and apertures 439 of bracket 434 are aligned (see FIGS. 38 and 39). When the openings 433 and apertures 439 are aligned, panel mounting screws 458 can be passed through the openings 433 and apertures 439 and screwed into internally threaded pieces 440 to secure the lower cable management plate 35 to brackets 434 and, thereby, to the first and second frame members 20, 22 (see FIGS. 40 and 41).

FIG. 35 further shows a detailed view of how the upper cable management plate 26 is mounted to the lower cable management plate 35 such that the upper cable management plate 26 can slide relative to the lower cable management plate 35. In particular, one end of a pem 463 can be compression fit into opening 431. The pem 463 thereby extends inward from the flange 429 of the lower cable management plate 35 and passes through slot 31 in flange 415 of the upper cable management plate 26. The pem 463 includes an internally threaded bore 464 extending therein. A thumb latch 465, e.g., a fastening member, including a first cylindrical portion 466 with a first cam portion 468 and a second cylindrical portion 467 with a second cam portion 469, e.g., a cam lock mechanism, is mounted to the outer surface of the pem 463.

The second cylindrical portion 467 can be rotationally fixed to the pem 463. The first cylindrical portion 466 can be attached to the pem 463 with a screw 470. The screw 470 includes threads complementary to the threads of the pem 463 such that the screw 470 can mate with the internally threaded bore 464. The second cylindrical portion 467 can rotate about pem 463 and can be manipulated to rotate in either direction with fingers 471 (see FIGS. 40 and 41). When the first cylindrical portion 466 of the thumb latch 465 is disposed in a release position or configuration, the upper cable management plate 26 can slide relative to the lower cable management plate 35 with pem 463 riding or sliding within slot 431. In particular, in the release position or configuration, a first cam surface 472 of the first cam portion 468 can be disposed in a spaced relation relative to the second cam surface 473 of the second cam portion 469 along the pem 463.

When the first cylindrical portion 466 of the thumb latch 465 is rotated into a locking position or configuration, the first cam surface 472 can interact with the second cam surface 473 to push the second cylindrical portion 467 towards the inner surface of flange 415 of the upper cable management plate 26. In particular, the first cylindrical portion 466 can be rotated along the pem 463 to rotate the screw 470 deeper into the internally treaded bore 464 of the pem 463. The first cam surface 472 can thereby press against the second cam surface 473 to push the second cylindrical portion 467 against the inner surface of flange 415 of the upper cable management plate 26.

The friction force created between the second cylindrical portion 467 and the flange 415 of the upper cable management plate 26 fixates or secures the upper cable management plate 26 to the lower cable management plate 35 such that the upper cable management plate 26 cannot translate relative to the lower cable management plate 35. In particular, the pressure of the second cylindrical portion 467 against the flange 415 prevents the pem 463 from sliding within the slot 31 of the flange 415. To release and move the upper cable management plate 26 relative to the lower cable management plate 35, the first cylindrical portion 466 can be rotated away from the second cylindrical portion 467 to release and allow sliding of the pem 463 within the slot 31 of the flange 415.

Figure 37:
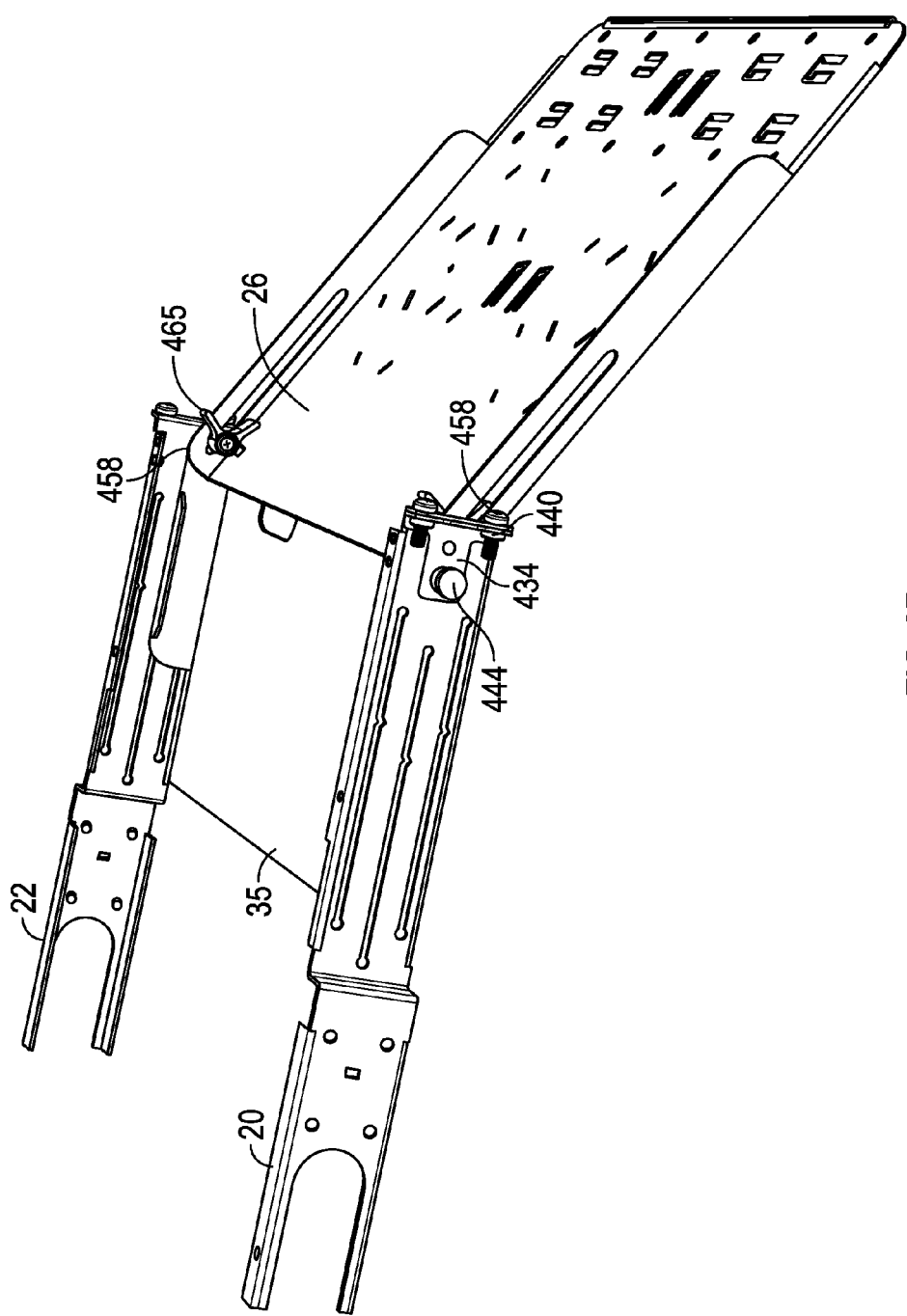
FIG. 37 is a perspective view of a partial assembly of an exemplary media patching system of FIG. 1, including first and second frame members, lower cable management plate, brackets, and upper cable management plate pivoted relative to lower cable management plate.

Thus, rather than removing the entire media patching system 10 from the rack 350, to access cables supported by upper cable management plate 26, upper cable management plate 26 can slide out from the rear of media patching system 10 (see FIG. 37). Upon at least partially extending upper cable management plate 26 from the rear of media patching system 10 along slots 31, pems 463 can act as hinges to at least partially allow upper cable management plate 26 to rotate or pivot relative to media patching system 10. In particular, the upper cable management plate 26 can slide along the pems 463 between the proximal end 416 and the distal end 417 of the slots 31 (see FIG. 32). At the proximal end 416 position, the upper cable management plate 26 can be positioned in a fully extended position relative to the lower cable management plate 35, and the rounded configuration of the proximal end 416 of the slot 31 allows variation in the pivot angle of the upper cable management plate 26 relative to the lower cable management plate 35. At the distal end 417 position, the upper cable management plate 26 can be positioned in a fully retracted position relative to the lower cable management plate 35. The upper cable management plate 26 can therefore pivot relative to first and second frame members 20, 22 and lower cable management plate 35 as is shown in FIG. 37. For example, upper cable management plate 26 can pivot in a downward direction relative to a plane defined by or parallel to first and second frame members 20, 22, lower cable management plate 35, or both. Greater access can thereby be provided to cables stored or organized on upper cable management plate 26.

Figure 42:
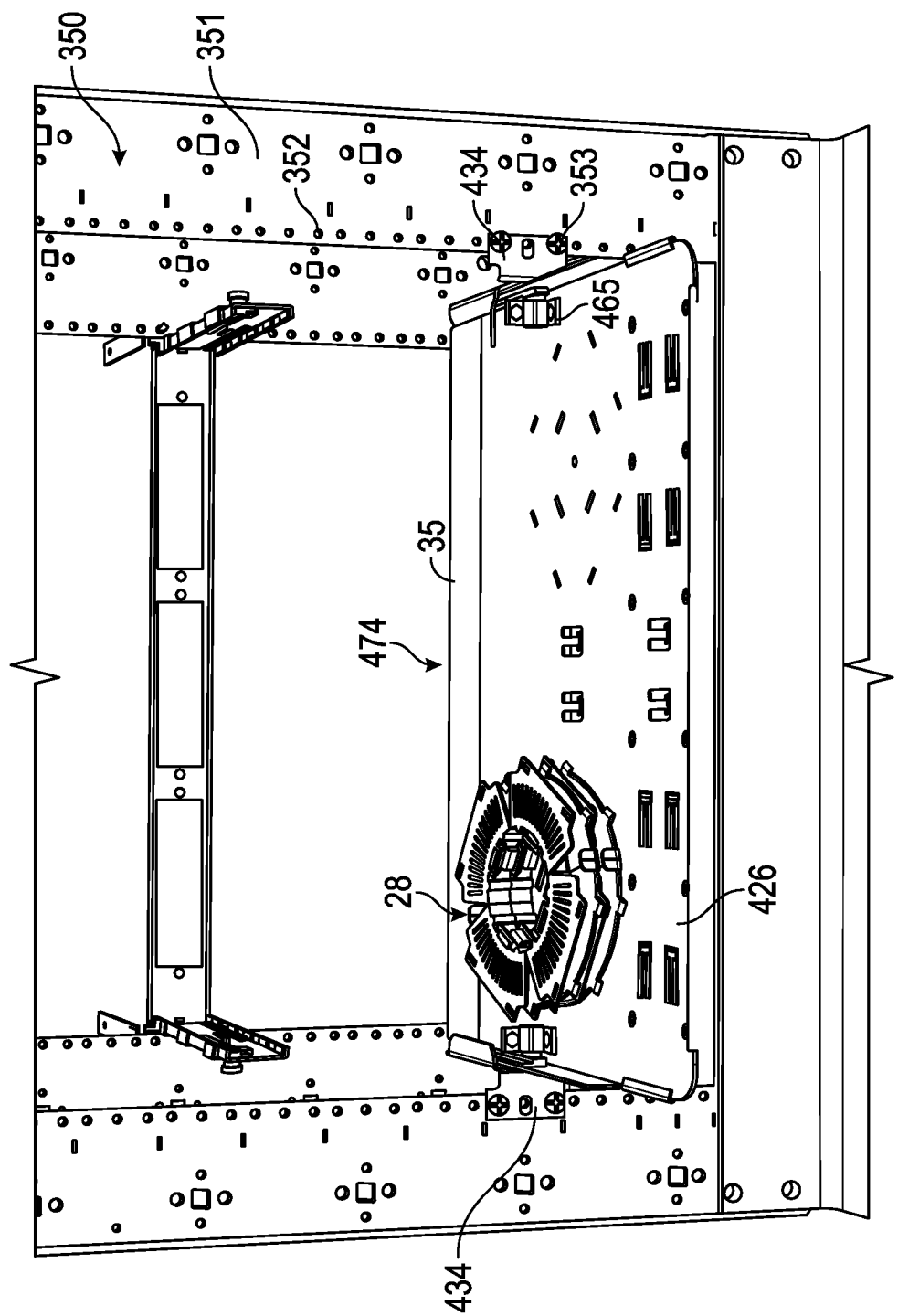
FIG. 42 is a rear, perspective view of a cable management plate assembly including lower cable management plate and upper cable management plate secured directly to a rack without first and second frame members.

Cable management plate assembly 474 includes the assembly of upper cable management plate 26 and lower cable management plate 35. In some embodiments, the cable management plate assembly 474 need not be connected to frame members 20, 22. Rather, as shown in FIG. 42, the cable management plate assembly 474 provides versatility in that the cable management plate assembly 474 can be connected directly to the back portions 351 of the uprights of the rack 350. In the configuration shown in FIG. 42, openings 433 in second portion 432 in flanges 429 of lower cable management plate 35 are not aligned with apertures 439 in bracket 434. Instead, openings 433 can be aligned with openings 352 formed in the back portions 351 of the uprights of rack 350 and panel mounting screws 353 can pass through the openings 433 and the corresponding openings 352 in the back portions 351 of the uprights of rack 350 to secure the cable management plate assembly 474 to the rack 350. The upper cable management plate 26 can be secured to the lower cable management plate 35 as describe above and can slide and pivot relative to the lower cable management plate 35 when the thumb latches 465 are disposed in the release position. Thus, the cable management plate assembly 474 can advantageously be located further back in the rack 350 when cable management in that location is needed or desired, and can be secured to the rack 350 independently of a media patching system 10.

Figure 43:
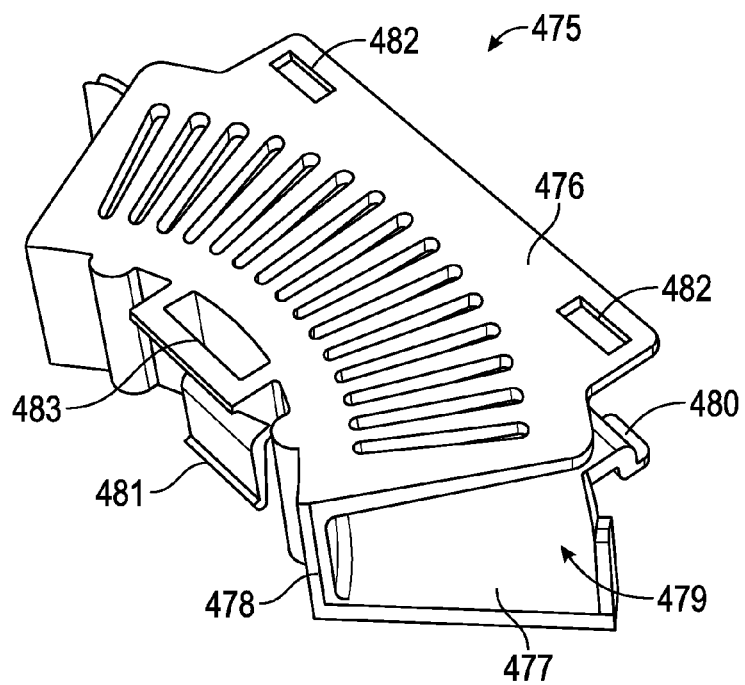
FIG. 43 is a top, perspective view of an exemplary quarter spool according to the present disclosure.
Figure 44:
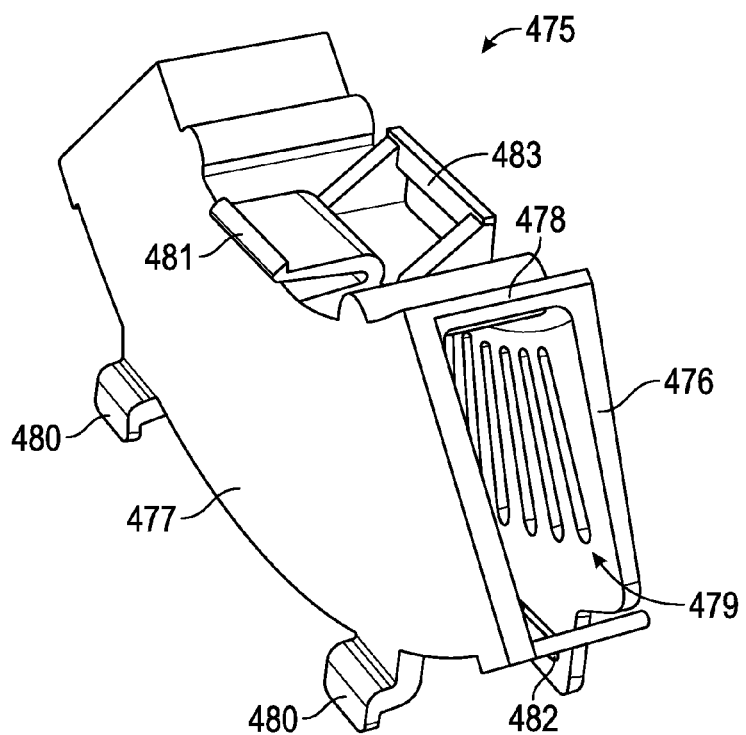
FIG. 44 is a bottom, perspective view of the exemplary quarter spool of FIG. 39.

FIGS. 43 and 44 show perspective views of an exemplary quarter spool 475. Quarter spool 475 includes a top surface 476 and a bottom surface 477 separated by an inner wall 478. Inner wall 478 connects top and bottom surfaces 476, 477 relative to each other and forms a cavity 479 between top and bottom surfaces 476, 477. Bottom surface 477 includes two S-shaped flanges 480 extending from an outer edge of quarter spool 475, and further includes a single U-shaped flange 481 on an opposing inner edge of quarter spool 475.

Flanges 480, 481 can be configured and dimensioned complementary to slots 419, 420 of upper cable management plate 26. In particular, flanges 480 can be complementary to slots 419 and flange 481 can be complementary to slot 420 such that quarter spools 475 can be mounted onto upper cable management plate 26. During assembly, flanges 480 can be inserted into slots 419 such that a portion of flanges 480 passes through slots 419. Flange 481 can be depressed and inserted into slot 420 to detachably lock quarter spool 475 to upper cable management plate 26. For example, upon release of flange 481, flange 481 can spring or snap outward within slot 420 and interlock the quarter spool 475 relative to upper cable management plate 26. One or more cables can be passed through cavity 479 and wrapped around quarter spool 475 to organize the cables on upper cable management plate 26.

Figure 45:
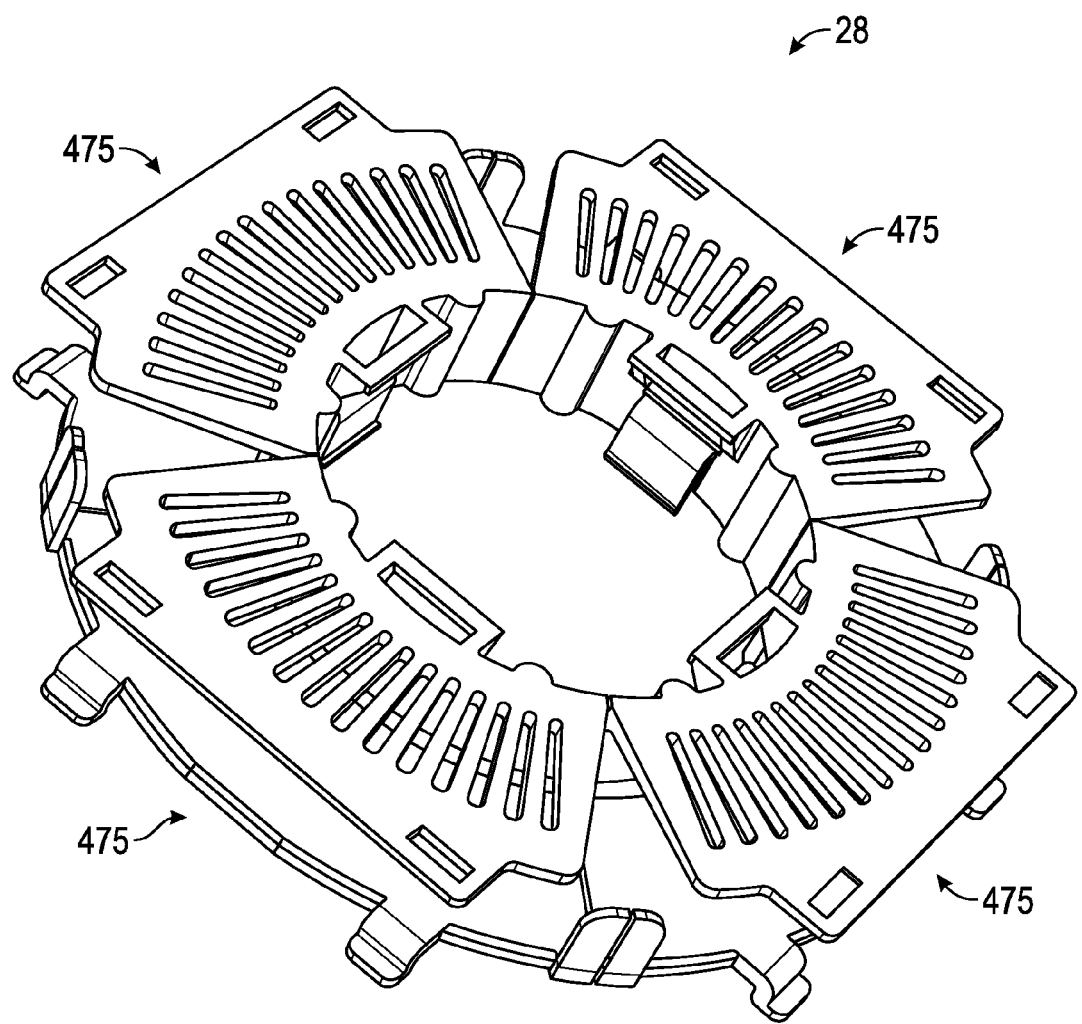
FIG. 45 is a perspective view of an exemplary spool assembly including four quarter spools.
Figure 46:
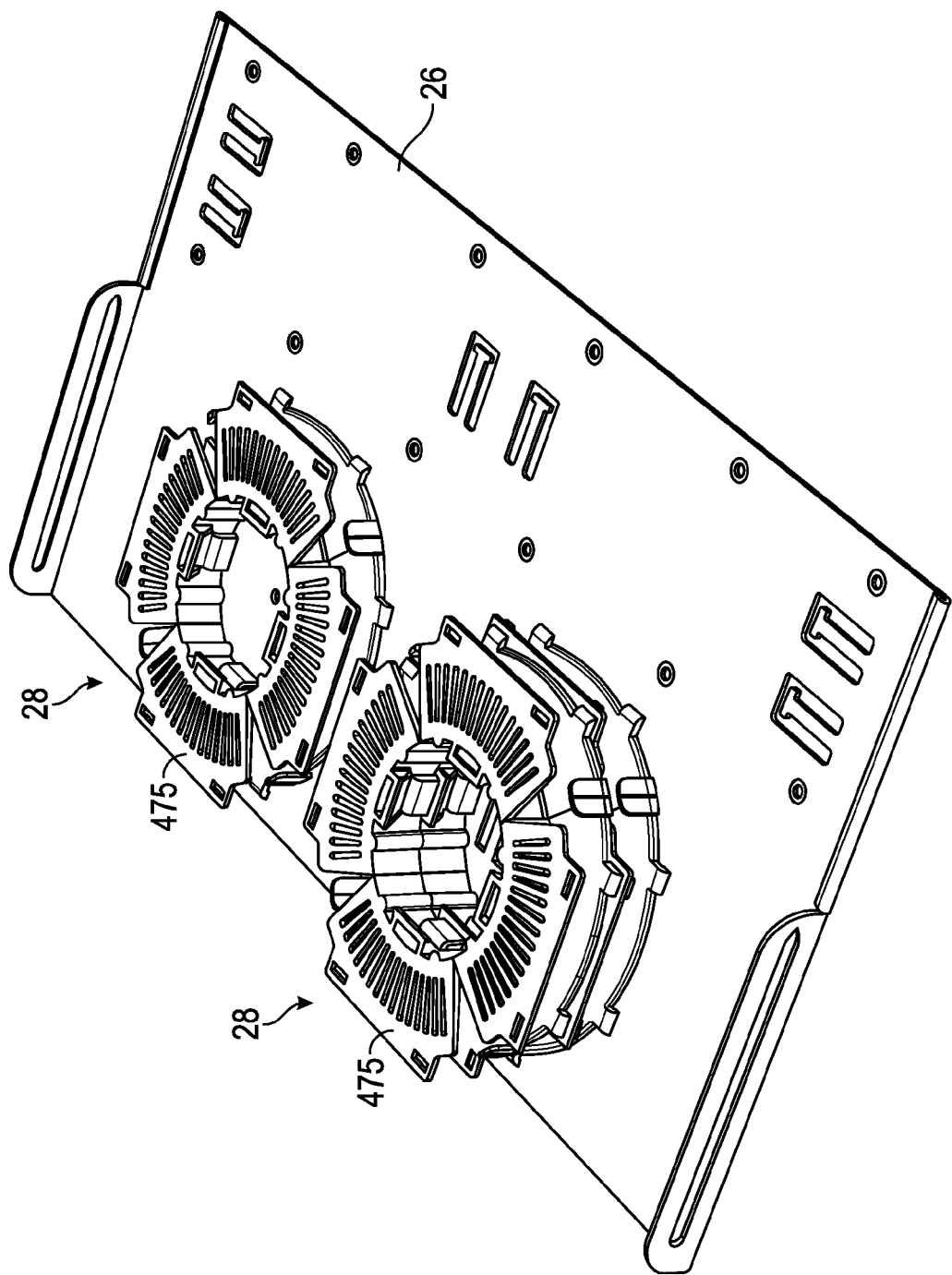
FIG. 46 is a perspective view of the exemplary spool assembly of FIG. 41 secured to upper cable management plate.

In some embodiments, quarter spool 475 can define an approximately ninety degree portion or circumference of a full spool 28. As shown in FIGS. 45 and 46, four quarter spools 475 can be individually interlocked relative to upper cable management plate 26 such that spools 28 are formed. Inner walls 478 of quarter spools 475 can mate to form a complete circumference around which cables can be wrapped.

In some embodiments, as shown in FIGS. 43, 44 and 46, top surface 476 of quarter spool 475 can include two slots 482 near the outer edge of quarter spool 475, and further includes a single slot 483 extending from the inner edge of quarter spool 475. It should be understood that slots 482 can be complementary to flanges 480 and slot 483 can be complementary to flange 481. Quarter spools 475 can thereby be stacked relative to each other to provide additional space onto which cables can be organized.

Figure 47:
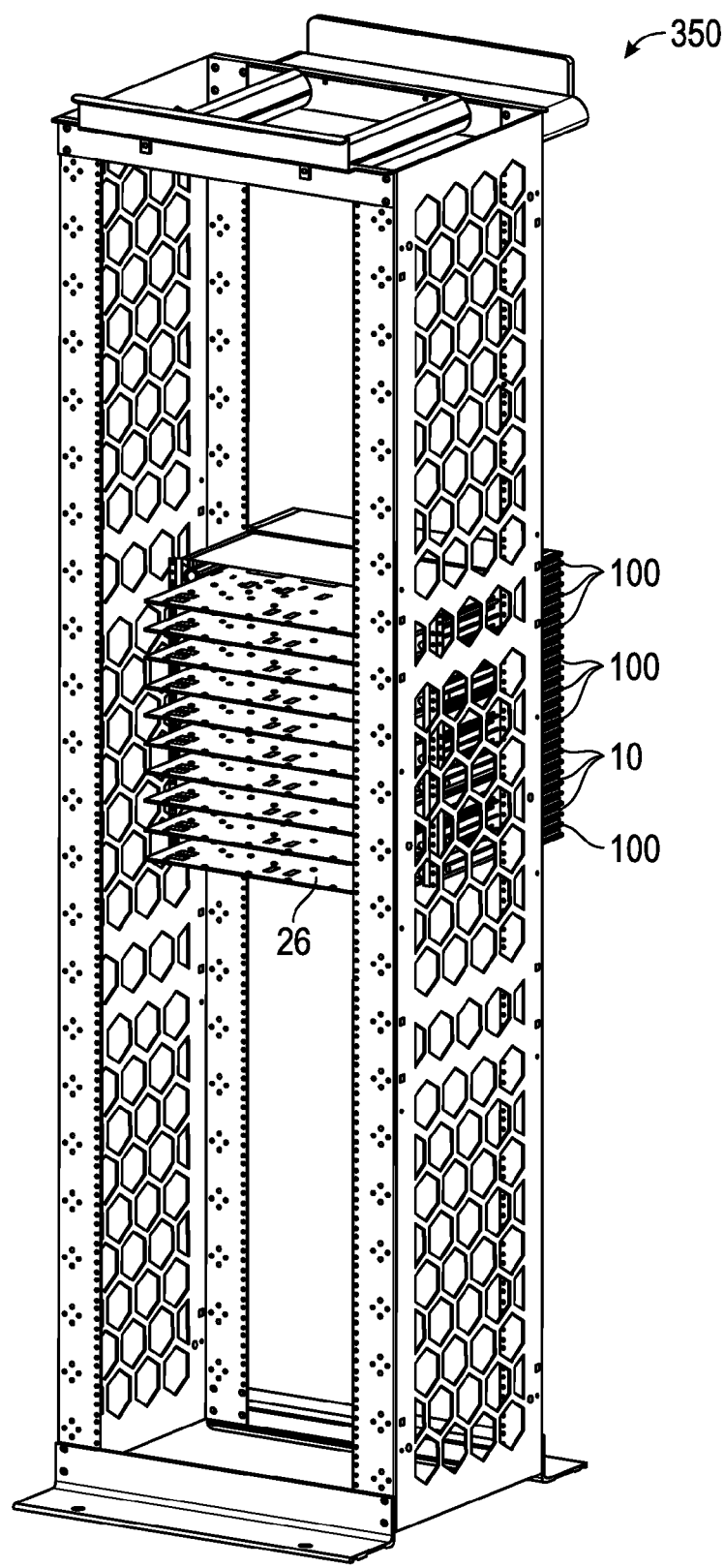
FIG. 47 is a rear, perspective view of exemplary media patching systems mounted with respect to a supporting structure in a horizontal orientation.

With reference to FIGS. 27 and 47, front and rear perspective views of media patching systems 10, 100 stacked and secured to a supporting structure, e.g., a rack 350, are provided. Stacking the systems 10, 100 relative to each other allows for customization of the patching panel space in which the cables are stored. Although illustrated as including the upper cable management plate 26 associated with each system 10, 100, in some embodiments, one or more upper cable management plates 26 can be removed to create a greater space for cable management. For example, one upper cable management plate 26 can be used for cables extending from two or more systems 10, 100 such that sufficient space is provided for movement and interlocking of cables with the respective equipment. It should be understood that one or more door assemblies 36 can be included with the systems 10, 100.

Figure 48:
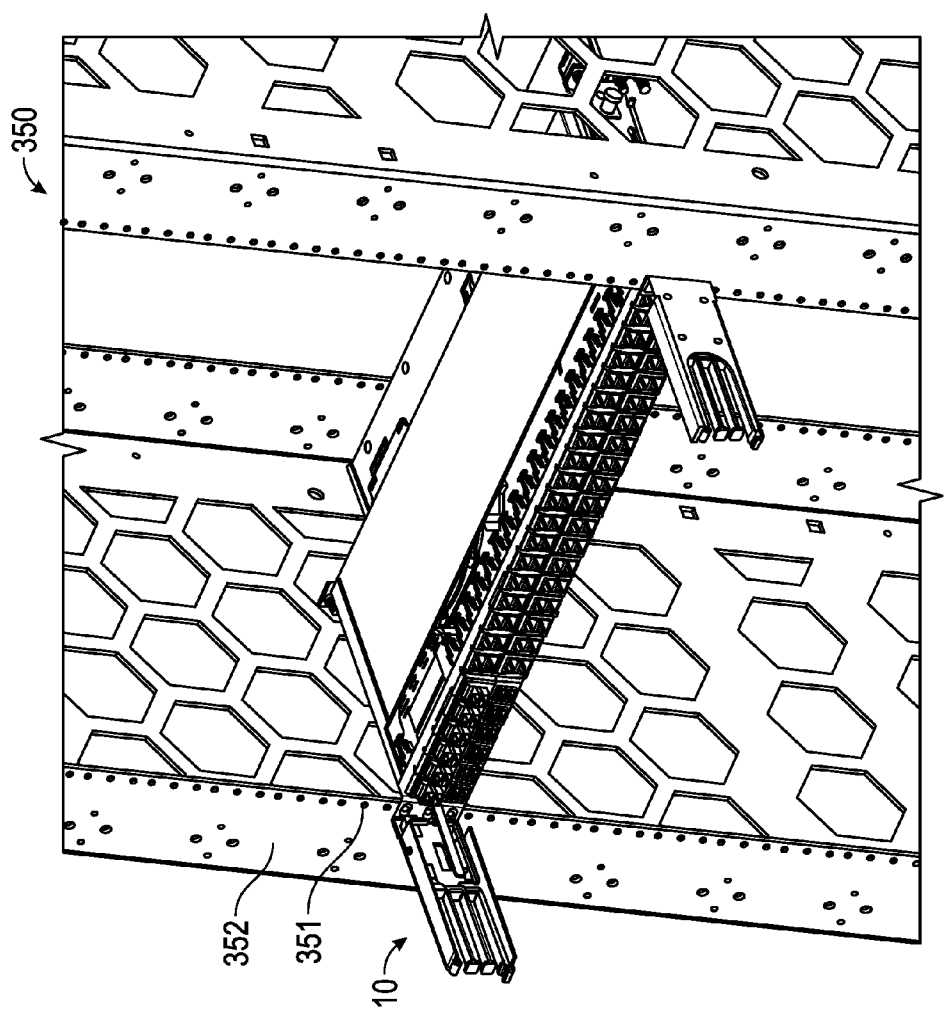
FIG. 48 is a front, perspective view of an exemplary media patching system mounted with respect to a supporting structure in a horizontal orientation.
Figure 49:
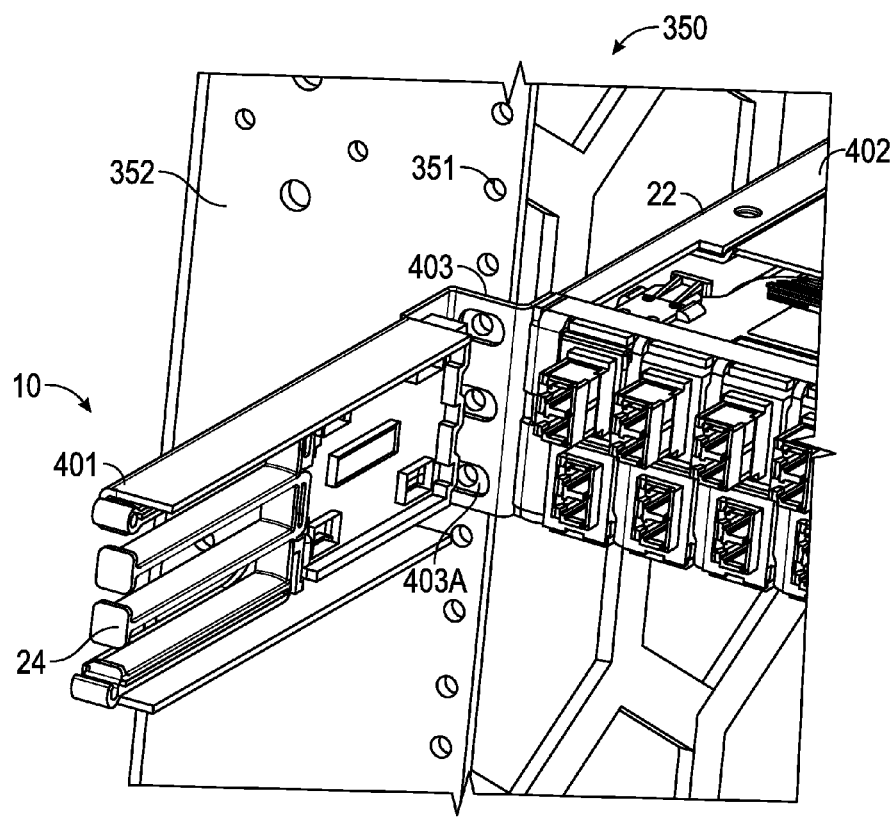
FIG. 49 is a front, detailed perspective view of an exemplary media patching system mounted with respect to a supporting structure in a horizontal orientation.

For clarity, FIGS. 48 and 49 show front and detailed perspective views of a single media patching system 10 secured to the rack 350 in a horizontal orientation. The rack 350 includes two front supporting surfaces 352, e.g., frame members, with a plurality of spaced apertures 351 formed therethrough along the height of the supporting surfaces 352. The media patching system 10 can be oriented horizontally and positioned against the supporting surfaces 352 such that the frame members 20, 22 abut the supporting surfaces 352. In particular, the first vertical run 403 of the frame members 20, 22 can be positioned against the supporting surfaces 352 and the apertures 403a of the frame members 20, 22 can be aligned with the apertures 351 of the rack 350. Fixation elements, e.g., bolts, can be used to secure the media patching system 10 to the rack 350 by passing the fixation elements through the apertures 403a, 351 and fastening the elements on the inner surface of the supporting surfaces 352. As illustrated in FIGS. 27 and 47, multiple media patching systems 10, 100 can be stacked and secured to the rack 350 in the horizontal orientation and variations of covers 33, 34, and/or the lower cable management plate 35 and upper cable management plates 26 can be used to customize the desired open space for management of cables at the front and rear of the systems 10, 100.

Figure 50:
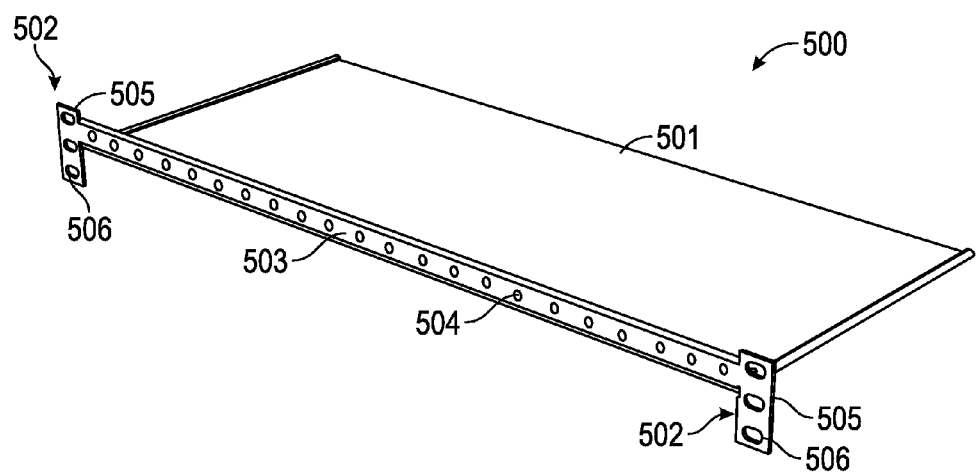
FIG. 50 is a front, perspective view of an exemplary support plate for mounting of media patching systems in a vertical orientation according to the present disclosure.
Figure 51:
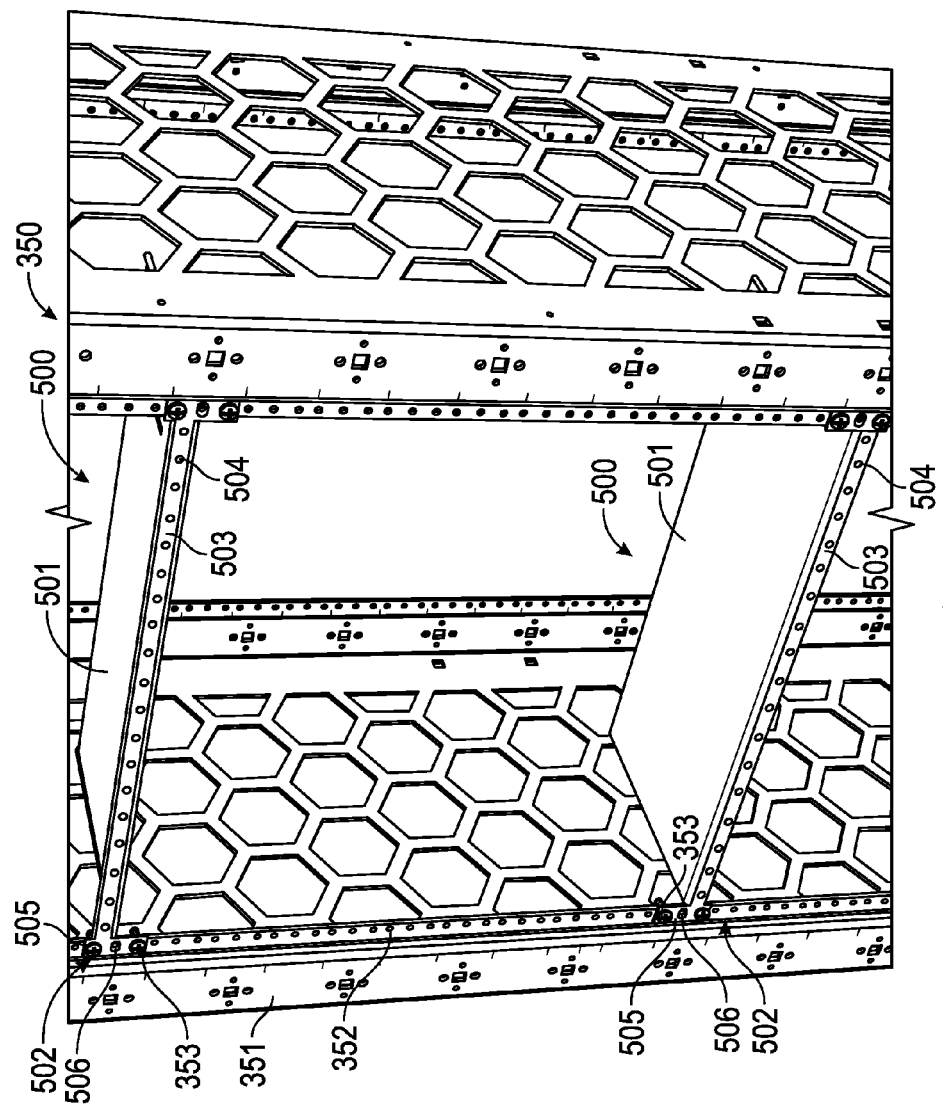
FIG. 51 is a front, perspective view of an exemplary supporting structure with support plates for mounting of media patching systems in a vertical orientation.

The media patching systems 10, 100 can be modular such that mounting relative to the rack 350 can be in a horizontal orientation and a vertical orientation to allow for different means of cable management. For example, FIGS. 50 and 51 are perspective views of a support plate 500 and two support plates 500 mounted to the rack 350. The support plate 500 includes a substantially rectangular and planar body 501 with an attachment section 502 extending from the front of the body 501. The attachment section 502 can extend in a perpendicular manner relative to the plane defined by the body 501.

The attachment section 502 includes an elongated bracket 503 extending along the entire front width of the support plate 500. The elongated bracket 503 includes a plurality of spaced apertures 504 formed therein along the length of the elongated bracket 503. The attachment section 502 further includes attachment brackets 505 extending from opposing sides of the elongated bracket 503. The attachment brackets 505 extend in a perpendicular manner relative to the plane defined by the body 501 and further extend along an axis perpendicular to the axis defined by the elongated bracket 503. The attachment brackets 505 include two or more apertures 506 formed therein.

Figure 73:
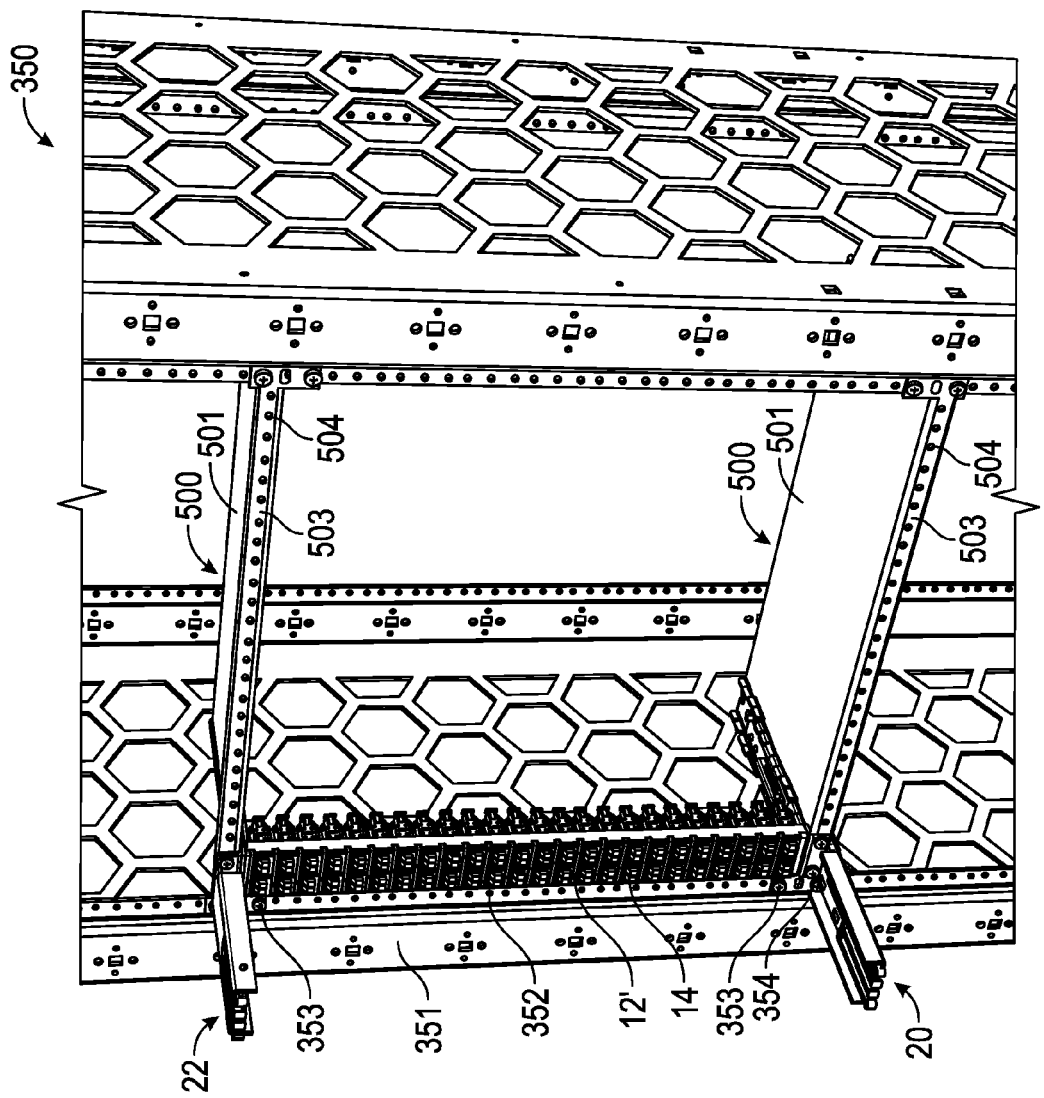
FIG. 73 is a front, perspective view of an exemplary supporting structure with support plates including frame members and a panel assembly mounted to the support plates in a vertical orientation.

As shown in FIG. 51, the support plates 500 can be attached to the supporting surfaces (e.g., back portions 351) of the rack 350 in a spaced relation, e.g., approximately 10 U apart, or the like. In particular, the apertures 506 of the attachment bracket 505 and the apertures or openings 352 of the back portions 351 can be aligned and fixation elements, such as bolts or screws 353, can be used to secure the support plate 500 to the rack 350 in a horizontal orientation. In some embodiments, as shown in FIG. 73, one or more components of the media patching systems 10, 100 (e.g., the frame members 20, 22, the panel assembly 12' including one or more connector assemblies 14, or the like) can be slid into the enclosure formed between the support plates 500 in a vertical orientation until the first vertical run 403 of the frame members 20, 22 abuts the elongated brackets 503 of the support plates 500. The apertures 403a of the first vertical run 403 can be aligned with the corresponding apertures 504 of the support plates 500 and fixation or fastener elements 354 can be used to secure the frame members 20, 22 to the support plates 500, thereby allowing mounting of the media patching systems 10, 100 in a vertical orientation relative to the rack 350 and the support plates 500. In particular, the first and second frame members 20, 22 can be used to mount components of the media patching systems 10, 100 to the support plates 500 in a vertical orientation relative to the rack 350 and a perpendicular orientation relative to the support plates 500.

In some embodiments, the support plates 500 can define top and bottom covers for the media patching systems 10, 100 positioned therebetween. In addition, covers 33, 34, and/or the lower cable management plate 35 and the upper cable management plates 26 can be used as desired to divide the open space at the rear of the media patching systems 10, 100. The space for cable management can thereby be customized based on the needs of the user. Individual door assemblies 36, e.g., defining a width of approximately 1 U, can be used to cover access to particular media patching systems 10, 100. In some embodiments, door assemblies 36 defining different widths, e.g., approximately 10 U, can be used to cover a group of media patching systems 10, 100 or the entire row of vertically oriented media patching systems 10, 100 between the support plates 500.

Figure 52:
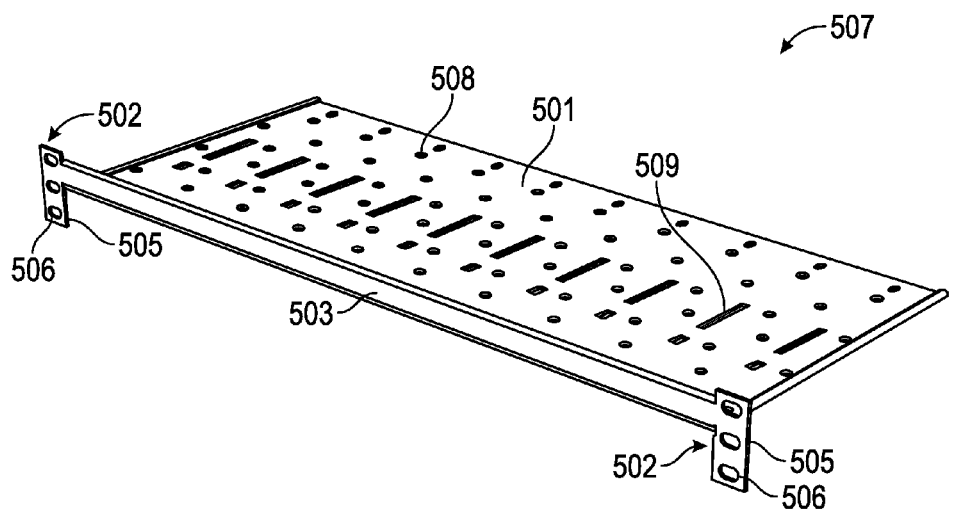
FIG. 52 is a front, perspective view of an exemplary support plate for mounting of media patching systems in a vertical orientation according to the present disclosure.
Figure 53:
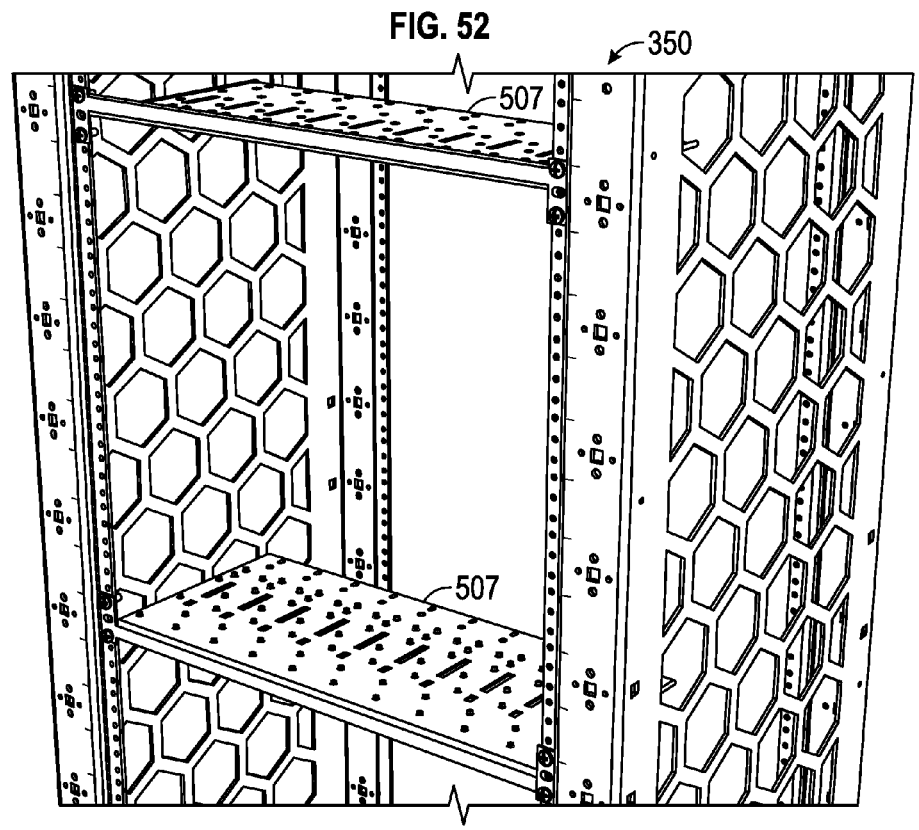
FIG. 53 is a front, perspective view of an exemplary supporting structure with support plates for mounting of media patching systems in a vertical orientation.

With reference to FIGS. 52 and 53, perspective views of an alternative embodiment of an exemplary support plate 507 is provided. In particular, the support plate 507 can be substantially similar in structure and function to the support plate 500 discussed above, except for the distinctions noted herein. As such, the same reference numbers refer to similar features.

In some embodiments, the support plate 507 can include apertures 506 substantially similar to those of the support plate 500 such that the media patching systems 10, 100 can be mounted to the support plate 507 in a vertical orientation. In the embodiment shown in FIGS. 52 and 53, the support plate 507 does not include the apertures 504 and instead includes additional features formed in the body 501 for attachment of alternative media patching systems. For example, multiple groups of features can be formed in the body 501, with each group of features corresponding to components associated with a media patching system.

For example, the support plate 507 can include a plurality of apertures 508 formed through the body 501 configured and dimensioned to receive fixation elements, e.g., bolts, pins, or the like. The support plate 507 further includes elongated slots 509, e.g., rectangular elongated slots, formed through the body 501 and extending parallel to a front-to-rear depth of the support plate 507. Similar to the support plate 500, two support plates 507 can be mounted to back portions 351 of the rack 350 to define top and bottom supports for mounting media patching systems therebetween in a vertical orientation.

Figures 54, 55:
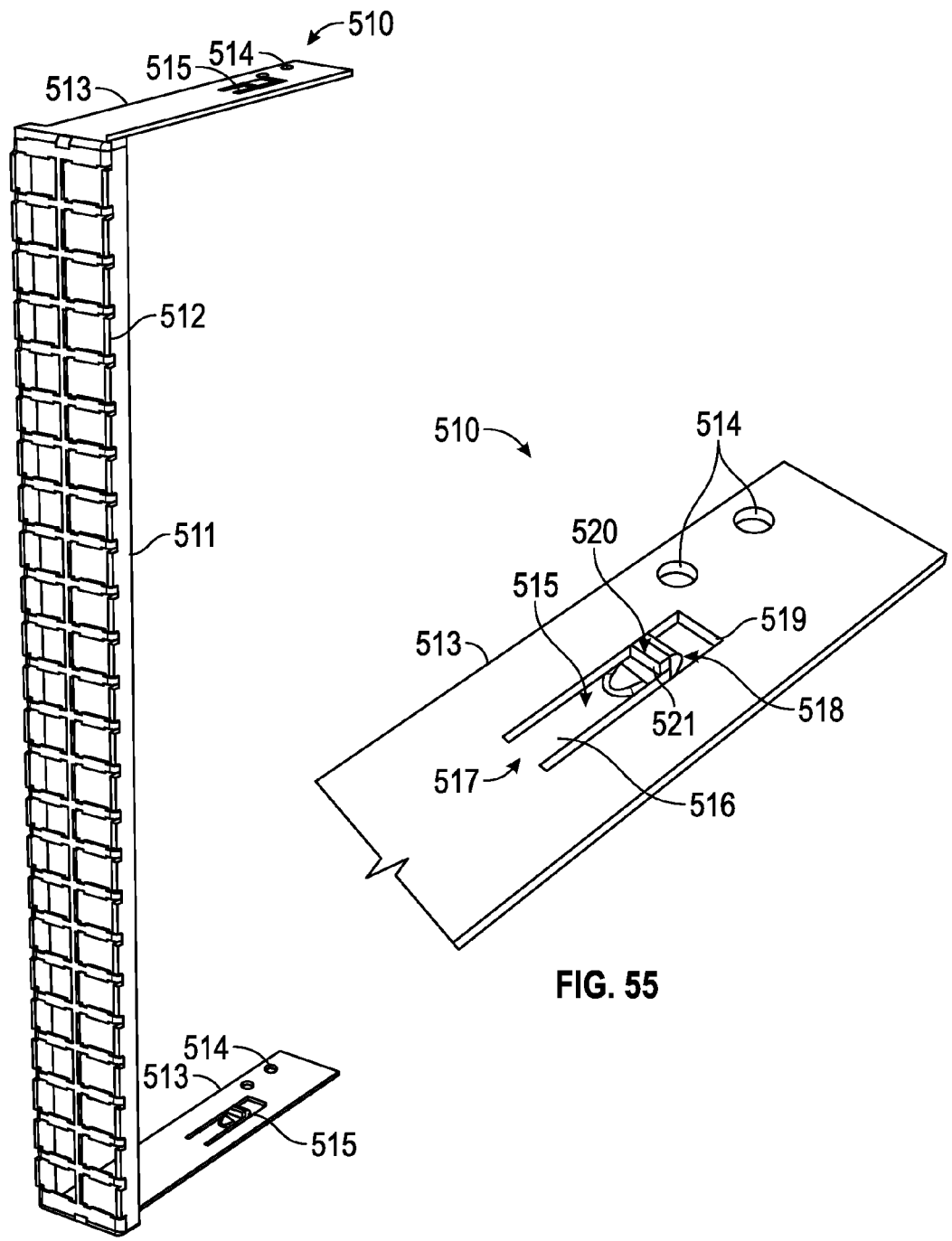
FIG. 54 is a front, perspective view of an exemplary multi-connector panel assembly according to the present disclosure.
FIG. 55 is a detailed, perspective view of an exemplary multi-connector panel assembly according to the present disclosure.

FIGS. 54 and 55 show perspective and detailed views of an exemplary multi-connector panel assembly 510. The panel assembly 510 includes an elongated body 511 defining a height of the panel assembly 510. The body 511 includes a plurality of apertures 512 formed therein. The apertures 512 can define a single column of apertures 512, or two or more columns of apertures 512. Each aperture 512 can be configured and dimensioned to have a connector assembly/connective device 14, 14A or 14B mounted with respect thereto (FIGS. 3-6, 13, 16, 21, 26). In some embodiments, the panel surface of the panel assembly 510 can be angled, or it can be substantially flat or planar. It should be understood that the panel assembly 510 can define a variety of shapes, forms and/or geometries.

The panel assembly 510 includes two flanges 513 extending from opposing ends of the body 511. The flanges 513 extend perpendicularly relative to the plane defined by the body 511 and extend in a rearward direction away from the apertures 512. Each of the flanges 513 includes a pair of apertures 514 formed near a distal end of the flanges 513. Each of the flanges 513 further includes a fastening mechanism 515. The fastening mechanism 515 includes an elongated extension 516 formed in the flange 513 such that a proximal end 517 of the extension 516 is connected to the material of the flange 513 and the distal end 518 of the extension 516 is surrounded by a channel 519, e.g., a cut-out surrounding the distal end 518 and the sides of the extension 516. The extension 516 thereby cantilevered relative to the flange 513.

The distal end 518 of the extension 516 includes a protrusion 520 extending therefrom in a direction perpendicular to the plane defined by the extension 516 and the flange 513. Thus, while the extension 516 is substantially aligned with the plane defined by the flange 513, the protrusion 520 extends beyond the plane defined by the flange 513. In some embodiments, the protrusion 520 extends beyond the plane defined by the flange 513 by a distance equivalent to the thickness of the extension 516. The distal end 518 of the protrusion 520 can define a rounded configuration. The opposing end of the protrusion 520 can define a step 521, e.g., a substantially perpendicular edge, relative to the extension 516. As can be seen from FIGS. 54 and 55, the protrusions 520 extend in opposing directions relative to each other.

Figure 57:
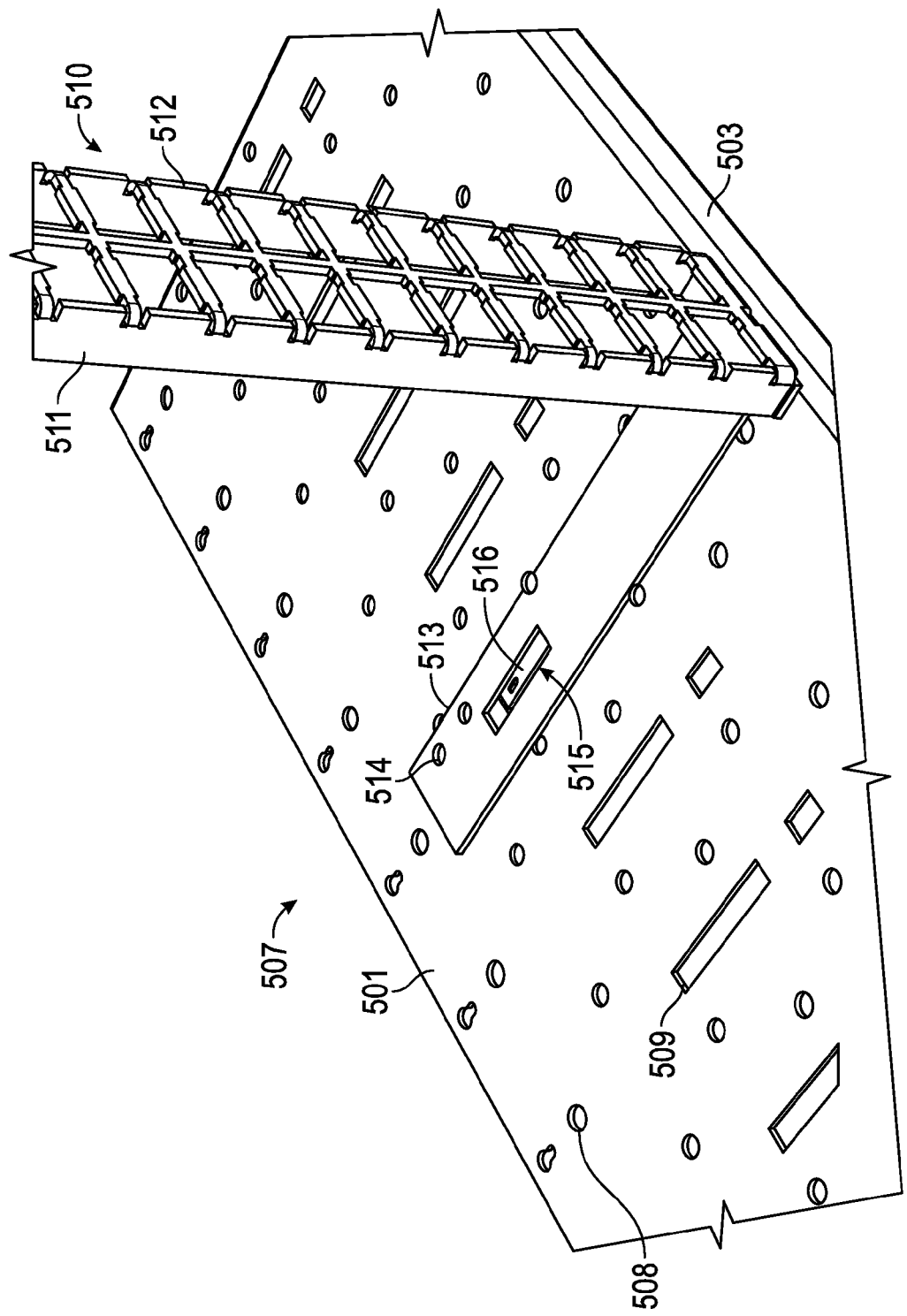
FIG. 57 is a detailed, perspective view of an exemplary multi-connector panel assembly mounted in a vertical orientation to a support plate.

FIGS. 56 and 57 show perspective views of the panel assembly 510 mounted in a vertical orientation to support plates 507 on a rack 350. For clarity, the rack 350 is not shown in FIG. 57. The support plates 507 are mounted to the rack 350 in a horizontal orientation and define a space between the support plates 507 for mounting the panel assembly 510. The flanges 513 of the panel assembly 510 can be aligned with corresponding slots 509 of the opposing support plates 507. Sliding the panel assembly 510 between the support plates 507 imparts a force on the protrusions 521 with the body 501, thereby flexing the extensions 516 at the proximal ends 517 towards each other. Upon reaching the elongated slots 509, the extensions 516 can snap back into the natural position, e.g., substantially aligned with the flanges 513, forcing the protrusions 520 to extend into the respective slots 509. The panel assembly 510 can thereby be mounted to the support plates 507 without the use of the Z-shaped frame members 20, 22. The step 521 of the protrusions 520 prevents the panel assembly 510 from being pulled out or disengaged relative to the support plates 507. However, it should be understood that application of pressure on the extensions 516 from opposing ends of the panel assembly 510 can flex the extensions 516 and disengage the protrusions 520 from the slots 509 to allow removal of the panel assembly 510. In some embodiments, the extensions 516 positioned within the respective slots 509 aligns the panel assembly 510 and the support plates 507 and permits the panel assembly 510 to slide relative to the support plates 507 within the slots 509.

Figures 58, 59:
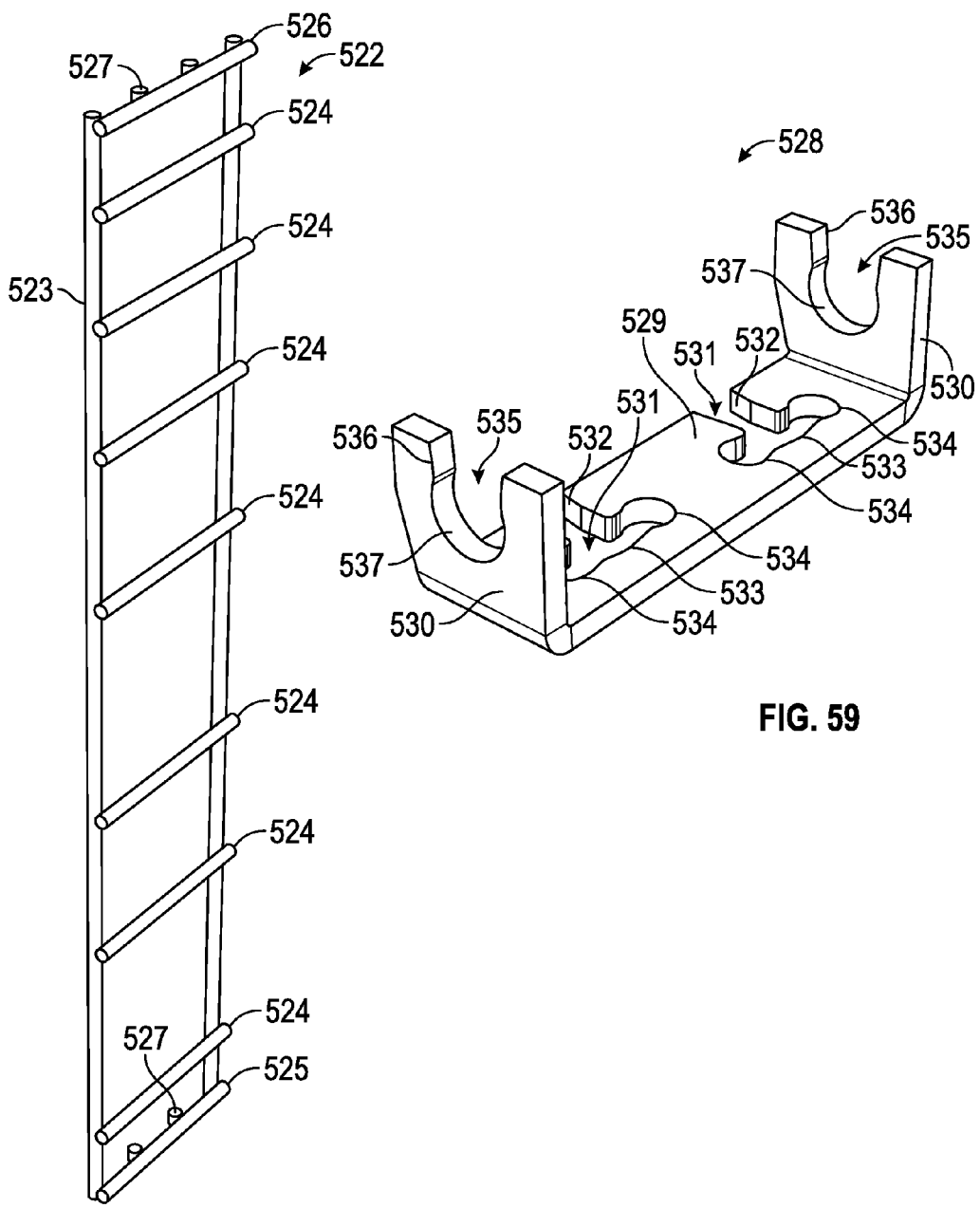
FIG. 58 is a perspective view of an exemplary support frame according to the present disclosure.
FIG. 59 is a perspective view of an exemplary support frame bracket according to the present disclosure.

FIG. 58 shows a perspective view of an exemplary support frame 522. Although the beams of the support frame 522 discussed herein define substantially cylindrical beams, it should be understood that alternative configurations can be used. The support frame 522 includes two vertical side beams 523 extending parallel to each other and positioned in a spaced relation. The support frame 522 further includes a plurality of central cross-beams 524, a bottom cross-beam 525, and a top cross-beam 526 connecting the vertical side beams 523. The central cross-beams 524 and the top and bottom cross-beams 525, 526 can be secured (e.g., fused) to the vertical side beams 523 and extend in a direction perpendicular to the vertical side beams 523. The central cross-beams 524 can be positioned in a spaced relation along the vertical side beams 523 and between the top and bottom cross-beams 525, 526. The top and bottom cross-beams 525, 526 can be positioned on opposing sides of the vertical side beams 523. The beams of the support frame 522 can define a substantially grid-like configuration.

In some embodiments, the support frame 522 can include two or more central vertical beams 527 positioned along the top and bottom cross-beams 525, 526. The central vertical beams 527 can extend in a direction parallel to the vertical side beams 523 and can be secured to the top and bottom cross-beams 525, 526. In some embodiments, the central vertical beams 527 can extend only along the top and bottom cross-beams 525, 526. In some embodiments, the central vertical beams 527 can extend the entire height between the top and bottom cross-beams 525, 526.

FIG. 59 shows a perspective view of an exemplary support frame bracket 528 that can be used to detachably secure the support frame 522 to the support plates 507. The bracket 528 includes a substantially planar central section 529 and two flanges 530 extending from opposing ends of the central section 529. The flanges 530 can extend perpendicularly relative to the central section 529. The central section 529 includes two T-shaped slots 531 formed therein and spaced relative to each other.

The slots 531 include a vertical slot 532 extending from the edge of the central section 529 to a point halfway between the edges of the central section 529. The slots 531 further include horizontal slot 533 extending into opposite directions from the vertical slot 532. The horizontal slot 533 includes enlarged circular openings 534 formed on opposing ends of the horizontal slot 533 defining diameter dimensioned greater than a width of the horizontal slot 533. The openings 534 can be configured and dimensioned to receive therein pins in a snap-fit manner for attachment of the bracket 528 to the support plate 507.

The flanges 530 include slots 535 formed therein and extending from a top edge of the flange 530 in the direction of the central section 529. The slots 535 include an entrance portion 536 and an enlarged circular opening 537, the circular opening 537 defining a diameter dimensioned greater than a width of the entrance portion 536. The slots 535 can be configured and dimensioned to receive therein the top or bottom cross-beams 525, 526 of the support frame 522.

Figure 60:
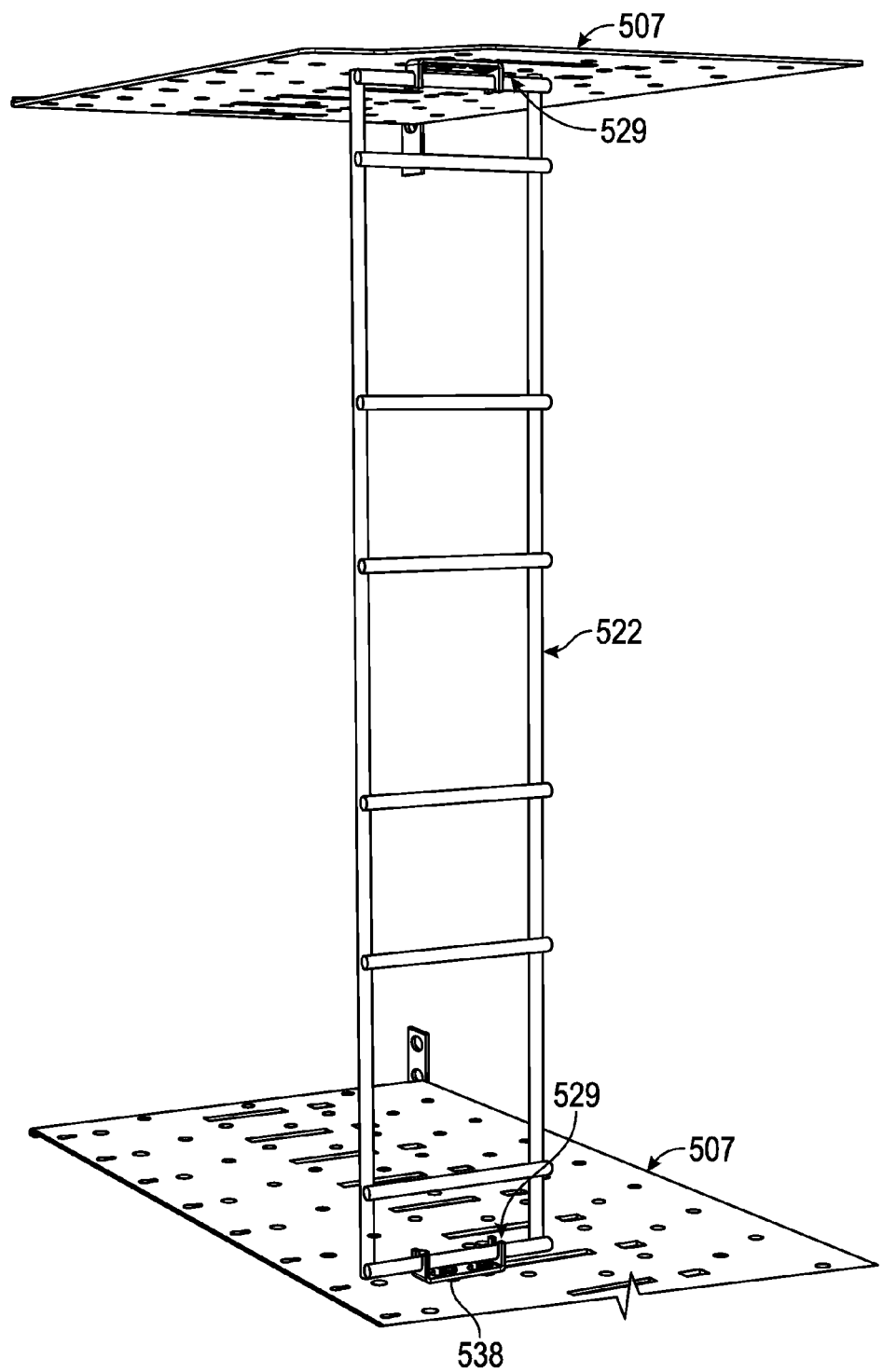
FIG. 60 is a perspective view of an exemplary support frame mounted in a vertical orientation to support plates.
Figure 61:
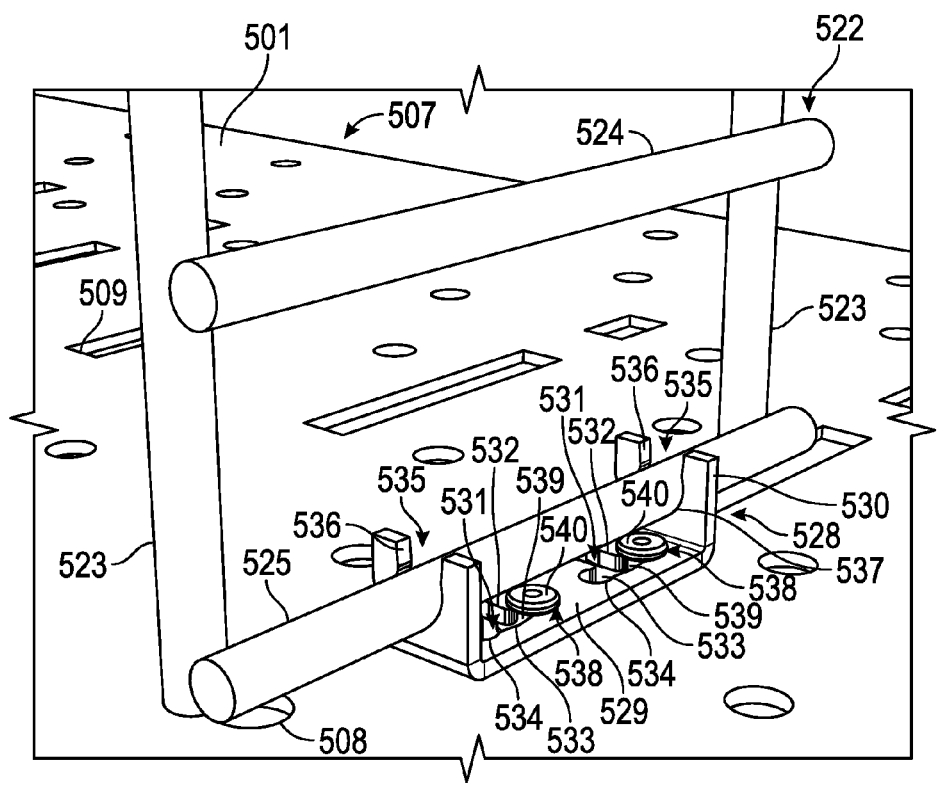
FIG. 61 is a detailed, perspective view of an exemplary support frame mounted in a vertical orientation to a support plate.

FIGS. 60 and 61 show perspective and detailed views of the support frame 522 detachably mounted to the support plates 507 with the support frame brackets 528. For clarity, the rack 350 is not shown in FIGS. 60 and 61. However, it should be understood that the support plates 507 can be mounted relative to the rack 350. During assembly, pins 538 mounted to the support plates 507 through the apertures 508 can be used to secure the brackets 528 to the support plates 507. In particular, a central cylindrical portion 539 of the pins 538 can be passed through the vertical slot 532 of the slots 531 while maintaining a cap 540 above the central section 529 of the bracket 528.

Upon reaching the horizontal slots 533, the bracket 528 can be slid such that the central cylindrical portion 539 of the pins 538 snaps into the openings 534. The configuration of the horizontal slots 533 and the openings 534 can maintain the central cylindrical portion 539 of the pins 538 in the openings 534 and the cap 540 prevents the bracket 528 from being lifted off of the support plate 507. The bracket 528 can thereby be maintained in the desired position on the support plate 507. As shown in FIGS. 60 and 61, the support frame 522 can be attached to the brackets 528 by snapping the top and bottom cross-beams 525, 526 into the opening 537 of the slots 535 to create a snap fit. Although illustrated without the panel assembly 510, it should be understood that the panel assembly 510 can be mounted to the support plates 507 before or after attachment of the support frame 522.

Figure 62:
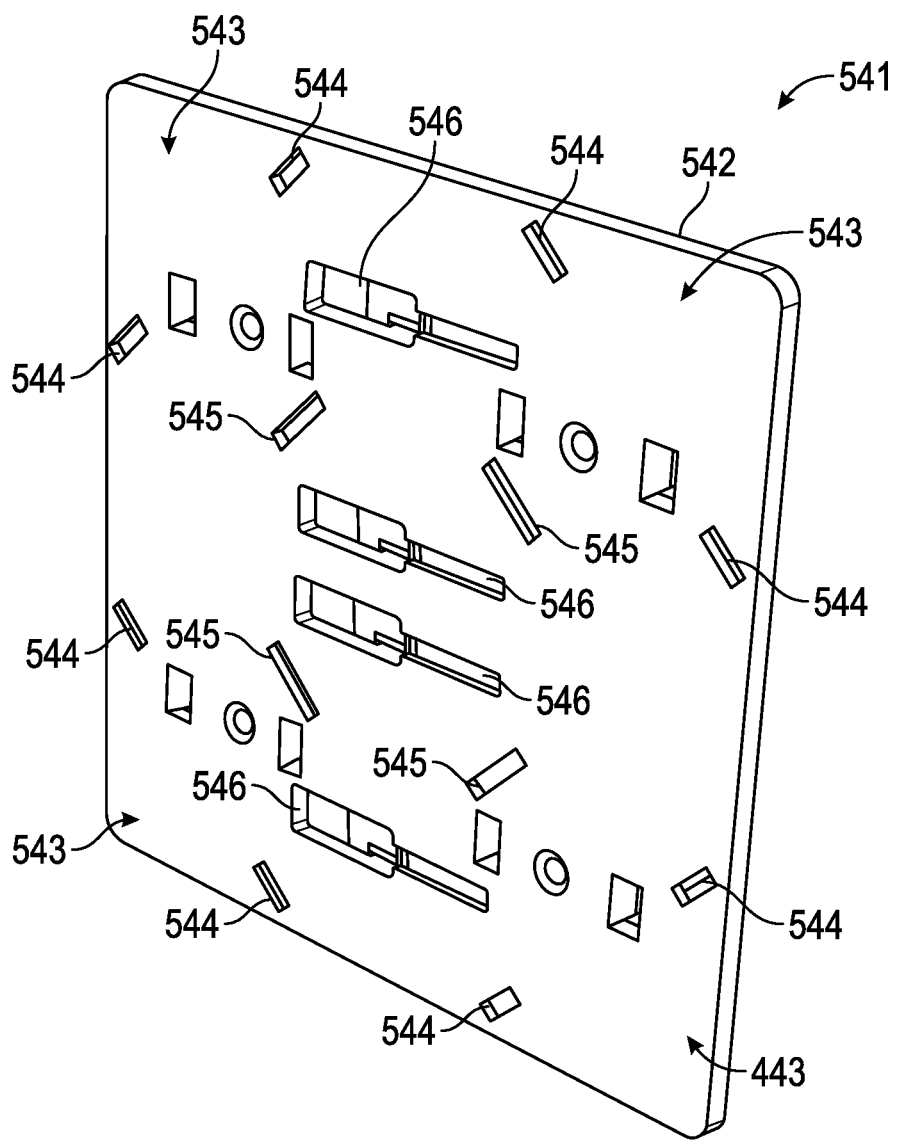
FIG. 62 is a front, perspective view of an exemplary cable management plate according to the present disclosure.
Figure 63:
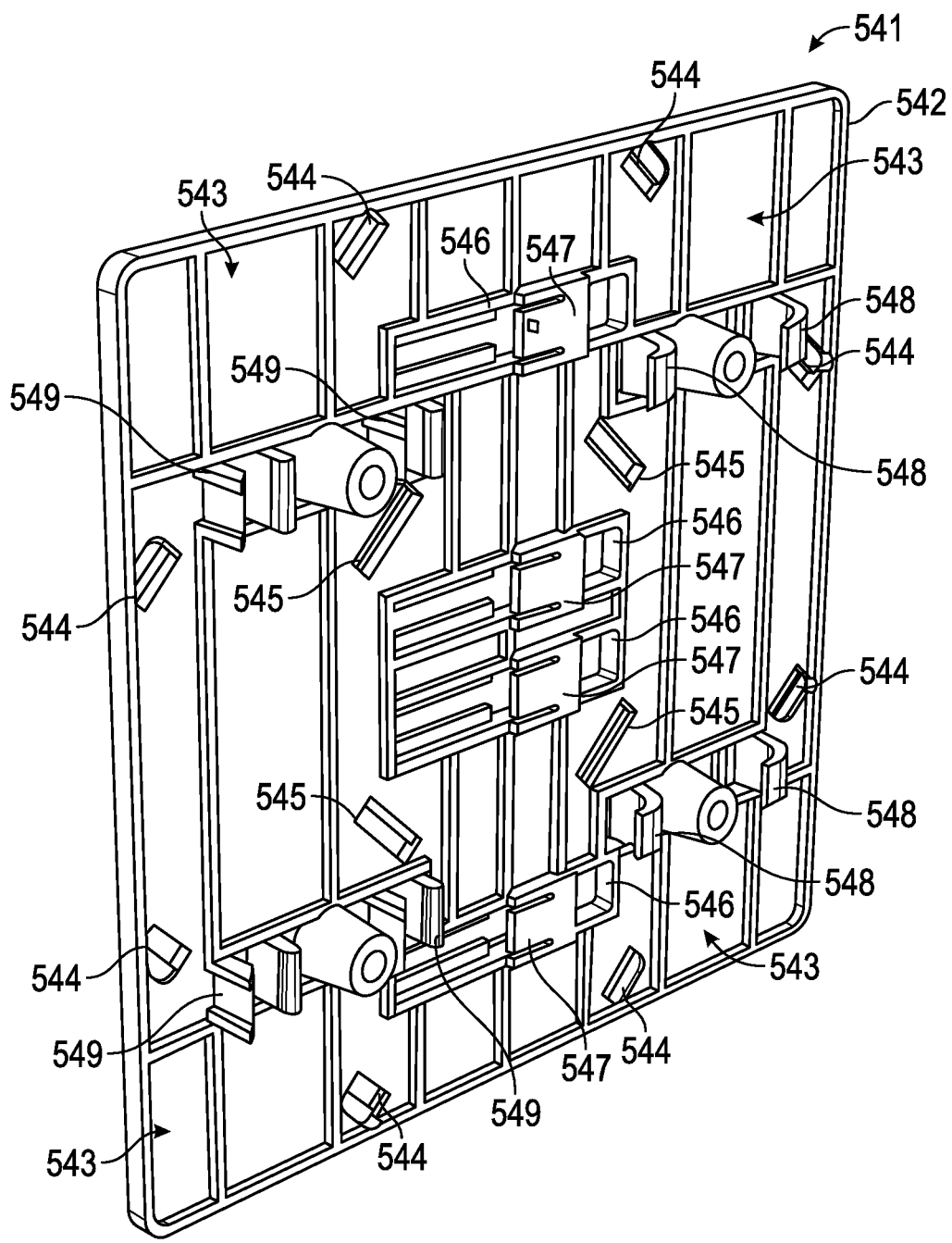
FIG. 63 is a rear, perspective view of an exemplary cable management plate according to the present disclosure.

FIGS. 62 and 63 show front and rear perspective views of an exemplary cable management plate 541. The cable management plate 541 includes a substantially planar and square-shaped body 542. However, it should be understood that the cable management plate 541 can define different configurations. In some embodiments, the body 542 includes one or more groups of slots 543 formed thereon. The groups of slots 543 can be substantially similar in structure and function to the groups of slots 418 described above with respect to the upper cable management plate 26 (see, e.g., FIG. 30). In particular, the groups of slots 543 include two slots 544 which are aligned and parallel to each other, and a slot 545 which is offset from and parallel to the slots 544. In some embodiments, four groups of slots 543 can be positioned circumferentially relative to a central portion of the cable management plate 541 (or relative to each other). The groups of slots 543 can be configured and dimensioned to detachably receive flanges 447, 448 and secure one or more spools 28 (or quarter spools 442) to the body 542 for cable management.

In some embodiments, the body 542 can include slots 546 formed therein. The slots 546 can define a groove in the front surface of the body 542 and include a tab 547 at the rear surface of the body 542. The tab 547 can be used to secure one or more cables of a media patching system. For example, some cables can be wrapped around the spools 28 to reduce the overall length of the cables, and an elongated portion of the cable can be secured in the tab 547 to prevent unraveling of the cable from the spool 28 or undesired motion.

The rear surface of the body 542 can include two pairs of hooks 548 and two pairs of fixation extensions 549. In particular, each of the two pairs of hooks 548 can be spaced relative to each other and can be aligned on one side of the body 542 with the second pair of hooks 548. Each of the hooks 548 includes an open end facing in the same direction as the other hooks 548. The hooks 548 can be configured and dimensioned to receive within the open end face one of the vertical side beams 523 of the support frame 522. Similarly, each of the fixation extensions 549 can be spaced relative to each other and can be aligned on the side of the body 542 opposing the pairs of hooks 548. The fixation extensions 549 include two spaced elements configured and dimensioned to receive therebetween the vertical side beams 523 of the support frame 522 in a snap fit manner.

The pair of hooks 548 can be aligned relative to each other along, e.g., a vertical axis, and the pair of fixation extensions 549 can be aligned relative to each other along, e.g., a parallel vertical axis. Further, one pair of hooks 548 can be aligned relative to one pair of fixation extensions 549 along, e.g., a horizontal axis perpendicular to the vertical axes, and the second pair of hooks 548 can be aligned relative to the second pair of fixation extensions 549 along, e.g., a parallel horizontal axis.

Figure 64:
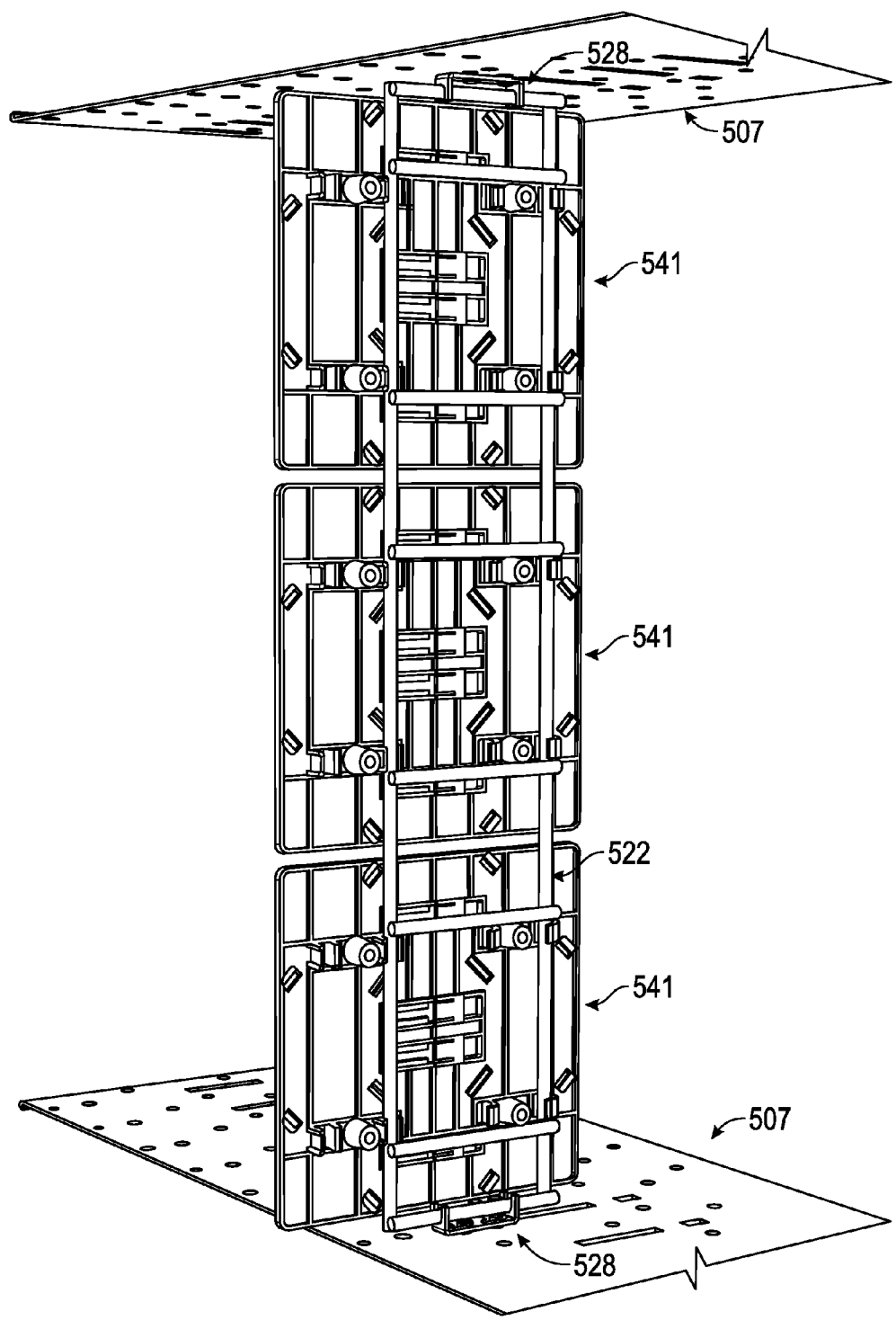
FIG. 64 is a rear, perspective view of exemplary cable management plates and a support frame mounted in a vertical orientation to support plates.
Figure 65:
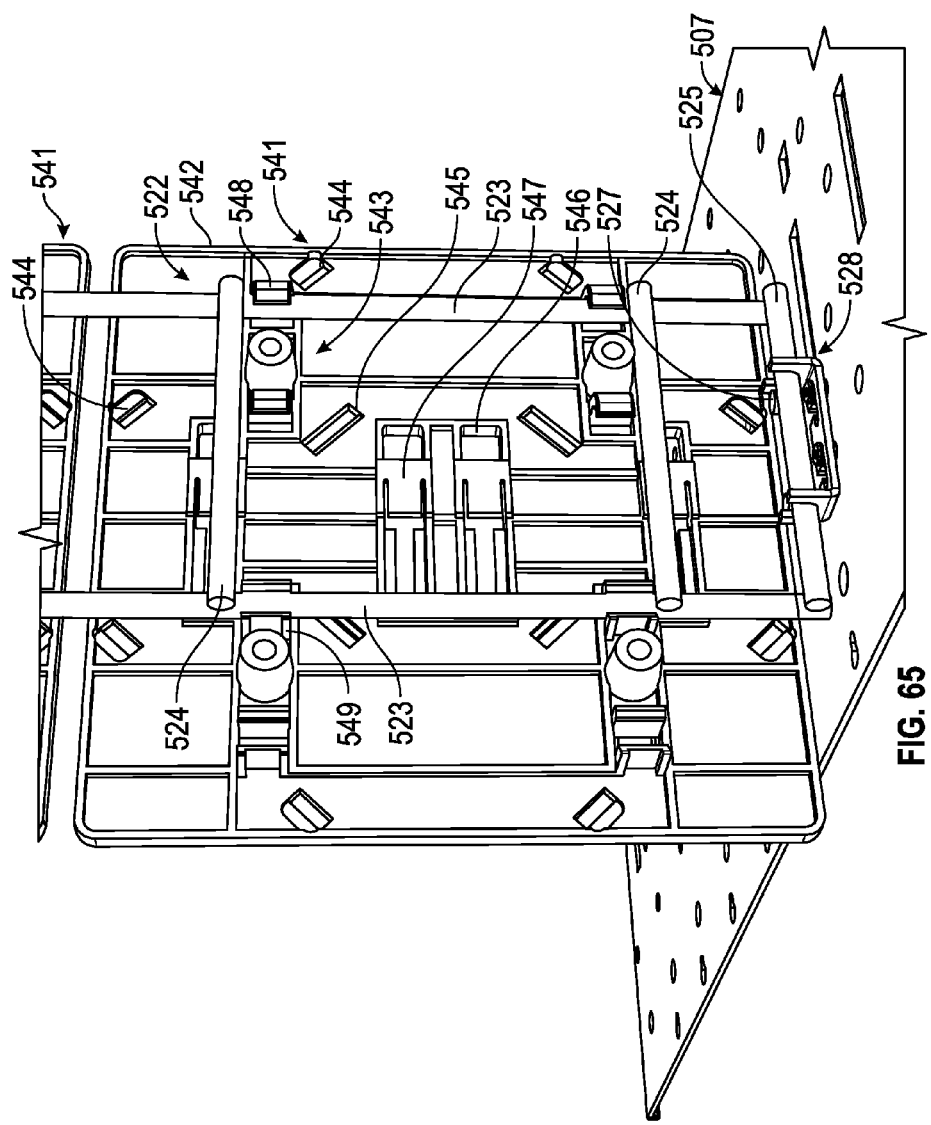
FIG. 65 is a rear, perspective detailed view of an exemplary cable management plate and support frame mounted in a vertical orientation to a support plate.

FIGS. 64 and 65 show perspective and detailed views of three cable management plates 541 mounted to the support frame 522. However, it should be understood that a single cable management plate 541 (or two cable management plates 541) could be mounted to the support frame 522. In some embodiments, the cable management plate 541 can be configured and dimensioned to extend a length substantially equivalent to the three cable management plates 541 shown in FIG. 64. A single, elongated cable management plate 541 can thereby be secured to the support frame 522 to extend the distance between the support plates 507.

For purposes of assembly, one of the vertical side beams 523 of the support frame 522 can be slipped into the opening of the aligned hooks 548 on the rear side of the cable management plate 541. The opposing vertical side beam 523 of the support frame 522 can be snapped into the aligned fastening extensions 549. The snap fit created by the fastening extensions 549 prevents undesired release of the vertical side beam 523, thereby maintaining the opposing vertical side beam 523 (and the cable management plate 541) secured to the support frame 522. It should be understood that the unused pair of hooks 548 and fastening extensions 549 can be used in a similar manner if the position of the cable management plate 541 is translated relative to the support frame 522. Thus, the position of the cable management plates 541 can be varied depending on the needs of the user.

Figure 66:
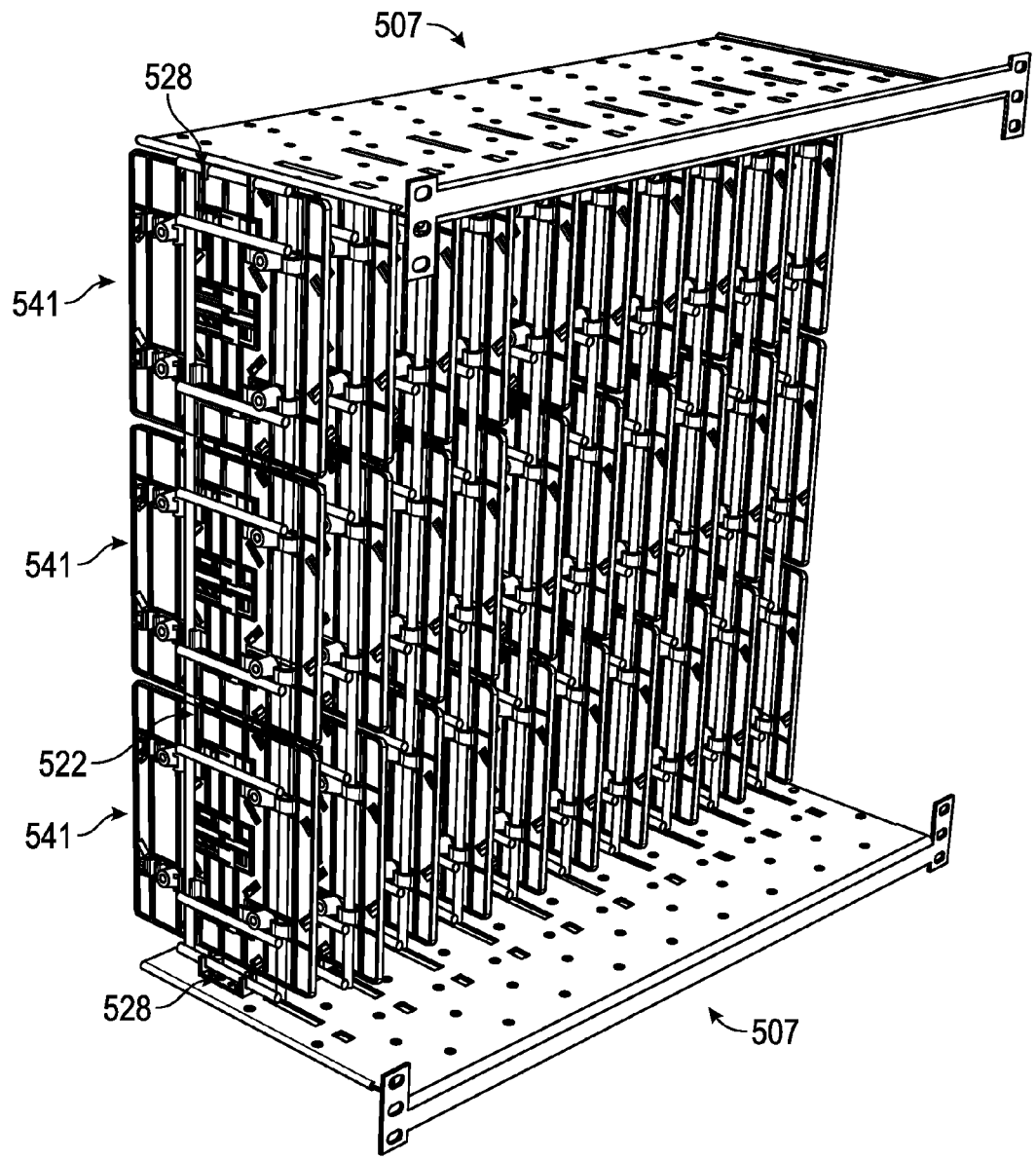
FIG. 66 is a front, perspective view of exemplary cable management plates and support frames mounted in a vertical orientation to support plates.

FIG. 66 shows a plurality of assemblies including the support frame 522, the support frame brackets 528, and the cable management plates 541 mounted to the support plates 507 in a vertical orientation. For clarity, the rack 350 is not shown in FIG. 66. Although illustrated as including ten assemblies, it should be understood that a variable number of assemblies (or components of the assemblies) can be used based on the needs of the user. For example, only five assemblies can be used if the user desired additional room in the enclosure for passage and management of cables. In addition, spools 28 can be used in a singular or stacked manner to assist in securing cables within the enclosure.

Figure 67:
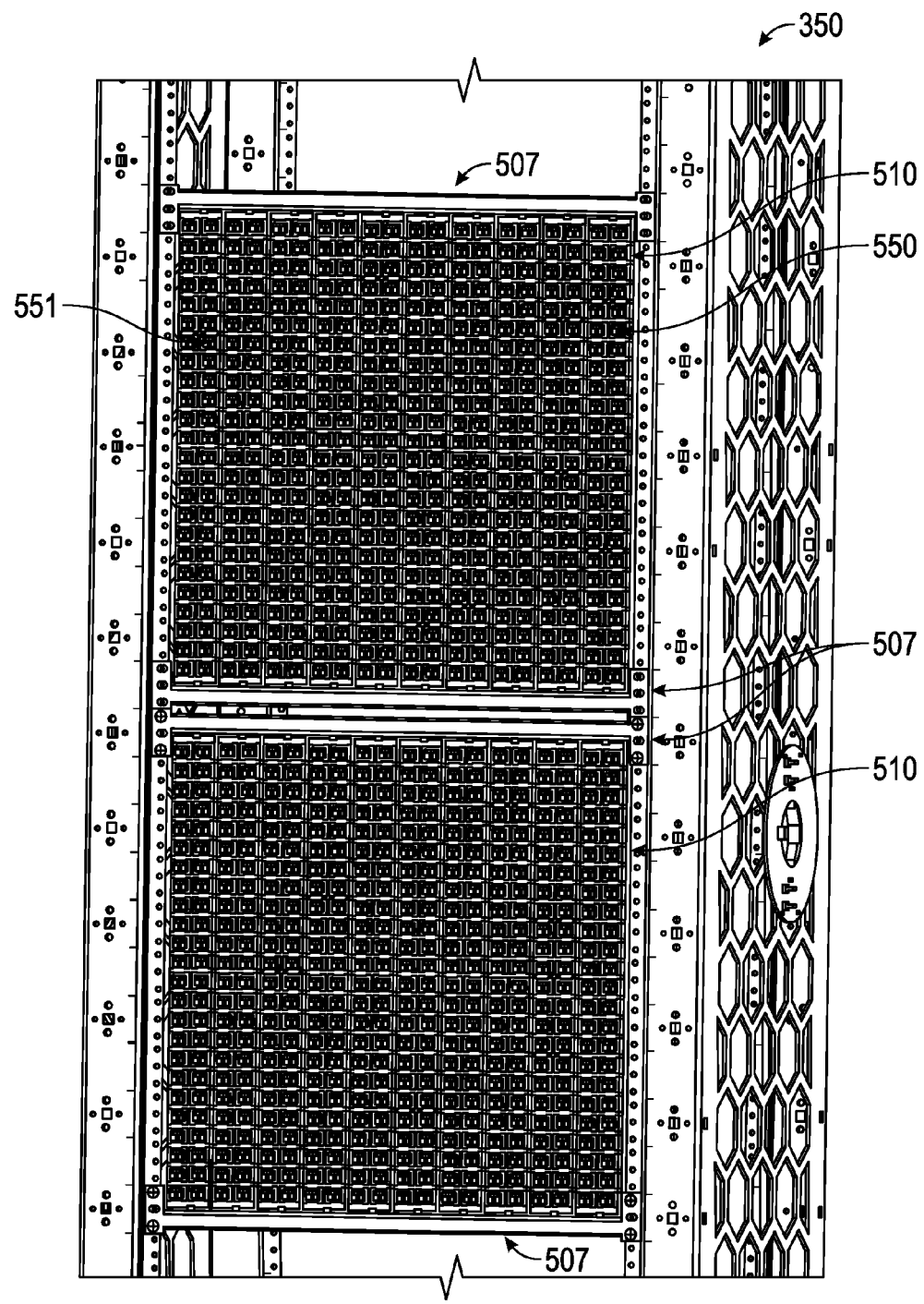
FIG. 67 is a front, perspective view of exemplary media patching systems mounted in a vertical orientation to a support structure.
Figure 68:
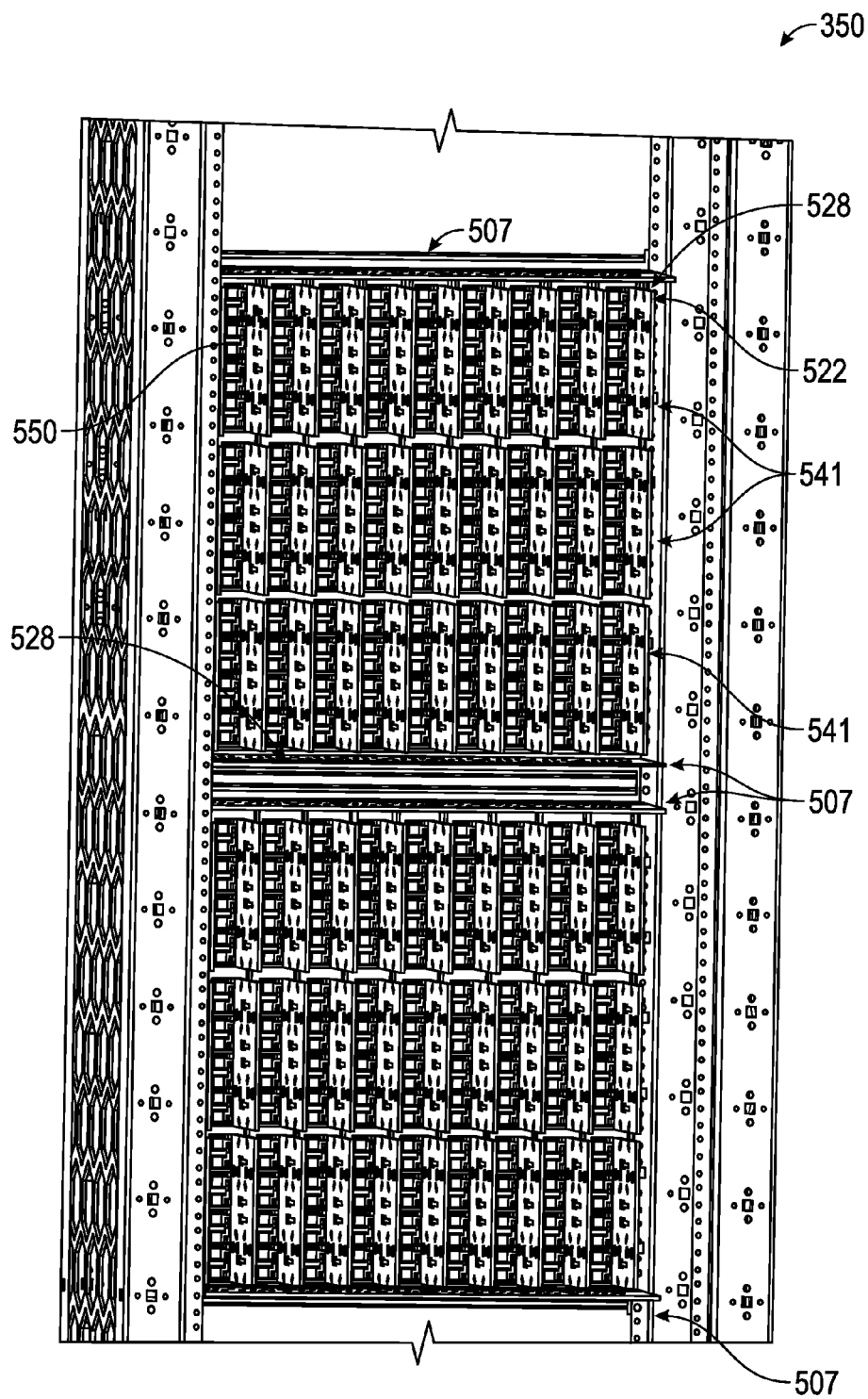
FIG. 68 is a rear, perspective view of exemplary media patching systems mounted in a vertical orientation to a support structure.

FIGS. 67 and 68 show front and rear perspective views of media patching systems 551 mounted in a vertical orientation to the rack 350. In particular, the media patching systems 551 include the panel assembly 510, the support frame 522, the support frame brackets 528, the cable management plates 541, and connector assemblies/connective devices 550. The media patching systems 551 are secured to the support plates 507 in a vertical orientation to create groups of media patching systems 551 along the width of the rack 350. As shown in FIGS. 67 and 68, multiple groups of media patching systems 551 can be mounted in a vertical orientation, e.g., two or more sets of vertically-mounted media patching systems 551, by adding additional support plates 507. However, it should be understood that one set of media patching systems 551 can be mounted to the rack 350 in a vertical orientation and additional media patching systems 10, 100 can be mounted to the rack 350 in a horizontal orientation, as discussed above. In some embodiments, the media patching systems 551 can be mounted to the rack 350 in a horizontal orientation by attaching frame members 20, 22 to the media patching systems 551 and securing the frame members 20, 22 to the rack 350. In some embodiments, the frame members 20, 22 can be dimensioned approximately 10 U high to accommodate stacks of media patching systems 551, or multiple 1 U high frame members 20, 22 can be used individually with each media patching system 551 in a stacked manner. Thus, modular mounting of the media patching systems 10, 100, 551 can be performed in a single rack 350, permitting customization of equipment and cable management.

The modularity of the media patching systems 10, 100 discussed herein further allows the media patching systems 10, 100 to be mounted to alternative support structures, e.g., walls, wall frames, or the like, in a vertical orientation to allow for different means of cable management. In particular, with the addition of two mounting brackets 552 shown in FIG. 69, the media patching systems 10, 100 can be configured to be mounted to support structures in a vertical configuration or orientation.

Figure 69:
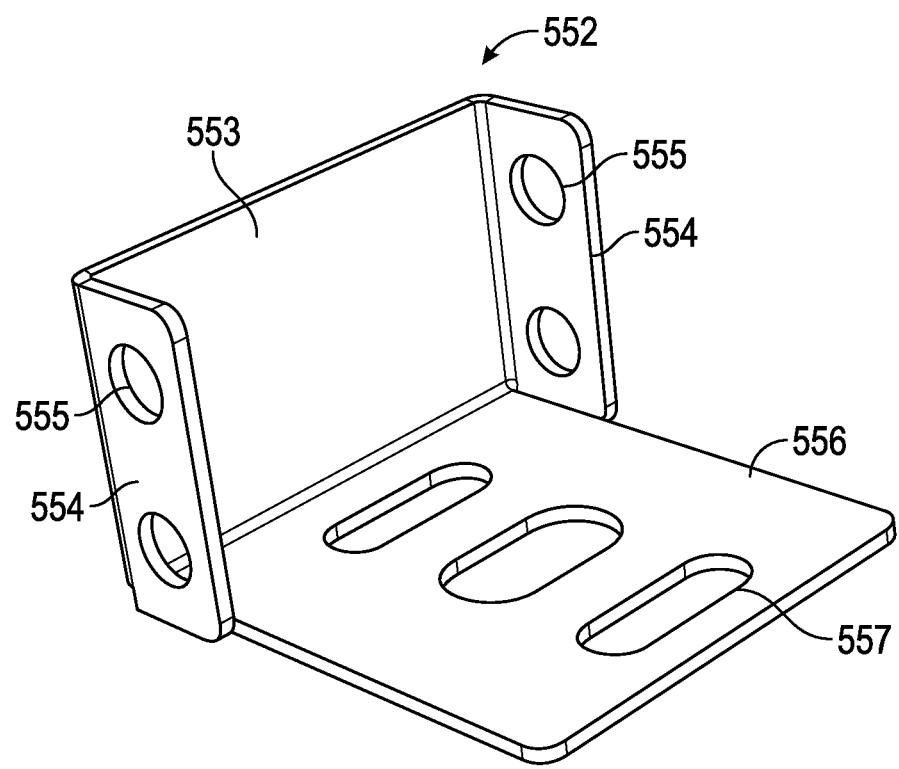
FIG. 69 is a perspective view of an exemplary mounting bracket according to the present disclosure.

With reference to FIG. 69, the mounting bracket 552 includes a rectangular-shaped base 553. The base 553 defines a substantially planar surface and does not include holes formed therethrough. The mounting bracket 552 includes two flanges 554 extending from the base 553 on opposing sides of the base 553. The flanges 554 can extend perpendicularly relative to the plane defined by the base 553. Each of the flanges 554 includes two spaced apertures 555 for mounting the bracket 552 to the frame members 20, 22 of the media patching systems 10, 100. The mounting bracket 552 further includes a flange 556 extending from a rear edge of the base 553. The flange 556 extends perpendicularly relative to the plane defined by the base 553 and extends between the flanges 554. Thus, the flanges 554, 556 extend in parallel direction from the base 553. The flange 556 includes one or more apertures 557 formed therein for mounting the bracket 552 to a support structure, e.g., a wall.

Figure 70:
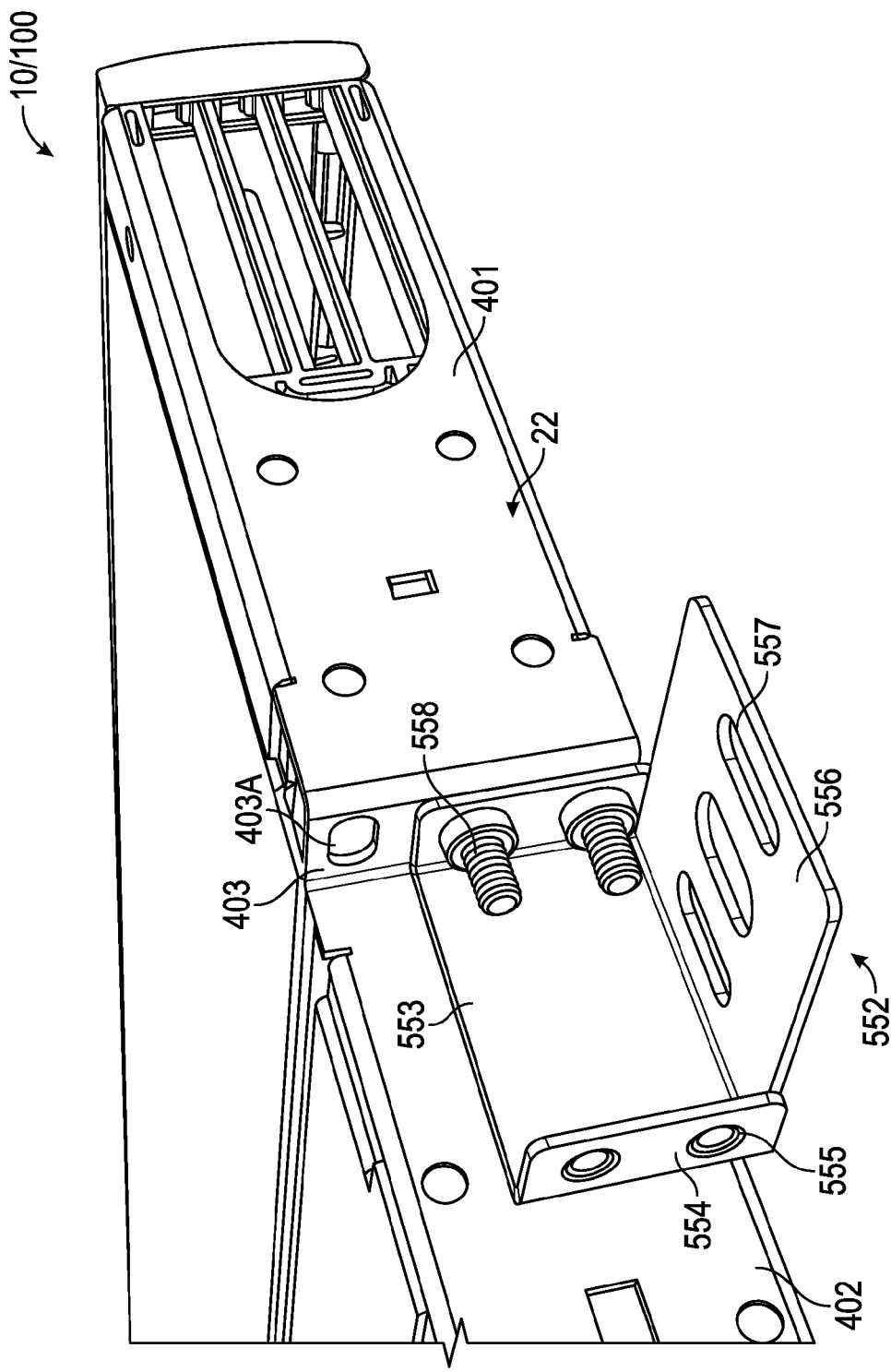
FIG. 70 is a perspective view of an exemplary mounting bracket secured to a frame member of a media patching system.

FIG. 70 shows a detailed, perspective view of the mounting bracket 552 secured to a frame member 22 of the media patching system 10, 100. It should be understood that a similar mounting bracket 552 can be secured to the frame member 20 on the opposing side of the media patching system 10, 100. The base 553 of the mounting bracket 552 can be positioned against the second horizontal run 402 of the frame member 22. The apertures 555 of the flange 554 can be aligned with the apertures 403a in the first vertical run 403 of the frame member 22. Fixation elements 558, e.g., bolts, or the like, can be used to secure the mounting bracket 552 to the frame member 22 such that the flange 556 extends outwardly from the side of the media patching system 10, 100.

Figure 71:
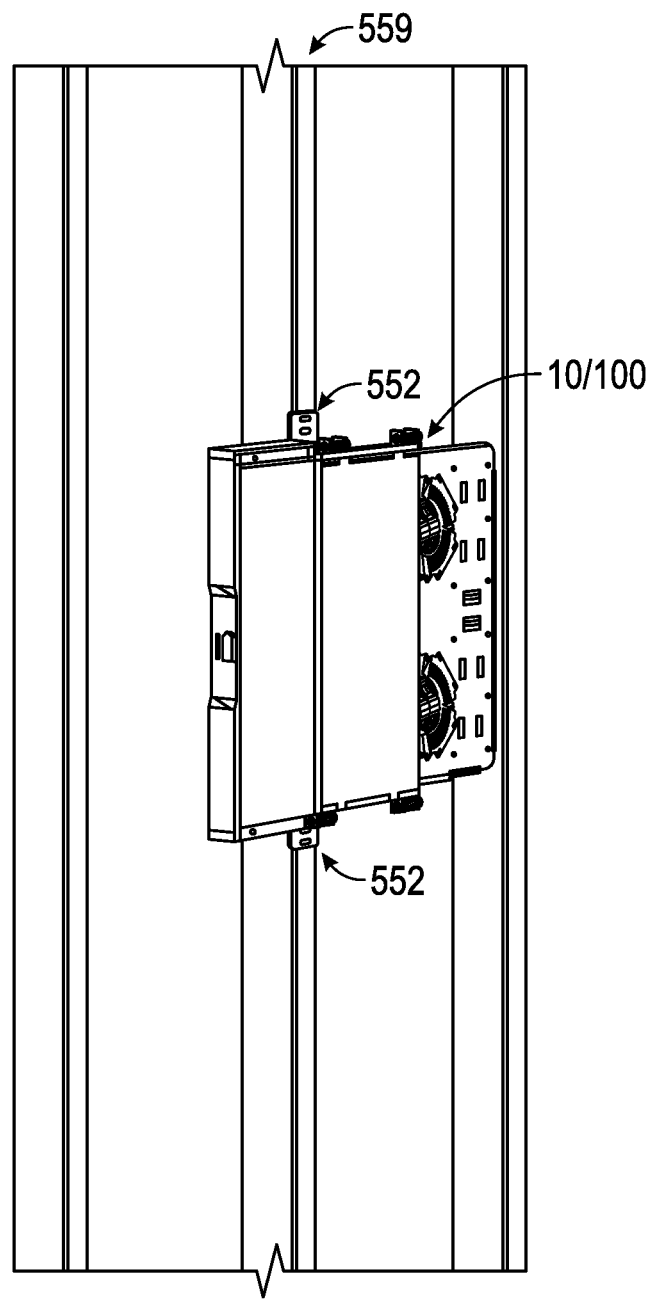
FIG. 71 is a perspective view of an exemplary media patching system mounted to a support structure.
Figure 72:
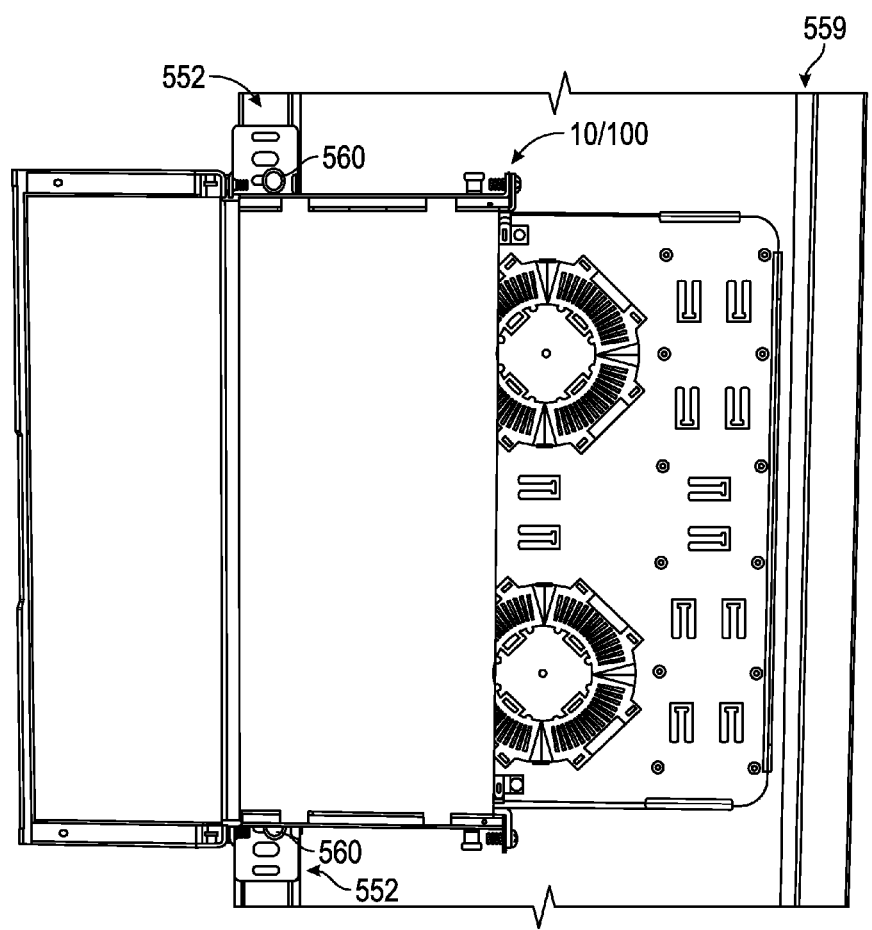
FIG. 72 is a side view of an exemplary media patching system mounted to a support structure.

FIGS. 71 and 72 show perspective and side views of the media patching system 10, 100 mounted to a support structure, e.g., a wall 559. For clarity, the wall 559 is shown as including wooden or metal studs. However, it should be understood that the media patching system 10, 100 can be mounted to the wall 559 over, e.g., drywall, plaster, or the like. The media patching system 10, 100 can be positioned in a vertical orientation and the mounting brackets 552 can be aligned with the wall studs. Fastening elements 560, e.g., screws, or the like, can be passed through the aperture 557 of the flange 556 of the mounting brackets 552 to secure the media patching system 10, 100 to the wall 559. The media patching system 10, 100 thereby remains in the vertical orientation and allows for cable management at a wall 559 setting. It should be understood that in some embodiments, the media patching system 10, 100 can be mounted to the rack 350 in a horizontal orientation by removing the mounting bracket 552 from the media patching system 10, 100 and securing the frame members 20, 22 to the rack 350.

The exemplary cable management systems, e.g., media patching systems, discussed herein advantageously provide modularity for mounting in horizontal, vertical, and wall positions. The modularity in mounting allows users to customize support structures, such as racks, walls, or both, based on the needs of the user. Management and access of cables can thereby be simplified to accommodate the needs of the user.

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

The invention claimed is:

1. A cable management system for a rack, the rack including vertical frame members, the cable management system comprising:
    a first support plate and a second support plate, the first and second support plates being mountable in a perpendicular orientation relative to vertical frame members of the rack, and
    a media patching assembly including an elongated body, the media patching assembly being mountable to the first and second support plates such that the elongated body of the media patching assembly extends between the first and second support plates in a parallel orientation relative to the vertical frame members of the rack;
    wherein the media patching assembly includes a multi-connector panel assembly including first and second flanges, each of the first and second flanges including a fastening mechanism formed thereon;
    wherein the fastening mechanism comprises a cantilevered extension including a protrusion at a distal end; and
    wherein each of the first and second support plates comprises a slot configured and dimensioned to at least partially receive the protrusion of the respective cantilevered extension to detachably secure the multi-connector panel assembly to the first and second support plates in the parallel orientation relative to the vertical frame members of the rack.

2. The cable management system according to claim 1, further comprising a support frame mounted to the first and second support plates, the support frame including two vertical side beams and a plurality of cross-beams.

3. The cable management system according to claim 2, further comprising two support frame brackets configured to secure the support frame to respective first and second support plates.

4. The cable management system according to claim 3, wherein each of the two support frame brackets is configured to receive via a snap fit opposing cross-beams of the support frame to detachably secure the support frame to the first and second support plates in the parallel orientation relative to the vertical frame members of the rack.

5. The cable management system according to claim 3, wherein each of the two support frame brackets includes a central body section with two T-shaped slots formed therein.

6. The cable management system according to claim 5, wherein each of the two support frame brackets is secured to one of the first and second support plates via a snap fit connection between protrusions in the first and second support plates and a portion of each T-shaped slot.

7. The cable management system according to claim 1, further comprising a cable management plate defining a front side and a rear side, wherein the front side of the cable management plate comprises a plurality of slots formed therethrough configured and dimensioned to receive flanges of a spool therein for detachably securing the spool to the cable management plate.

8. The cable management system according to claim 1, further comprising a cable management plate defining a front side and a rear side, wherein the rear side of the cable management plate comprises a pair of hooks and a pair of fixation extensions, the pair of hooks and the pair of fixation extensions being configured to receive and secure respective vertical side beams of a support frame to secure the cable management plate to the support frame.

9. The cable management system according to claim 1, further comprising at least one additional media patching assembly mountable in the parallel orientation relative to the vertical frame members of the rack, wherein the media patching assembly and the at least one additional media patching assembly are configured and dimensioned to be mountable in the parallel orientation relative to the vertical frame members of the rack at the same time.

10. A cable management system for a rack, the rack including vertical frame members, the cable management system comprising:
    a first support plate and a second support plate, the first and second support plates being mountable in a perpendicular orientation relative to vertical frame members of the rack,
    a media patching assembly including an elongated body, the media patching assembly being mountable to the first and second support plates such that the elongated body of the media patching assembly extends between the first and second support plates in a parallel orientation relative to the vertical frame members of the rack, and
    a cable management plate defining a front side and a rear side, wherein the rear side of the cable management plate comprises a pair of hooks and a pair of fixation extensions, the pair of hooks and the pair of fixation extensions being configured to receive and secure respective vertical side beams of a support frame to secure the cable management plate to the support frame.

\* \* \* \* \*